US011011555B2

(12) United States Patent
Pan

(10) Patent No.: US 11,011,555 B2
(45) Date of Patent: May 18, 2021

(54) FABRICATING INTEGRATED LIGHT-EMITTING PIXEL ARRAYS FOR DISPLAYS

(71) Applicant: Shaoher Pan, Palo Alto, CA (US)

(72) Inventor: Shaoher Pan, Palo Alto, CA (US)

(*) Notice: Subject to any disclaimer, the term of this patent is extended or adjusted under 35 U.S.C. 154(b) by 0 days.

(21) Appl. No.: 15/842,772

(22) Filed: Dec. 14, 2017

(65) Prior Publication Data

US 2018/0114800 A1    Apr. 26, 2018

Related U.S. Application Data

(63) Continuation-in-part of application No. 15/291,330, filed on Oct. 12, 2016, now Pat. No. 10,467,952.

(51) Int. Cl.
*H01L 27/12* (2006.01)
*H01L 27/06* (2006.01)
(Continued)

(52) U.S. Cl.
CPC ...... *H01L 27/1259* (2013.01); *H01L 25/0753* (2013.01); *H01L 25/167* (2013.01);
(Continued)

(58) Field of Classification Search
CPC ............. H01L 27/1259; H01L 33/0075; H01L 27/156; H01L 33/502; H01L 27/0694; H01L 27/124; G09G 3/3225
See application file for complete search history.

(56) References Cited

U.S. PATENT DOCUMENTS 5,827,753 A   10/1998   Huang et al.
6,844,903 B2   1/2005   Mueller-Mach et al.
(Continued)

FOREIGN PATENT DOCUMENTS

CN    102751296    10/2012
JP    2002-141492    5/2002
(Continued)

OTHER PUBLICATIONS

Horng et al., "Performance of GaN-based Light-emitting Diodes Fabricated Using GaN Epilayers Grown on Silicon Substrates," Optics Express, 22(1):179-187.
(Continued)

*Primary Examiner* — Vinh T Lam
(74) *Attorney, Agent, or Firm* — Fish & Richardson P.C.

(57) ABSTRACT

Methods of fabricating integrated active-matrix light emitting pixel array based displays are provided. The methods include: forming an array of light emitting elements on a first side of a substrate, forming an array of active-matrix light emitting pixels using the array of light emitting elements, each pixel including at least one light emitting element and at least one non-volatile memory coupled to the at least one light-emitting element, forming conductive interconnects penetrating through the substrate from a second side of the substrate to the first side, and forming one or more integrated circuits on the second side, the one or more integrated circuits being conductively coupled to the array of active-matrix light-emitting pixels through the conductive interconnects. The methods can further include forming an array of active-matrix multi-color display pixels by using the array of active-matrix light emitting pixels.

42 Claims, 60 Drawing Sheets

(51) Int. Cl.
*H01L 27/15* (2006.01)
*H01L 33/00* (2010.01)
*H01L 33/50* (2010.01)
*H01L 25/075* (2006.01)
*H01L 25/16* (2006.01)
*G09G 3/3225* (2016.01)
*G09G 3/3275* (2016.01)
*G09G 3/3266* (2016.01)
*H01L 33/62* (2010.01)
*H01L 21/8258* (2006.01)

(52) U.S. Cl.
CPC ........ *H01L 27/0694* (2013.01); *H01L 27/124* (2013.01); *H01L 27/1218* (2013.01); *H01L 27/156* (2013.01); *H01L 33/0075* (2013.01); *H01L 33/502* (2013.01); *G06F 2203/04103* (2013.01); *G09G 3/3225* (2013.01); *G09G 3/3266* (2013.01); *G09G 3/3275* (2013.01); *G09G 2300/0408* (2013.01); *H01L 21/8258* (2013.01); *H01L 33/504* (2013.01); *H01L 33/62* (2013.01)

(56) References Cited

U.S. PATENT DOCUMENTS

| | | | |
|---|---|---|---|
| 7,248,310 | B2 | 7/2007 | Mueller-Mach et al. |
| 7,956,370 | B2 | 6/2011 | Pan |
| 8,642,363 | B2 | 2/2014 | Lau et al. |
| 8,674,383 | B2 | 3/2014 | Pan |
| 9,423,535 | B1 | 8/2016 | Hu et al. |
| 2003/0025118 | A1 | 2/2003 | Yamazaki et al. |
| 2003/0082889 | A1 | 5/2003 | Maruyama et al. |
| 2004/0238827 | A1 | 12/2004 | Takayama et al. |
| 2008/0116468 | A1 | 5/2008 | Radkov et al. |
| 2009/0032799 | A1 | 2/2009 | Pan |
| 2010/0308300 | A1 | 12/2010 | Pan |
| 2011/0177636 | A1* | 7/2011 | Pan .................. H01L 33/24 438/28 |
| 2011/0193056 | A1 | 8/2011 | Wang |
| 2012/0169682 | A1 | 7/2012 | Kuhlman et al. |
| 2012/0241809 | A1 | 9/2012 | Pan et al. |
| 2013/0228802 | A1* | 9/2013 | Wang .................. H01L 25/0753 257/88 |
| 2014/0063393 | A1 | 3/2014 | Zhong et al. |
| 2014/0152619 | A1 | 6/2014 | Hotelling et al. |
| 2014/0225838 | A1* | 8/2014 | Gupta .................. G06F 3/04184 345/173 |
| 2015/0024524 | A1* | 1/2015 | Yao .................. H01L 33/0075 438/26 |
| 2015/0091849 | A1 | 4/2015 | Ludden |
| 2015/0171266 | A1* | 6/2015 | Li .................. H01L 33/20 438/47 |
| 2016/0005939 | A1* | 1/2016 | Andrews .................. H01L 33/62 257/91 |
| 2016/0111603 | A1* | 4/2016 | Hu .................. H01L 33/42 257/76 |
| 2016/0163765 | A1 | 6/2016 | Hu et al. |
| 2016/0254418 | A1* | 9/2016 | Mueller .................. H01L 33/505 438/27 |
| 2016/0259368 | A1* | 9/2016 | Bibl .................. H01L 23/3171 |
| 2016/0276559 | A1* | 9/2016 | Chuang .................. H01L 33/385 |
| 2016/0284652 | A1* | 9/2016 | Kanaoka .......... H01L 21/76202 |
| 2016/0299395 | A1 | 10/2016 | Kosuge et al. |
| 2016/0313848 | A1 | 10/2016 | Rhee |
| 2017/0069611 | A1 | 3/2017 | Zhang et al. |
| 2017/0123529 | A1 | 5/2017 | Ho |
| 2017/0185193 | A1 | 6/2017 | Kim |
| 2017/0352791 | A1* | 12/2017 | Kang .................. G02B 19/0028 |
| 2018/0102085 | A1 | 4/2018 | Pan |
| 2019/0027075 | A1* | 1/2019 | Hughes .................. H01L 27/156 |
| 2019/0214529 | A1* | 7/2019 | Ahmed .................. H01L 33/24 |

FOREIGN PATENT DOCUMENTS

| | | |
|---|---|---|
| JP | 2007-005372 | 1/2007 |
| WO | WO 2013-105347 | 7/2013 |

OTHER PUBLICATIONS

Huang et al., "Static active-matrix OLED Display without Pixel Refresh Enabled by Amorphous-silicon Non-volatile Memory," Journal of the SID, 18/11, 2010, pp. 879-883.

Setlur, "Phosphors for LED-based Solid-State Lighting," The Electrochemical Society Interface, Winter 2009, pp. 32-36.

Singh et al., "Design and Fabrication of InGaN/GaN MQWs Blue LED on Sapphire Substrate for High Voltage Operation," IRACST—Engineering Science and Technology: An International Journal (ESTIJ), ISSN: 2250-3498, 5(4):299-301, Aug. 2015.

Authorized officer Sang Bum Chin, International Search Report and Written Opinion in PCT/US2017/056378, dated Mar. 6, 2018, 17 pages.

* cited by examiner

Crystalline Planes of Silicon

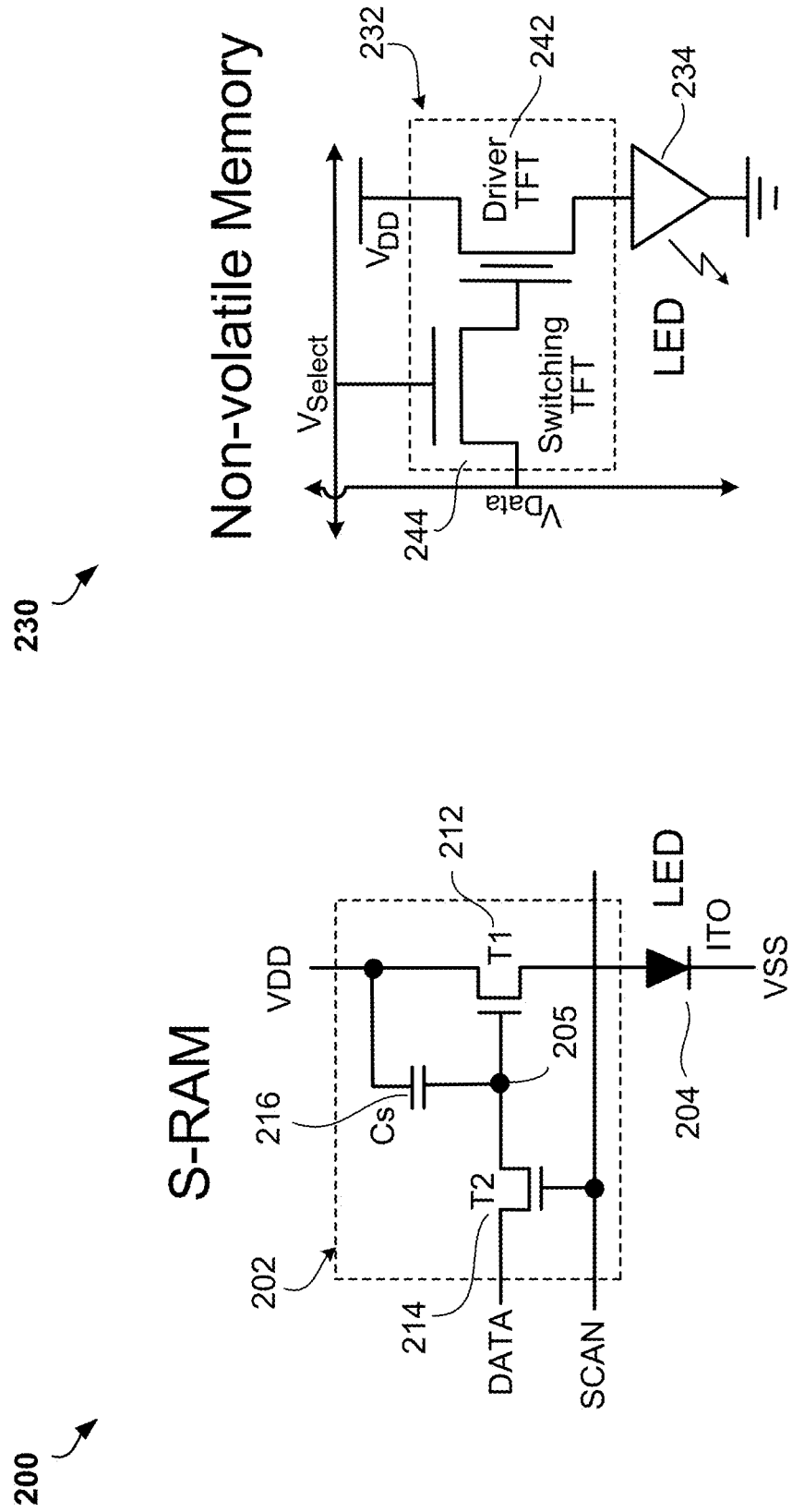

FABRICATING INTEGRATED LIGHT-EMITTING PIXEL ARRAYS FOR DISPLAYS

CROSS-REFERENCE TO RELATED APPLICATION

This application is a continuation-in-part application of U.S. patent application Ser. No. 15/291,330, filed on Oct. 12, 2016, the entire content of which is incorporated herein by reference.

TECHNICAL FIELD

This disclosure relates generally to display devices or systems, particularly to fabricating integrated light-emitting pixel arrays for display devices or systems.

BACKGROUND

Displays utilizing arrays of light emitting pixels are popular in the electronic field and especially in portable electronic and communication devices, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

Although LED arrays offer certain advantages, a major disadvantage is the complexity of their manufacturing process. In some cases, the arrays are manufactured by depositing materials on a supporting substrate and addressing/driver connections to row and column buses are made around the edges. Thus, the supporting substrate size is larger than the array size because of the necessary I/O pads or terminals. Providing very small contact pads in an effort to increase the array size greatly reduces the assembly yield. Another problem is that the driver circuitry for the LED arrays has a relatively high power consumption and adds a further manufacturing complexity.

SUMMARY

Described herein are integrated light-emitting pixel array-based devices or systems and methods of making them.

One aspect of the present disclosure features a device including: a substrate including a first side and a second side; an array of light-emitting pixels formed on the first side, each pixel including at least one light-emitting element and at least one non-volatile memory coupled to the at least one light-emitting element; control electronics formed on the second side; and interconnects penetrating through the substrate and conductively coupling the array of pixels on the first side to the control electronics on the second side.

The foregoing and other embodiments can each optionally include one or more of the following features, alone or in combination. For instance, the non-volatile memory can include at least two transistors. The device can further include scanning drivers and data drivers, wherein each pixel is coupled to one of the scanning drivers through at least one word line and to one of the data drivers through at least one bit line.

In some implementations, the word lines and the bit lines are formed on the first side. The scanning drivers and the data drivers can be formed on the first side and coupled to the control electronics through the interconnects. A number of the interconnects can be smaller than a sum of a number of the scanning drivers and a number of the data drivers. In some examples, the scanning drivers and the data drivers are formed on the second side and coupled to the word lines and the bit lines through the interconnects, and the scanning drivers and the data drivers are conductively coupled to the control electronics on the second side.

In some implementations, the word lines and the bit lines are formed on the second side and coupled to the pixels through the interconnects, and the scanning drivers and the data drivers are formed on the second side and conductively coupled to the control electronics on the second side.

Each pixel can include at least three light-emitting elements operable to emit at least three different colors. Each of the at least three light-emitting elements can be coupled to a respective non-volatile memory in the pixel, and the respective non-volatile memory can be coupled to the one of the scanning drivers through a respective word line and the one of the data drivers through a respective bit line. In some examples, the at least three light-emitting elements include red, blue, and green light-emitting diodes (LEDs). In some examples, the at least three light-emitting elements include a white LED.

In some examples, the at least three light-emitting elements include one or more quantum well layers formed by Group III-V compounds. The at least three light-emitting elements can have the same quantum well layers configured to emit light with a first color, and at least one of the at least three light-emitting elements includes a phosphor material or a quantum-dot material configured to emit a second light having a color different from the first color.

The control electronics can include a controller configured to transmit a data signal to one or more particular data drivers and one or more particular scanning drivers, wherein the particular scanning drivers are configured to select one or more light-emitting pixels through corresponding word lines, and wherein the particular data drivers are configured to transmit a power signal based on the data signal through corresponding bit lines to the selected light-emitting pixels such that the selected light-emitting pixels emit light based on the power signal. In some examples, the control electronics includes a processor configured to process an image for display, the data signal being based on a result of processing the image.

The substrate can be a silicon semiconductor substrate. In some implementations, the silicon substrate has a first surface having a (111) orientation on the first side and a second surface having a (111) orientation on the second side and opposite to the first surface, and the light-emitting pixels are formed on the first surface, and the control electronics are formed on the second surface.

In some implementations, the silicon substrate has a first surface having a (111) orientation on the first side and a second surface having a (100) orientation on the second side, the first surface being not parallel to the second surface, and the light-emitting elements of the pixels are at least partially formed on the first surface, and the control electronics are formed on the second surface. In some examples, the first side includes an array of trenches defining a plurality of sub-surfaces each having a (111) orientation, the sub-surfaces including the first surface and being not parallel to the second surface, and the light-emitting elements of the pixels are at least partially formed on the sub-surfaces of the trenches. In some examples, the silicon substrate has a third surface having a (100) orientation on the first side and parallel to the second surface, and the non-volatile memories of the pixels are formed on the third surface.

In some implementations, the device further includes a protective layer covering the array of light-emitting pixels on the first side and coupled to the non-volatile memories in the light-emitting pixels, and the protective layer and the non-volatile memories form a touch screen position sensor operable to generate an electrical change in response to a touch on a spot of the protective layer. The control electronics can include a touch screen signal processor coupled to the non-volatile memories through the interconnects.

In some implementations, the control electronics includes one or more digital signal processors including at least one of: a digital signal analyzer, a digital processor, an image processor, a volatile memory, a non-volatile memory, or a touch screen processor. The control electronics can include one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

Another aspect of the present disclosure features an integrated active-matrix light-emitting diode (LED) pixel display, including: a silicon semiconductor substrate including a first side and a second side; an array of active-matrix LED pixels formed on the first side, each LED pixel including at least one LED and at least one non-volatile memory coupled to the at least one LED; a plurality of display drivers formed on the first side and coupled to the LED pixels; one or more integrated circuits formed on the second side; and a plurality of conductive electrodes penetrating through the silicon substrate and coupling the display drivers on the first side to the one or more integrated circuits on the second side, wherein the one or more integrated circuits transmit image or video data to the display drivers via the conductive electrodes, and the display drivers select one or more particular LED pixels and control the particular LED pixels to emit light based on the image or video data.

The foregoing and other embodiments can each optionally include one or more of the following features, alone or in combination. For instance, the plurality of display drivers can include scanning drivers and data drivers formed on the first side, and each of the LED pixels can be coupled to one of the scanning drivers through at least one word line and to one of the data drivers through at least one bit line, the word lines and the bit lines being formed on the first side. A number of the plurality of conductive electrodes can be no more than a number of the plurality of display drivers.

In some implementations, the one or more integrated circuits include a controller configured to transmit the image or video data to one or more particular data drivers and one or more particular scanning drivers, the particular scanning drivers are configured to select one or more light-emitting pixels through corresponding word lines, and the particular data drivers are configured to transmit a power signal based on the data signal through corresponding bit lines to the selected light-emitting pixels such that the selected light-emitting pixels emit light based on the power signal.

In some implementations, the silicon semiconductor substrate includes: a first surface along a (111) crystalline plane direction on the first side, the array of active-matrix LED pixels and the display drivers being formed on the first surface; and a second surface along the (111) crystalline plane direction on the second side, the second surface being opposite to the first surface, the one or more integrated circuits being formed on the second surface.

In some implementations, the silicon semiconductor substrate including a first surface along a (111) crystalline plane direction on the first side, the light-emitting elements of the pixels being at least partially formed on the first surface; a second surface along a (100) crystalline plane direction on the first side, the non-volatile memories of the pixels and the display drivers being formed on the second surface; and a third surface along the (100) crystalline plane direction on the second side, the one or more integrated circuits being formed on the third surface.

Each of the pixels can include at least three light-emitting elements operable to emit at least three different colors. The at least three light-emitting elements can include same quantum well layers formed by Group III-V compounds and configured to emit light with a first color, and at least one of the at least three light-emitting elements can include a phosphor material or a quantum-dot material configured to emit a second light different from the first color.

A third aspect of the present disclosure features a method of forming integrated light-emitting pixel arrays for display, including: preparing a substrate that has a first side and a second side; forming light-emitting pixel arrays on the first side, each pixel including at least one light-emitting element and at least one non-volatile memory coupled to the at least one light-emitting element; forming conductive interconnects through the substrate; and forming one or more integrated circuits on the second side, the interconnects conductively coupling the one or more integrated circuits to the light-emitting pixels.

The foregoing and other embodiments can each optionally include one or more of the following features, alone or in combination. For instance, forming light-emitting pixel arrays on the first side can include forming light-emitting diodes (LEDs) including one or more quantum well layers including Group III-V compounds.

In some implementations, the method further includes forming scanning drivers and data drivers on the first side; and forming word lines and bit lines on the first side, such that each pixel is coupled to one of the scanning drivers through at least one word line and to one of the data drivers through at least one bit line. The scanning drivers and the data drivers can be coupled to the one or more integrated circuits through the interconnects.

In some implementations, the method includes forming scanning drivers and data drivers on the second side, wherein the scanning drivers and the data drivers are conductively coupled to the one or more integrated circuits on the second side; and forming word lines and bit lines on the second side, wherein the pixels are coupled to the word lines and bit lines through the interconnects, such that each pixel is coupled to one of the scanning drivers through at least one word line and to one of the data drivers through at least one bit line.

The formed light-emitting elements can be configured to emit light with a first color. The method can further include: patterning by photoresist the first side to select particular light-emitting elements; depositing a phosphor film or a quantum-dot film on the selected light-emitting elements; and removing the photoresist to form light-emitting elements for emitting light with a second color different from the first color.

In some implementations, the substrate is a (111) silicon semiconductor substrate having a first surface on the first side and a second surface on the second side and opposite to the first surface, and the light-emitting elements and the non-volatile memories are formed on the first surface, and the one or more integrated circuits are formed on the second surface.

In some implementations, the substrate is a (100) silicon semiconductor substrate having a first surface along a (100) crystalline plane direction on the first side and a second surface along the (100) crystalline plane direction on the second side, the second surface being parallel to the first surface. Preparing a substrate can include etching the first side of the substrate to form a third surface having along a (111) crystalline plane, the third surface being not parallel to the first surface. In some examples, forming light-emitting pixel arrays on the first side includes: forming the light-emitting elements of the pixels on the third surface; and forming the non-volatile memories on the first surface. In some examples, forming one or more integrated circuits on the second side includes forming the one or more integrated circuits on the second surface.

A fourth aspect of the present disclosure features a method of displaying an image on an integrated display system formed on a substrate, the method including: receiving an instruction to display an image on the display system; analyzing, by a controller of the display system, the image to obtain image data, the controller being formed on a first side of the substrate; transmitting, by the controller, the image data to one or more display drivers formed on a second side of the substrate via conductive interconnects penetrating trough the substrate; selecting, by the display drivers, one or more light-emitting pixels of an array of light-emitting pixels formed on the second side of the substrate; and controlling, by the display drivers, the selected light-emitting pixels to emit light corresponding to the image data to display the image.

A fifth aspect of the present disclosure features a device including a substrate including a first side and a second side; an array of light-emitting elements formed on the first side; a plurality of non-volatile memories formed on the second side; a plurality of scanning drivers and data drivers on the second side; and interconnects penetrating through the substrate and conductively coupling the array of light-emitting elements on the first side to the plurality of non-volatile memories on the second side, wherein each of the light-emitting elements is coupled to a respective one of the plurality of non-volatile memories to form a corresponding active-matrix light-emitting pixel, wherein each of the active-matrix light-emitting pixels is coupled to one of the scanning drivers through at least one word line and one of the data drivers through at least one bit line, and wherein the word lines and the bits lines are formed on the second side.

The foregoing and other embodiments can each optionally include one or more of the following features, alone or in combination. In some implementations, the substrate is a (111) silicon semiconductor substrate having a first surface on the first side and a second surface on the second side and opposite to the first surface, and the light-emitting elements can be formed on the first surface and the non-volatile memories are formed on the second surface. In some implementations, the substrate is a silicon semiconductor substrate including a first surface having a (111) orientation on the first side and a second surface having a (100) orientation on the second side, the first surface being not parallel to the second surface, and the light-emitting elements of the pixels can be at least partially formed on the first surface, and the non-volatile memories can be formed on the second surface.

A sixth aspect of the present disclosure features an integrated light-emitting diode (LED) display device, including: a silicon substrate including a first side and a second side; an array of light-emitting pixels formed on the first side, each pixel including at least one light-emitting diode (LED) and at least one non-volatile memory; a plurality of scanning drivers and a plurality of data drivers formed on the first side, wherein each pixel is coupled to a corresponding scanning driver through at least one word line and to a corresponding data driver through at least one data line, the word lines and the data lines being conductive metal lines; one or more digital signal processors and one or more analog signal processors formed on the second side; and a plurality of conductive electrodes penetrating through the silicon substrate and between the first side and the second side, the conductive electrodes coupling the plurality of scanning drivers and the plurality of data drivers on the first side to the digital signal processors on the second side to form the integrated LED display device.

The foregoing and other embodiments can each optionally include one or more of the following features, alone or in combination. For instance, the integrated LED display device can be configured to display static or dynamic images or videos with multiple colors. Each pixel can include at least an III-V compound based LED operable to emitting a blue color. Each pixel can include at least one secondary light emitting material configured to change a primary color emitted by the LED in the pixel, and the secondary light emitting material can include at least one of a different color phosphor material or a different size quantum dot material. Each pixel can include at least three LEDs for emitting three primary colors, and where the three primary colors include red, blue, and green. Each non-volatile memory can include at least two transistors. An emitting surface of the LEDs can be not parallel to a surface of the silicon substrate.

In some implementations, the digital signal processors include at least one of: a digital signal analyzer, a digital processor, an image processor, a volatile memory, a non-volatile memory, or a touch screen signal processor. In some implementations, the analog signal processors include at least one of: a light signal sensor, an electrical signal sensor, a sound signal sensor, a sound signal processor, an analog signal amplifier, an analog to digital converter (ADC), a digital to analog converter (DAC), or a touch screen signal processor, or any other associated electronic components.

The integrated LED display device can further include a transparent protective layer on the first side and configured to cover the light-emitting pixels, and the transparent protective layer and the non-volatile memories underneath in the light-emitting pixels can form a touch screen position sensor.

A seventh aspect of the present disclosure features a method of fabricating an integrate LED pixel display device, including: forming an array of silicon surfaces parallel to a (111) crystalline plane on a first side of a silicon substrate; epitaxially growing an array of LEDs on the (111) silicon surfaces by at least one of metal-organic chemical vapor deposition (MOCVD), molecular beam epitaxy (MBE), or atomic layer deposition (ALD); forming, for each LED pixel, at least one non-volatile memory adjacent to each of the LEDs in the LED pixel on the first side of the silicon substrate; forming a plurality of row scanning drivers and a plurality of column data drivers on the first side of the silicon substrate; forming row metal connection lines and column metal connection lines on the first side of the silicon substrate, wherein each of the LEDs is connected to a corresponding non-volatile memory that is connected to one of the scanning drivers through at least one row metal connection line and to one of the data drivers through at least one column line; forming conductive electrodes connecting the first side and a second side of the silicon substrate by: dry etching the silicon substrate from the second side to form through-holes in the silicon substrate, insulating inner surfaces of the through-holes, and filling metal in the through-holes; forming control electronics on the second side of the silicon substrate, wherein the control electronics includes at least one of: a controller, a data processor, an image processor, a signal amplifier, an analog to digital converter (ADC), a digital to analog converter (DAC), a memory, or a signal sensor; forming an array of secondary light emitting elements on surfaces of the formed LEDs by using different color phosphor materials or different size quantum dots materials, such that the array of LEDs is operable to emit at least three colors including red, blue, and green; and then forming a transparent protective layer on the array of the LEDs, wherein the transparent protective layer is configured to form, together with the non-volatile memories under the transparent protective layer, a capacitive touch screen position sensor.

An eighth aspect of the present disclosure features a device including a substrate including a first side and a second side; an array of light-emitting pixels formed on the first side, each pixel including at least one light-emitting element; one or more display drivers formed on the first side and coupled to the array of light-emitting pixels; one or more integrated circuits formed on the second side; and interconnects penetrating through the substrate and conductively coupling the control electronics on the second side to the one or more display drivers.

The foregoing and other embodiments can each optionally include one or more of the following features, alone or in combination. For instance, the display drivers can include scanning drivers and data drivers, and each pixel can be coupled to one of the scanning drivers through at least one word line and to one of the data drivers through at least one bit line, and the word lines and the bit lines are formed on the first side.

In some implementations, the control electronics includes a controller configured to transmit a data signal to one or more particular data drivers and one or more particular scanning drivers, the particular scanning drivers are configured to select one or more light-emitting pixels through corresponding word lines, and the particular data drivers are configured to transmit a power signal based on the data signal through corresponding bit lines to the selected light-emitting pixels such that the selected light-emitting pixels emit light based on the power signal. The control electronics can include a processor configured to process an image for display, the data signal being based on a result of processing the image.

Each pixel can include at least three light-emitting elements operable to emit at least three different colors. The at least three light-emitting elements can include red, blue, and green light-emitting diodes (LEDs). The at least three light-emitting elements can include a white LED. The at least three light-emitting elements can include one or more quantum well layers formed by Group III-V compounds.

In some examples, the at least three light-emitting elements have the same quantum well layers configured to emit light with a first color, and at least one of the at least three light-emitting elements can include a phosphor material or a quantum-dot material configured to emit a second light having a color different from the first color.

The substrate can be a silicon semiconductor substrate. In some implementations, the silicon substrate has a first surface having a (111) orientation on the first side and a second surface having a (111) orientation on the second side and opposite to the first surface, and the light-emitting pixels and the display drivers can be formed on the first surface, and the control electronics are formed on the second surface.

In some implementations, the silicon substrate has a first surface having a (111) orientation on the first side and a second surface having a (100) orientation on the second side, the first surface being not parallel to the second surface, and the light-emitting elements of the pixels are at least partially formed on the first surface, and the control electronics are formed on the second surface. The first side can include an array of trenches defining a plurality of sub-surfaces each having a (111) orientation, the sub-surfaces including the first surface and being not parallel to the second surface, and the light-emitting elements of the pixels can be at least partially formed on the sub-surfaces of the trenches. The silicon substrate can have a third surface having a (100) orientation on the first side and parallel to the second surface, and the display drivers can be formed on the third surface.

In some implementations, the control electronics includes: one or more digital signal processors including at least one of: a digital signal analyzer, a digital processor, an image processor, a volatile memory, a non-volatile memory, or a touch screen processor; and one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

A ninth aspect of the present disclosure features a method of fabricating an integrated device, including: forming an array of light emitting elements on a first side of a substrate; forming an array of active-matrix light emitting pixels using the array of light emitting elements, each pixel including at least one light emitting element and at least one non-volatile memory coupled to the at least one light-emitting element; forming conductive interconnects penetrating through the substrate from a second side of the substrate to the first side; and forming one or more integrated circuits on the second side, the one or more integrated circuits being conductively coupled to the array of active-matrix light-emitting pixels through the conductive interconnects.

In some implementations, forming an array of light emitting elements includes: forming a plurality of semiconductor layers on the first side of the substrate to form a light emitting structure; and patterning the light emitting structure to form the array of light emitting elements. In some cases, patterning the light emitting structure can include etching, with a patterned mask, through the semiconductor layers into the substrate, such that the light emitting elements are separated from each other. The formed light-emitting structure can be configured to be activated to emit light with a single color, and each of the light emitting elements is configured to emit light with the single color. In some cases, the semiconductor layers include one or more quantum well layers including Group III-V compounds, and each of the light emitting elements includes a light emitting diode (LED). The semiconductor layers can include a plurality of pairs of alternating GaN:Si layer and InGaN layer, and each of the light emitting elements comprises a blue LED operable to emit blue light.

The method can further include: before forming the conductive interconnects, thinning the substrate from the second side. The method can further include: filling an isolation material in gaps between adjacent light emitting elements of the array of light emitting elements on the first side. Filling the isolation material in the gaps can include:

depositing a dielectric material in the gaps by chemical vapor deposition (CVD). The method can further include: polishing the first side to form a flat surface across the array of light emitting diodes. Polishing the first side can include using chemical-mechanical polishing (CMP). In some cases, the method further includes: forming a conductive layer on the first side to form a common ground for the array of light emitting elements. The conductive layer can include indium tin oxide (ITO). Forming the conductive interconnects can include: etching the substrate from the second side to form trenches in the substrate; insulating inner surfaces of the trenches; and filling a conductive material in the trenches.

In some implementations, forming the array of active-matrix light emitting pixels includes: forming a plurality of non-volatile memories on the second side; and conductively connecting the array of light-emitting elements on the first side to the plurality of non-volatile memories on the second side via the conductive interconnects. The method can further include: forming scanning drivers and data drivers on the second side, wherein the scanning drivers and the data drivers are conductively coupled to the one or more integrated circuits on the second side; and forming word lines and bit lines on the second side and conductively coupled to the non-volatile memories, such that each of the non-volatile memories is coupled to one of the scanning drivers through at least one word line and to one of the data drivers through at least one bit line.

In some implementations, forming the array of active-matrix light emitting pixels includes: forming a plurality of non-volatile memories on the first side, each of the non-volatile memories being adjacent to one or more light emitting elements of a corresponding pixel.

In some cases, the method can further include: forming scanning drivers and data drivers on the first side, wherein the scanning drivers and the data drivers are conductively coupled to the one or more integrated circuits on the second side through the conductive interconnects; and forming word lines and bit lines on the first side, such that each of the non-volatile memories is coupled to one of the scanning drivers through at least one word line and to one of the data drivers through at least one bit line. Forming the plurality of non-volatile memories and the scanning drivers and data drivers can include: selectively etching particular areas on the first side into the substrate; cleaning open surfaces of the substrate on the first side; and forming the plurality of non-volatile memories and the scanning drivers and data drivers on the open surfaces.

In some cases, the method can further include: forming word lines and bit lines on the first side and conductively coupled to the plurality of non-volatile memories; and forming scanning drivers and data drivers on the second side and conductively coupled to the one or more integrated circuits on the second side. The word lines and bit lines can be conductively coupled to the scanning drivers and the data drivers through the conductive interconnects, such that each of the non-volatile memories is coupled to one of the scanning drivers through at least one word line and to one of the data drivers through at least one bit line. Forming the plurality of non-volatile memories and the word lines and bit lines on the first side can include: selectively etching particular areas on the first side into the substrate; cleaning open surfaces of the substrate; forming the plurality of non-volatile memories on the open surfaces on the particular areas; selectively etching the light emitting elements to open particular semiconductor layers and depositing conductive electrodes on the particular semiconductor layers as Ohmic contacts of the light emitting elements; and forming the word lines and bit lines and conductive connections on the first side, such that the word lines and the bit lines are conductively coupled to the plurality of non-volatile memories.

In some cases, the method can further include: forming scanning drivers and data drivers on the second side, where the scanning drivers and the data drivers are conductively coupled to the one or more integrated circuits on the second side; and forming word lines and bit lines on the second side and coupled to the scanning drivers and the data drivers, respectively, where the non-volatile memories are conductively coupled to the word lines and bit lines through the conductive interconnects, such that each of the non-volatile memories is coupled to one of the scanning drivers through at least one word line and to one of the data drivers through at least one bit line.

In some implementations, the method further includes: depositing an insulating layer on the first side; polishing a surface of the insulating layer to expose surfaces of the light emitting elements; and forming a conductive layer on the surfaces of the light emitting pixels to form a common ground for the array of light emitting elements.

In some examples, the one or more integrated circuits include at least one of: one or more digital signal processors including at least one of: a digital signal analyzer, a digital processor, an image processor, a volatile memory, a non-volatile memory, or a touch screen processor; or one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

The method can further include: a conductive grid array package formed on the second side of the substrate and conductively coupled to the one or more integrated circuits. The conductive grid array package can include a ball grid array (BGA) package, and the BGA package can be formed on a surface of the one or more integrated circuits.

In some implementations, each of the light-emitting elements is operable to emit light with a first color. The method can further include: forming an array of active-matrix multi-color display pixels using the array of active-matrix light-emitting pixels, each display pixel including at least a first pixel element operable to emit light with the first color and a second pixel element to emit light with a second color, the second color being different from the first color. Each display pixel can include at least three pixel elements operable to emit light with at least three different colors including red, blue, and green. In some cases, forming the array of active-matrix multi-color display pixels includes: patterning the first side with photoresist to select particular light-emitting elements; depositing a phosphor film or a quantum-dot film on the selected light-emitting elements; and removing the photoresist to form the second pixel elements of the display pixels. The method can further include: forming a protective layer on top of the array of active-matrix multi-color display pixels.

The substrate can include a silicon semiconductor substrate, and the silicon semiconductor substrate can have a first surface having a (111) orientation on the first side and a second surface having a (111) orientation on the second side and opposite to the first surface, and the array of light-emitting elements can be formed on the first surface, and the one or more integrated circuits can be formed on the second surface.

Another aspect of the present disclosure features an integrated device including: a substrate including a first side and a second side; an array of active-matrix light-emitting pixels at least partially on the first side, each pixel including one or more light-emitting elements and at least one non-volatile memory coupled to the one or more light-emitting elements, each of the light-emitting elements of the pixels including same semiconductor layers formed on the first side and operable to emit light with a same primary color; one or more integrated circuits on the second side; and conductive interconnects penetrating through the substrate and conductively coupling the array of active-matrix light-emitting pixels to the one or more integrated circuits.

In some implementations, the non-volatile memories of the pixels are on the second side and conductively coupled to the light-emitting elements through the conductive interconnects; scanning drivers and data drivers on the second side and conductively coupled to the one or more integrated circuits on the second side; and word lines and bit lines on the second side and conductively coupled to the non-volatile memories, such that each of the non-volatile memories is coupled to one of the scanning drivers through at least one word line and to one of the data drivers through at least one bit line.

In some implementations, the non-volatile memories of the pixels are on the first side and conductively coupled to the light-emitting elements, each of the non-volatile memories being arranged adjacent to one or more light emitting elements of a corresponding pixel.

In some cases, the integrated device further includes: scanning drivers and data drivers on the first side, where the scanning drivers and the data drivers are conductively coupled to the one or more integrated circuits on the second side through the conductive interconnects; and word lines and bit lines on the first side and conductively coupled to the scanning drivers and the data drivers, where each of the non-volatile memories is coupled to one of the scanning drivers through at least one word line and to one of the data drivers through at least one bit line.

In some cases, the integrated device further includes: scanning drivers and data drivers on the second side and conductively coupled to the one or more integrated circuits on the second side; and word lines and bit lines on the first side and conductively coupled to the non-volatile memories, where the word lines and the bit lines are coupled to the scanning drivers and the data drivers through the conductive interconnects, respectively, such that each of the non-volatile memories is coupled to one of the scanning drivers through at least one word line and to one of the data drivers through at least one bit line.

In some cases, the integrated device further includes: scanning drivers and data drivers on the second side and conductively coupled to the one or more integrated circuits on the second side; and word lines and bit lines on the second side and conductively coupled to the scanning drivers and the data drivers, respectively, where the non-volatile memories are coupled to the word lines and the bit lines through the conductive interconnects, such that each of the non-volatile memories is coupled to one of the scanning drivers through at least one word line and to one of the data drivers through at least one bit line.

For each pixel, at least one of the light emitting elements can include a phosphor film or a quantum dot film on the semiconductor layers and is operable to emit secondary light based on the light with the primary color. The light emitting elements can be isolated by an isolation material. In some cases, the integrated device further include: a conductive grid array package on the second side of the substrate and conductively coupled to the one or more integrated circuits.

The one or more integrated circuits can include at least one of: one or more digital signal processors including at least one of: a digital signal analyzer, a digital processor, an image processor, a volatile memory, a non-volatile memory, or a touch screen processor; or one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

A further aspect of the present disclosure features a method of fabricating an integrate active-matrix LED pixel array based display, including: depositing a plurality of semiconductor layers on a first side of a (111) silicon substrate to form a light emitting diode (LED) structure, the semiconductor layers including one or more quantum well layers having Group III-V compounds; etching the LED structure to form an array of LEDs on the first side; forming an array of active-matrix LED pixels by using the array of LEDs, wherein each LED pixel includes at least two LED and at least one non-volatile memory coupled to the at least two LEDs, each of the LEDs being operable to emit light with a primary color; forming conductive interconnects penetrating through the substrate from the second side to the first side; forming one or more integrated circuits on the second side and conductively coupled to the array of active-matrix LED pixels through the conductive interconnects; and forming an array of active-matrix multi-color display pixels by using the array of active-matrix LED pixels, each display pixel including at least two pixel elements operable to emit light with at least two different colors when excited by the light with the primary color emitted from at least two LEDs of a corresponding LED pixel.

Particular embodiments of the subject matter described in this specification can be implemented so as to realize one or more of the following advantages. Light-emitting pixel arrays, e.g., LED pixel arrays, are placed on one side of a substrate and are integrated with control electronics on the other side of the substrate and conductive interconnects through the substrate couple the control electronics to the pixel arrays. Accordingly, semiconductor based LED arrays are integrated with display control electronics on a silicon substrate, enabling the use of standard semiconductor IC (integrated circuit) manufacturing equipment, facilities, and processes, resulting in reduced cost. Moreover, integrated LED arrays on a silicon substrate enables fabrication of a ultra-high resolution display, e.g., 100 μm per pixel, and/or micro-LED (μ-LED) displays with extremely high efficiency to save energy.

The technology can use one or more quantum well layers of Group III-V compounds (e.g., GaN) as light emissive layers, which makes the LED arrays more energy efficient and more stable than OLED (organic LED) based arrays. The technology can also use phosphor materials or quantum-dot materials deposited on the III-V compound based LED arrays to produce multi-color displays. The technology can also integrate non-volatile memories, e.g., SRAM (static random-access memory), with the LEDs to form active-matrix LED pixels, enabling higher efficiency and faster response time than passive-matrix LED pixels. Furthermore, the technology allows integrating other components e.g., processors, memories, drivers, microcontrollers, sensors, timers, touch screen detectors, and/or amplifiers on the side of the silicon substrate opposite the pixel array, which greatly simplifies processing, achieves seamless integration and reduces cost.

The integrated LED array-based display systems, particularly micro-display systems, can achieve low power consumption (e.g., one order of magnitude lower than current display devices), high resolution (e.g., 1080p), a thin device thickness (e.g., no more than 1 mm), a large view angle (e.g., no less than 160 degrees), a high luminance contrast modulation (e.g., 100%), and/or low cost due to integration on a single substrate. These LED arrays can be widely used in many applications, including portable electronic and communication devices, such as wearable devices (e.g., eyeglasses, watches, clothes, bracelets, rings), virtual reality (VR)/augmented reality (AR) displays, or any lighting applications.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIGS. 2A-2B are schematic diagrams of example active-matrix LED pixels.

DETAILED DESCRIPTION

The following descriptions are example display devices or systems that include integrated light-emitting diode (LED) arrays and control electronics on silicon substrates. However, the disclosed implementations can be adopted to any suitable system that needs integration of two separate components, e.g., light-emitting pixel arrays and control electronics, on a single substrate. For example, the substrate can be made of any suitable material, e.g., silicon, silicon oxide, silicon carbide, gallium nitride, sapphire, glass, or spinel. The substrate can also be formed by a double-layer structure such as a silicon layer on glass, or a silicon-on-insulator (SOI) substrate. The light-emitting pixels can include any suitable light sources, e.g., semiconductor based LED pixels, OLED pixels, or laser diodes.

Example Display System

Figure 1A:
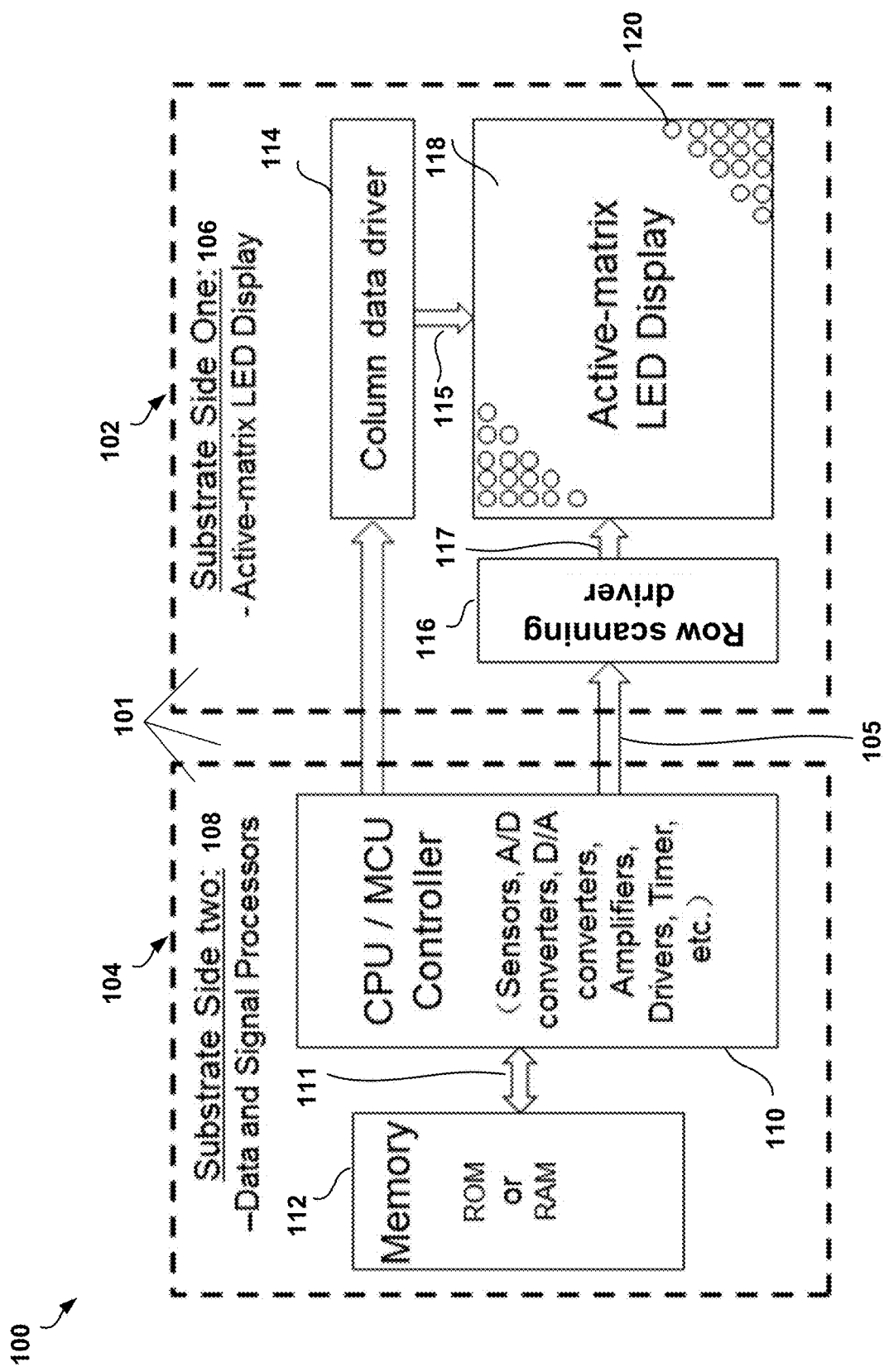
FIG. 1A is a schematic diagram of an example LED display system integrated on two sides of a substrate.

FIG. 1A is a schematic diagram of an example LED display system 100. The system 100 includes an LED display 102 formed on one side 106 of a substrate 101 and control electronics 104 formed on the other side 108 of the substrate 101. The substrate 101 can be a silicon substrate, e.g., a silicon wafer. The LED display 102 is coupled to the control electronics 104 via conductive interconnects 105, e.g., electrodes. The conductive interconnects 105 can penetrate through the substrate, e.g., via through-holes, and conductively couple the LED display 102 on the side 106 to the control electronics 104 on the other side 108.

In some implementations, the control electronics 104 includes one or more processors and/or controllers 110, e.g., a central processing unit (CPU), a microcontroller unit (MCU), and/or integrated circuits (ICs), e.g., sensors, analog/digital converters (ADCs), digital/analog converters (DACs), amplifiers, drivers, and/or timers. The control electronics 104 can also include a memory 112, e.g., a read-only memory (ROM) and/or a random-access memory (RAM). The processors and/or controllers 110 can be coupled to the memory 112 via connections 111, e.g., internal bus, conductive electrodes, wired connections, or wireless connections. The processors and/or controllers 110 are configured to read data from or store data into the memory 112. For example, the processors and/or controllers 110 can receive image or video data to be displayed, e.g., from external network or devices, process the image or video data, and/or store the processed image or video data in the memory 112. The memory 112 can also store instructions to cause the processors and/or controllers 110 to execute operations. Components of the control electronics 104 can be monolithically manufactured on the side 108 of the substrate 101.

The LED display 102 on the side 106 can be an active-matrix LED display including an array 118 of active-matrix LED pixels 120. Each LED pixel is coupled to a data driver 114 via at least one bit line 115 and a scanning driver (or scanning controller) 116 via at least one word line 117. The scanning driver 116 is configured to select an LED pixel through the word line 117 and the data driver 114 transmits a data signal to the selected LED pixel through the bit line 115. The array 118 of LED pixels may be coupled to a plurality of data drivers 114 and a plurality of scanning drivers 116. In some implementations, the data drivers 114 and the scanning drivers 116 are formed on the same side as the array 118 of the LED pixels 120, i.e., the side 106 of the substrate 101, as illustrated in FIG. 1A. The bit lines 115 and the word lines 117 can also be formed on the side 106 of the substrate 101. The data drivers 114 and the scanning drivers 116 are connected to the control electronics 104, e.g., the processors and/or controllers 110, through the conductive interconnects 105, and configured to receive instructions and/or data signals from the control electronics 104. In some examples, as described with further details in FIG. 3, the LED display system 100 can be used to display static or dynamic images/videos. The images/videos can have multiple colors.

In some implementations, the control electronics 104 includes one or more digital signal processors including: a digital signal analyzer, a digital processor, an image processor, a volatile memory, a non-volatile memory, and/or a touch screen processor. The control electronics 104 can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC (not shown). The digital signal processors are connected to the data drivers 114 and the scanning drivers 116 through the interconnects 105. In operation, the analog signal processors can receive and process image or video signals from external devices or network or from the internal memory 112. The image or video signals may be analog signals which can be processed and converted into digital signals by an ADC. The digital signals are further processed and analyzed by the digital signal processors. Then the processed digital data can be further transmitted from the digital signal processors to particular data drivers 114 and scanning drivers 116 which then select particular LEDs and control the selected LEDs for display.

Figure 1B:
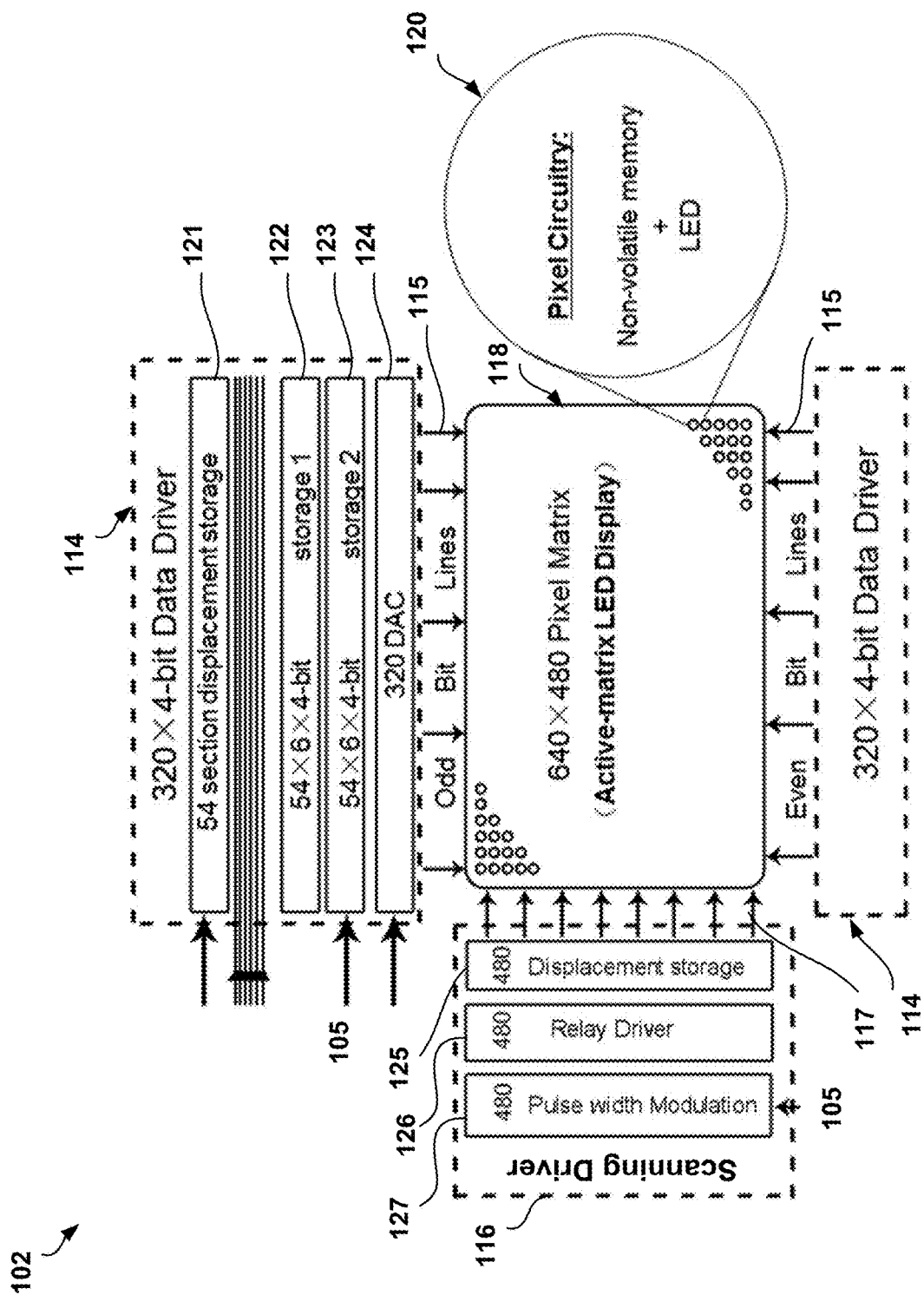
FIG. 1B is a schematic diagram of one side of the substrate of FIG. 1A including active-matrix LED pixel arrays.

FIG. 1B shows an example implementation of the active-matrix LED display 102 on the side 106 of the substrate 101 of FIG. 1A. The LED pixel array 118 is composed of 640 (columns)×480 (rows) pixel matrix arranged in columns and rows, respectively. Each pixel 120 is an active-matrix LED pixel. As illustrated in FIGS. 2A-2B below, an active-matrix LED pixel includes at least one LED and at least one non-volatile memory coupled to the at least one LED. Upon receiving the data instructions from the scanning driver 116 and/or the data driver 114, the non-voltage memory can enable each pixel to operate continuously and independently without waiting for the next instruction coming after a full scan.

In some examples, an LED pixel includes a plurality of LEDs, e.g., blue, red, and green LEDs, and a plurality of corresponding non-volatile memories. Each LED is coupled to a respective non-volatile memory. In some examples, one LED pixel includes three LEDs and one non-volatile memory coupled to the three LEDs. In some examples, the LED pixel includes a white LED. In some examples, the LED pixel includes four LEDs including three LEDs emitting basic light such as red, blue, and green, and a white LED emitting white light.

The scanning driver 116 can include 480 displacement storages 125, 480 relay drivers 126, and 480 pulse width modulators 127. Each row of LED pixels is coupled to a respective displacement storage 125, a respective relay driver 126, and a respective pulse width modulator 127 through a respective word line (or scanning line) 117. The scanning driver 116 can receive instructions from the control electronics 104, e.g., the processors/controllers 110, through the interconnects 105, and select one or more particular LED pixels based on those instructions.

In some implementations, the data driver is divided into two sub-drivers 114 positioned on top and bottom of the array 118 of LED pixels, respectively. Each sub-driver 114 can be a 320×4-bit data driver and include 54 section displacement storage 121, 54×6×4-bit storages 122 and 123, and/or 320 digital-to-analog converters (DACs) 124. Each sub-driver 114 is coupled to 320 columns of LED pixels through respective column bit lines. Particularly, the top sub-driver 114 is coupled to 320 columns of LED pixels through odd column bit lines, and the bottom sub-driver 114 is coupled to another 320 columns of LED pixels through even column bit lines. An intersection of an individual bit line 115 and an individual word line 117 is coupled to a respective LED pixel. That is, selecting the individual bit line 115 and the individual word line 117 can uniquely select the respective LED pixel. The sub-data driver 114 can receive instructions and/or data from the control electronics 104, e.g., the processors/controllers 110, through the interconnects 105, and select one or more particular LED pixels with the scanning driver 116 based on the instructions and/or data and transmit data to the selected particular LED pixels through respective bit lines 115.

In some implementations, the active-matrix LED display 102, e.g., at least the active-matrix LED pixel array 118, is covered by a protective layer (not shown). The protective layer can be transparent. In some examples, the protective layer is made of glass coated with a conductive material like indium tin oxide (ITO). The protective layer defines an array of spots corresponding to the array of LEDs. Each spot covers an LED underneath and is coupled to a corresponding non-volatile memory coupled to the LED. The spot and the surface of the LED may form a capacitor, and/or one or more additional capacitors may be formed between the spot and the LED. When the spot is touched, e.g., by a fingertip on top of the spot or moving towards the spot, a capacitance of the capacitors can change. The capacitance change can be detected by a touch screen detector/processor in the control electronics 104 and formed on the other side 108 through the non-volatile memory, a corresponding data driver 114/scanning driver 116 coupled to the non-volatile memory, and corresponding interconnects 105. Thus, the protective layer, the LED array, and the corresponding non-volatile memories can form a touch screen position sensor, which, together with the touch screen detector/processor in the control electronics 104, enables the LED display 102 to function as a touch screen display. Additional implementations of the touch screen sensor on the LEDs are also possible, e.g., using other technologies like resistive sensing, surface acoustic wave, infrared grid, infrared acrylic projection acoustic pulse recognition, or dispersive signal technology.

Figure 1C:
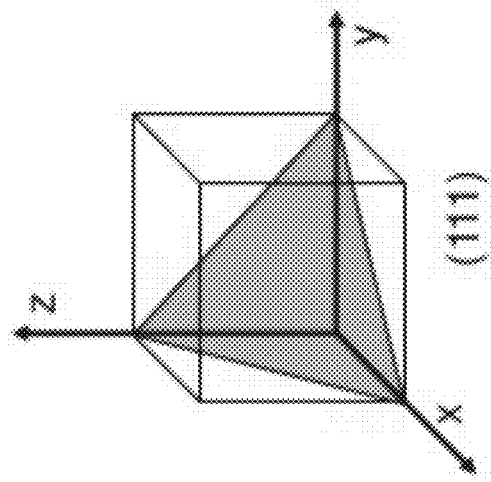
FIG. 1C is a schematic diagram of example crystalline planes of a silicon semiconductor substrate.
Figure 1C:
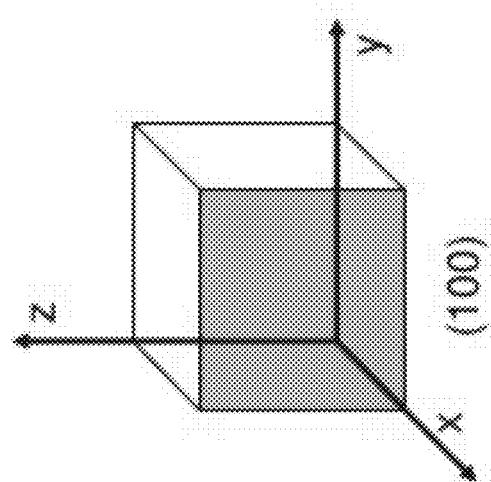

FIG. 1C shows example crystalline planes of a silicon semiconductor substrate, e.g., a silicon wafer. Orientations of the silicon wafer are classified using Miller indices. These indices include such descriptions as (100) and (111), as illustrated in FIG. 1C.

Example Active Matrix LED Pixels

FIG. 2A shows an example active-matrix LED pixel 200 with non-volatile memory. The LED pixel 200 includes an S-RAM (static-random access memory) 202 and an LED 204. The S-RAM 202 includes a driver transistor (T1) 212, a switching transistor (T2) 214, and a storage capacitor (Cs) 216. During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the LED 204 is consequently lighted.

FIG. 2B shows another example active-matrix LED pixel 230 with non-volatile memory 232 and an LED 234. The non-volatile memory 232 includes a driver transistor 242 and a switching transistor 244, that can be thin-film transistors (TFTs). In some implementations, different from the LED pixel 200 in FIG. 2A, the brightness of the LED 234 is not controlled by varying $V_{Data}$ applied to a gate of the driver transistor 242 through the switching transistor 244. Instead, a constant $V_{Data}$ is applied to the gate of the driver transistor 242. The current through the driver transistor that causes the LED 234 to illuminate is controlled by changing a threshold voltage $V_T$ of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the LEDs of an array.

Figure 2C:
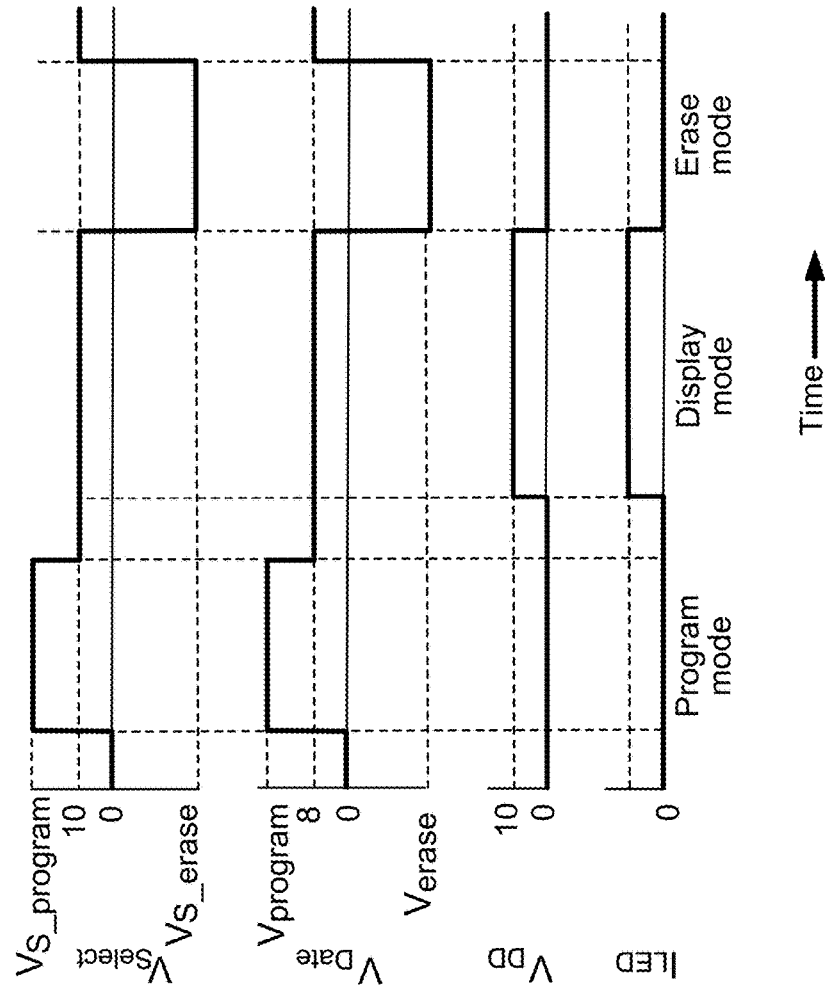
FIG. 2C shows an example timing diagram using active-matrix LED pixels for a video display.

FIG. 2C shows an example video scan timing 250 of a display using the active-matrix LED pixel 230 of FIG. 2B. After programming (i.e., programming mode), the display is activated by setting a supply voltage $V_{DD}$ to 10 V, $V_{Data}$ to 8 V on all the bit lines, and $V_{Select}$ to 10 V on all the word lines (select lines). The LED current and therefore brightness of the pixel 230 is determined by the programmed threshold voltage of the driver transistor 242. Both $V_{Data}$ and $V_{Select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Displaying Process

Figure 3:
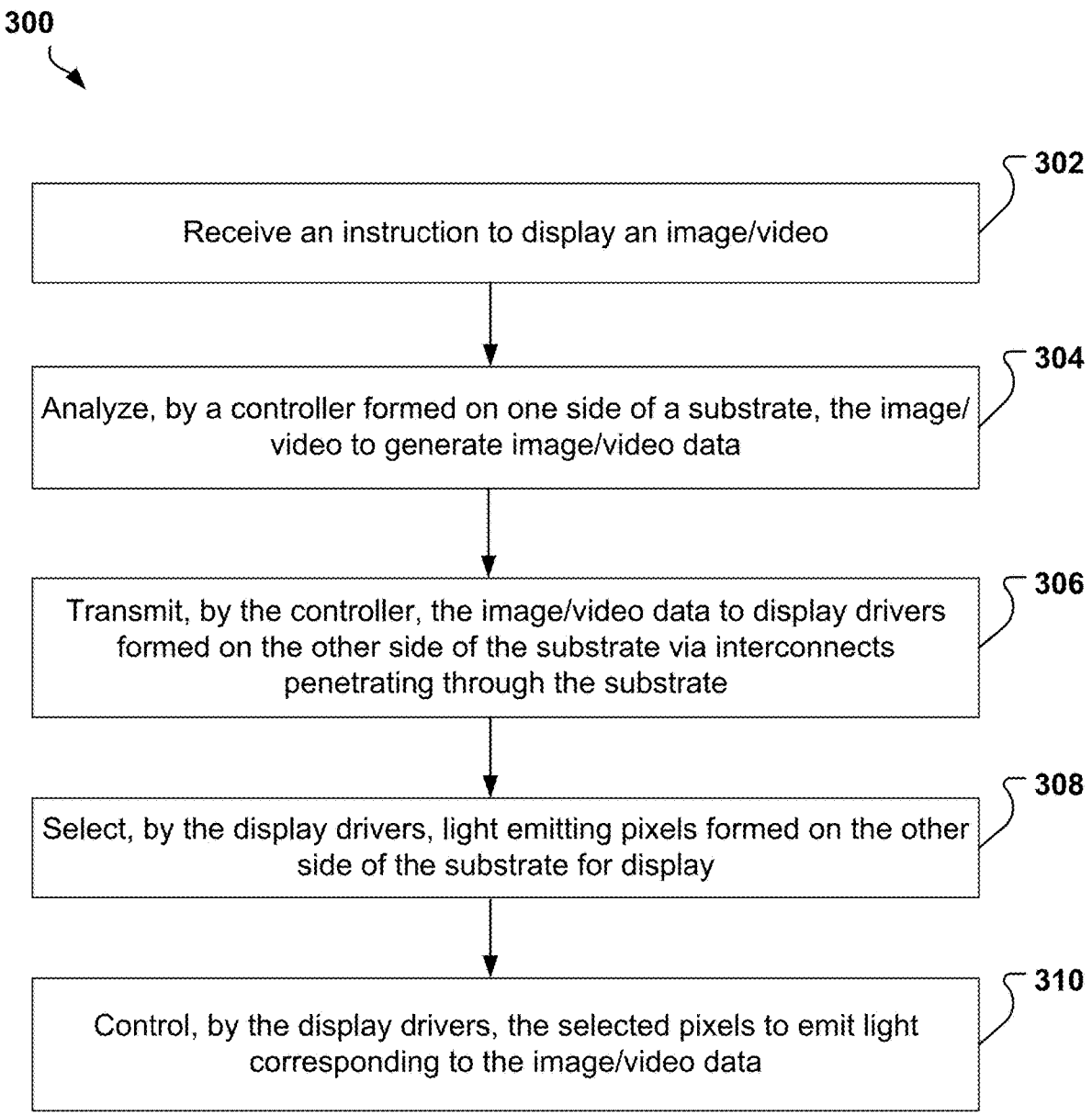
FIG. 3 is a flow diagram of an example process of displaying an image/video on an integrated LED display system.

FIG. 3 shows an example process 300 of displaying an image/video on an integrated display system. The integrated display system can be the integrated display system 100 of FIG. 1A or any other display system according to the present disclosure. Components of the display system are formed on a substrate, e.g., a silicon substrate. The image can be static or dynamic. The video can be considered as a series of sequential images, and pixels of the display systems can be refreshed to display a next image to replace a previous image.

An instruction is received to display an image/video (302). The display system can receive the instruction from an external device or network. In some cases, the image/video is received from the external device or network. In some cases, the image/video is stored in a memory in the display system. The memory can be the memory 112 formed on a first side of the substrate.

The image/video is analyzed by a controller of the display system to obtain image/video data (304). The controller can be the processors/controllers 110 of FIG. 1A. The controller is formed on a side of the substrate, e.g., on the first side with the memory. The controller can analyze the image/video to generate the image/video data. In some cases, the image/video data is stored in the memory. The controller can retrieve the stored image/video data based on the received instruction.

The image/video data is transmitted by the controller to one or more display drivers of the display system (306). The display drivers are formed on a second, different side of the substrate and coupled to the controller via conductive interconnects penetrating through the substrate. The second side can be opposite to the first side. In some examples, the controller selects the display drivers based on a result of analyzing the image/video and transmits the image/video data to the selected display drivers. The display drivers can include at least one scanning driver, e.g., the scanning driver 116 of FIG. 1A, and at least one data driver, e.g., the data driver 114 of FIG. 1A.

One or more light-emitting pixels of an array of light-emitting pixels are selected by the display drivers (308). The array of light-emitting pixels are formed on the second side of the substrate. The light-emitting pixels can be active-matrix pixels including non-volatile memories. Each light-emitting pixel is coupled to a display driver through connection lines. In some examples, each light-emitting pixel is coupled to a scanning driver through at least one word line and a data driver through at least one bit line. The scanning driver is configured to select a light-emitting pixel with the data driver, and the data driver is configured to transmit a data signal to the selected light-emitting pixel.

The selected light-emitting pixels are controlled by the display drivers to emit light corresponding to the image/video data (310). The image/video data can be transmitted to the selected light-emitting pixels by the display drivers, e.g., via a voltage applied on the connection lines such as bit lines. As noted above in FIGS. 2A-2C, by controlling the voltage applied on the connection lines or a threshold voltage of a transistor in an active-matrix pixel, the selected light-emitting pixels can be controlled to emit light with brightness corresponding to the image/video data, thus to display the image/video.

Example Integrated LED Displays and Fabrication Processes

Figure 4A:
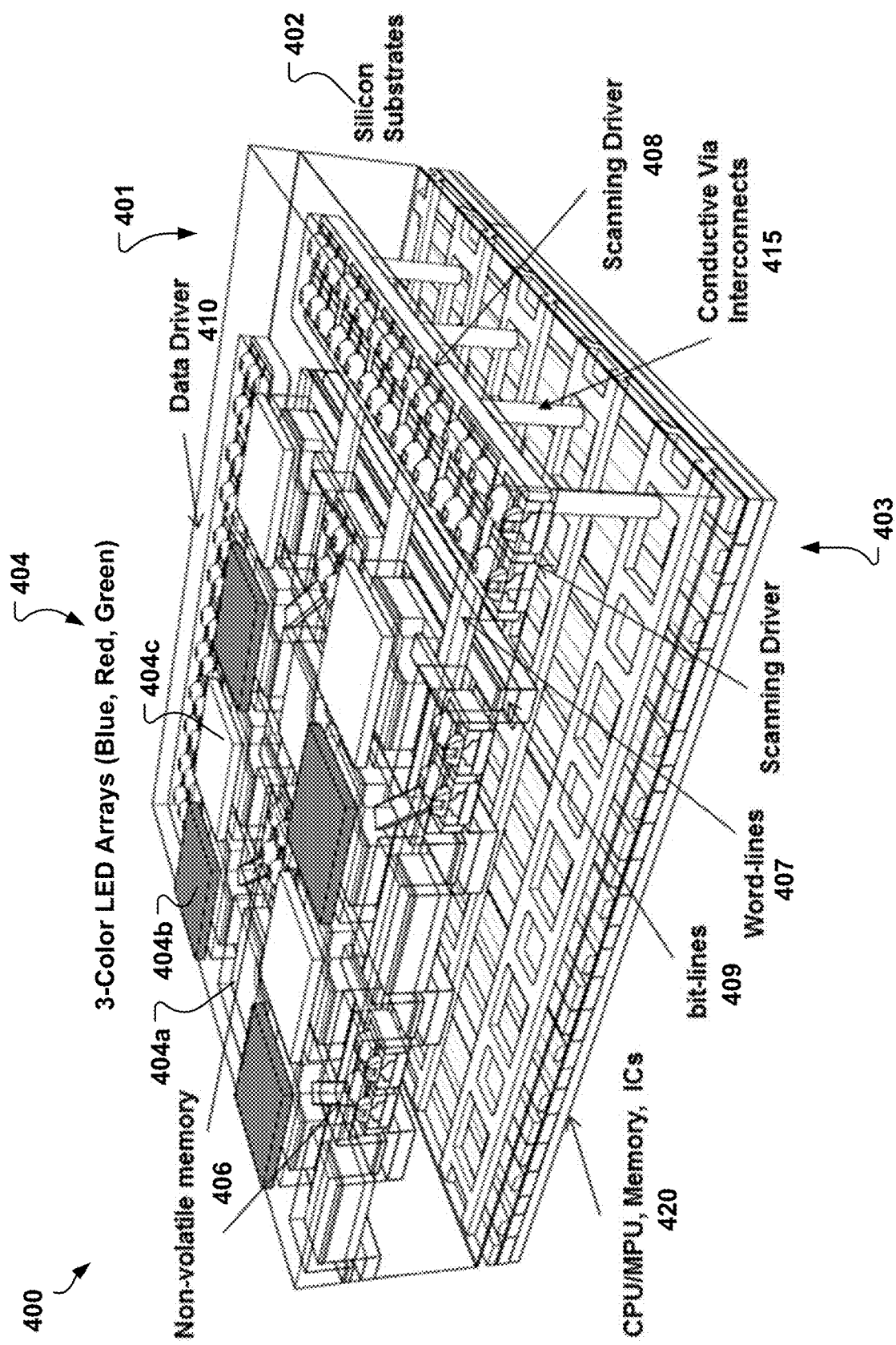
FIG. 4A is a perspective view of an example integrated LED display system with multi-color LED pixel arrays.
Figure 4B:
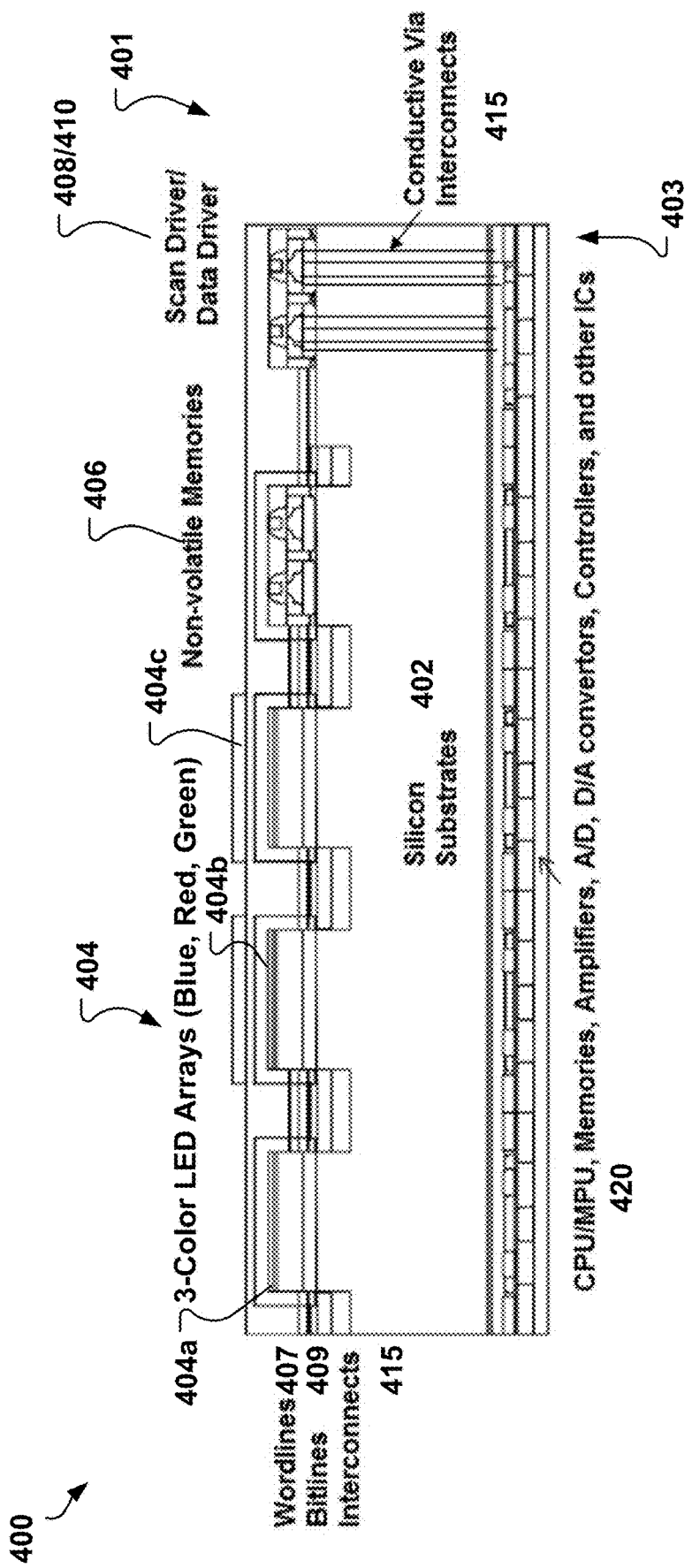
FIG. 4B is a cross-sectional view of the integrated LED display system of FIG. 4A.

FIGS. 4A-4B show an example integrated LED display system 400 with multi-color LED pixel arrays. The LED display system 400 can be the display system 100 of FIG. 1A. This LED display system 400 is formed on a silicon semiconductor substrate 402, e.g., a silicon wafer, with (111) orientation, or a silicon (111) substrate. The silicon substrate 402 can be a 2-inch silicon wafer, 4-inch silicon wafer, 6-inch silicon wafer, or any other size silicon wafer.

The silicon substrate 402 has a first side 401 and a second side 403. The first side 401 can be an upper side and the second side 403 can be a lower side opposite to the upper side. An array of LED pixels 404 is formed on the first side 401 and arranged in rows and columns. As an example, each LED pixel 404 in FIGS. 4A-4B includes a blue color LED 404a, a red color LED 404b, and a green color LED 404c. As discussed with further details in FIG. 5J, the red color LED 404b and the green color LED 404c can be formed based on a blue color LED 404a, e.g., by depositing different color phosphor material or different size quantum dots material on top of the blue color LED 404a. The blue color LED 404a can be directly formed on a surface of the first side 401 of the substrate 402 by depositing multiple semiconductor layers including at least one Group III-V compound layer. In some examples, a Group III-V compound layer includes a group III element and a group V element. The group III element can be gallium. The group V element can be nitride.

The LED pixel 404 also includes a pixel memory system 406 positioned adjacent to the three LEDs. The pixel memory system 406 can include three non-volatile memories each coupled to one of the three LEDs, respectively, as illustrated in FIG. 2A or 2B. The three LEDs 404a, 404b, 404c and the pixel memory system 406 can be arranged in a rectangular shape or a square shape. Each LED can have a size of about 30 µm or less. Each LED pixel can have a size of about 100 µm or less. Note that each LED pixel 404 can also include four LEDs including a white color LED and associated non-volatile memory in the pixel memory system 406.

A plurality of scanning drivers (or scanning drivers) 408 and a plurality of data drivers 410 are formed on the first side 401. For example, the scanning drivers 408 can be formed on a first edge of the substrate 402 along a first direction, e.g., perpendicular to multiple columns. The data drivers 410 can be formed on a second edge of the substrate 402 along a second direction, e.g., perpendicular to multiple rows. The second direction can be perpendicular to the first direction. In some implementations, as illustrated in FIG. 1B, one half of the data drivers 410 is formed on the second edge and configured to driver odd rows of LEDs, and another half of the data drivers is formed on a third edge parallel to the second edge and configured to driver even rows of LEDs.

Each LED 404a (or 404b or 404c) is coupled to a respective non-volatile memory in the pixel memory system 406. The respective non-volatile memory is coupled to a corresponding scanning driver 408 through a word line 407 and a corresponding data driver 410 through a bit line 409. Each scanning driver 408 can be coupled to a column of LEDs through one word line 407, and each data driver 410 can be coupled to a row of LEDs through one bit line 409. Thus, each LED can be individually or independently selected or controlled by a corresponding scanning driver 408 and a corresponding data driver 410. The word lines 407 and the bit lines 409 are also formed on the first side 401 of the substrate 402.

Control electronics 420 is formed on the second side 403 of the substrate 402. The control electronics 420 can be similar to the control electronics 104 of FIG. 1A. In some implementations, the control electronics 420 has CPU/MPU, memories, and ICs including amplifiers, ADCs (analog-to-digital converters), DACs (digital-to-analog converters), controllers, and/or other ICs.

The plurality of scanning drivers 408 and the plurality of data drivers 410 are coupled to the control electronics 420 via conductive interconnects 415. Each scanning driver 408 or each data driver 410 can be individually coupled to (and/or controlled by) the control electronics 420, e.g., a controller or a processor, through at least one conductive interconnects 415. The conductive interconnects 415 penetrate through the substrate 402 from the first side 401 to the second side 403. The number of the interconnects 415 can be smaller than a sum of the number of scanning drivers 408 and the number of data drivers 410.

FIGS. 5A-5J are perspective views at different steps of forming the integrated LED display system 400 of FIGS. 4A-4B on a silicon (111) substrate 500, e.g., a silicon (111) wafer. The silicon (111) substrate 500 has an upper side 501 including a top surface 502 and a lower side 503 including a bottom surface 504. The top surface 502 and the bottom surface 504 can be parallel to a (111) crystalline plane. The integrated LED display system 400 can be formed by the following steps.

First, the silicon (111) substrate 500 is prepared. The substrate 500 can be pre-treated, e.g., by cleaning the surfaces 502 and 504. In some cases, wet chemical treatment, e.g., an RCA clean procedure based on solutions, can be used to remove any organic or inorganic contaminations present on the surfaces 502 and 504. The solutions can include hydrogen peroxide, trichloroethylene, acetone, or methanol.

Second, the silicon substrate 500 is patterned. In some implementations, a hard mask layer, e.g., SiNx such as $Si_3N_4$, is used as a protective layer for patterning. The patterning of the silicon substrate 500 can include: 1) patterning a hard mask layer on the silicon substrate 500. This patterning can be formed by putting a mold with the desired pattern over the silicon substrate 500 and then depositing the hard mask layer. The hard mask layer can be deposited on the silicon substrate by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber; 2) dry etching silicon of the silicon substrate, e.g., using reactive ion etching (RIE) or plasma etching; 3) removing the remaining hard mask layer.

Figure 5A:
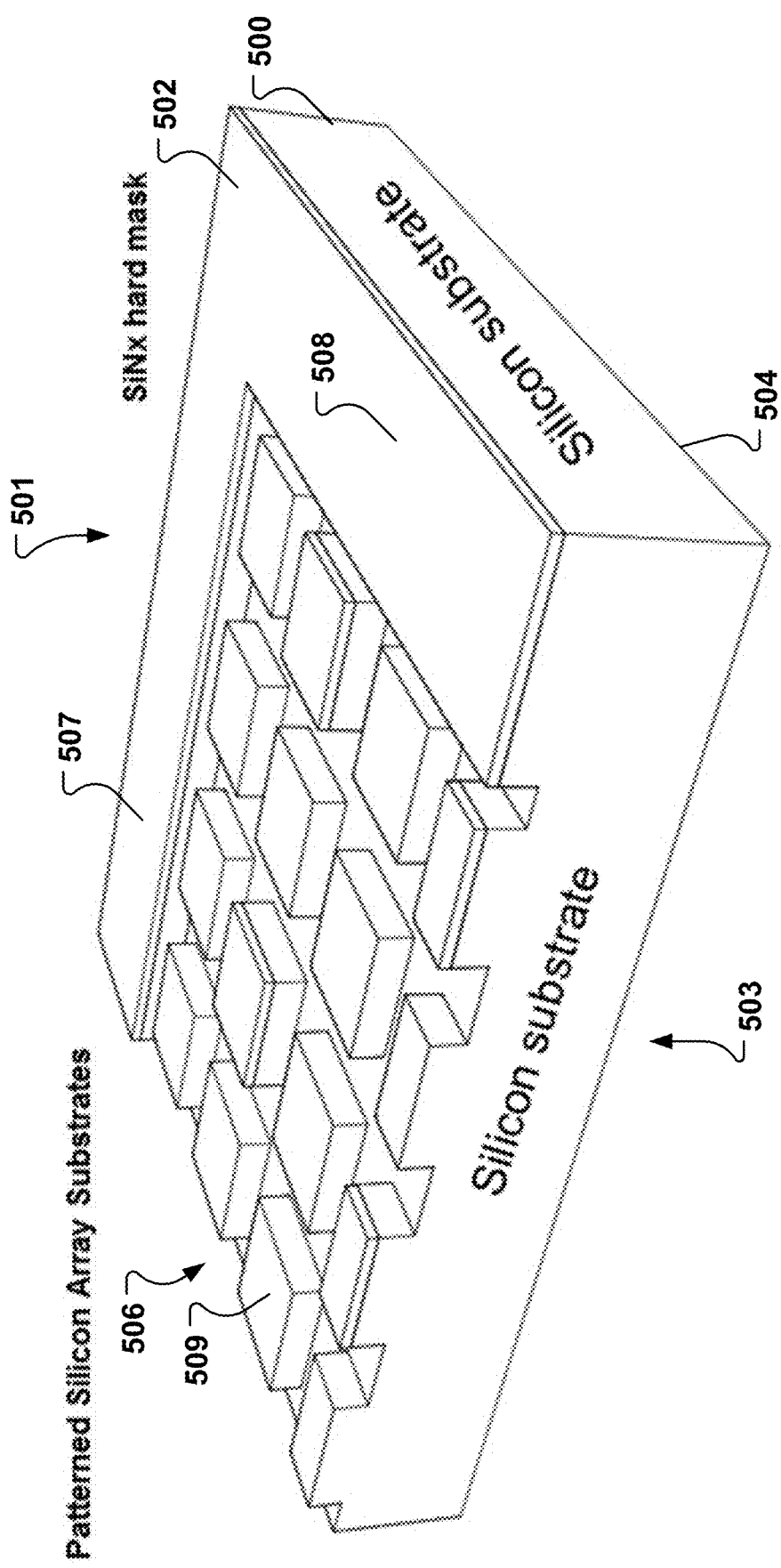
FIGS. 5A-5J are perspective views at different steps of forming the integrated LED display system of FIGS. 4A-4B.

In some cases, the patterning of the silicon substrate occurs in an area 506 for forming an array of LED pixels like the LED pixels 404 of FIGS. 4A-4B, while edges 507 and 508 of the silicon substrate to form data drivers and scanning drivers remain unchanged after depositing the hard mask layer. FIG. 5A illustrates the substrate 500 patterned by using the hard mask layer SiNx. The patterned silicon substrate includes an array of etched sub-substrates 509 arranged in columns and rows for forming the array of LED pixels.

In some implementations, photoresist is used as a protective material for patterning. The patterning of the silicon substrate 500 can include: 1) patterning a photoresist layer on the silicon substrate 500, e.g., by photolithography; 2) etching silicon with plasma. In some cases, edges (e.g., 507 and 508) of the silicon substrate for forming data drivers and scanning drivers can also be protected from etching; 3) removing the remaining photoresist layer from the silicon substrate.

Third, an array 512 of LEDs 510 are formed on the upper side 501 of the patterned silicon substrate. The LEDs 510 can be formed by depositing multiple layers on surfaces of the silicon substrate parallel to (111) crystalline plane. The multiple layers can be deposited by MOCVD, MBE, ALD, PVD, CVD, or any other suitable deposition methods in a vacuum chamber with a certain temperature. The multiple layers can include light-emitting layers, e.g., a quantum well layer, for emitting light with a specified wavelength. The quantum-well layer can include a uniform layer or a plurality of quantum wells. For example, a quantum-well layer can include a substantially uniform layer made of InN, GaN, InGaN, AlGaN, InAlN, or AlInGaN. A quantum-well layer can also include a multi-layer structure defining one or more quantum wells. A quantum well can for example be formed by an InGaN, an AlGaN, an InAlN, or an InCaAlN layer sandwiched in between two GaN layers. A quantum well can also be formed by an InCaM layer sandwiched in between GaN or AlGaN layers. The quantum-well layer can include one or a stack of such layered structure each defining a quantum well as described above.

Figure 5B:
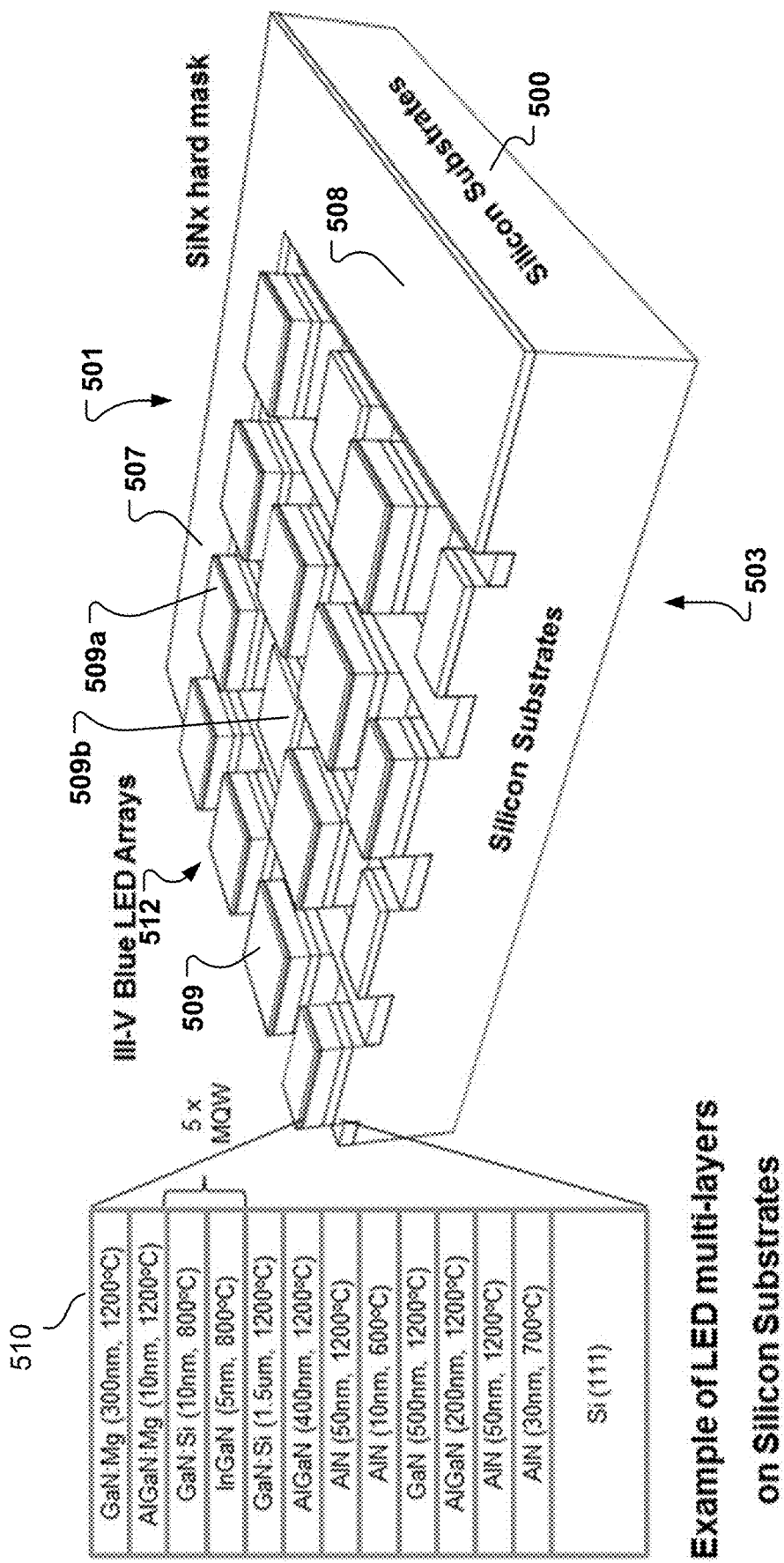

As an example illustrated in FIG. 5B, III-V blue light LEDs 510 are formed on the silicon (111) surfaces by using pairs of InGaN and GaN: Si as the quantum well (MQW) layer. The LEDs 510 can include one or more buffer layers deposited on the silicon (111) surface, one or more lower Group III-V compound layers on the buffer layers, one or more MQW layers on the lower Group III-V compound layers, and one or more upper Group III-V compound layers. In a particular example, the blue light LEDs are formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 20 nm-AlGaN:Mg layer under 1200° C., and 300 nm-GaN:Mg layer under 1200° C.

In some implementations, the LEDs 510 are selectively formed on a number of etched sub-substrates 509*a*. The other etched sub-substrates 509*b* can be protected, e.g., by depositing a protective resist layer, from depositing the LED multiple layers and reserved for forming non-volatile memories for the LEDs, e.g., the pixel memory system 406 of FIGS. 4A-4B. Each sub-substrate 509*b* can be configured adjacent to three or four sub-substrates 509*a*. The etched sub-substrates 509*a* and 509*b* can be configured for forming LED pixels each with a minimized size or a specified size. Other areas on the silicon substrate, e.g., the edges 507 and 508, can also be protected from depositing the LED multiple layers and reserved for forming data drivers, scanning drivers, and bit lines and word lines. FIG. 5B shows the substrate 500 with the array 512 of LEDs 510 formed in selective areas 509*a*.

Figure 5C:
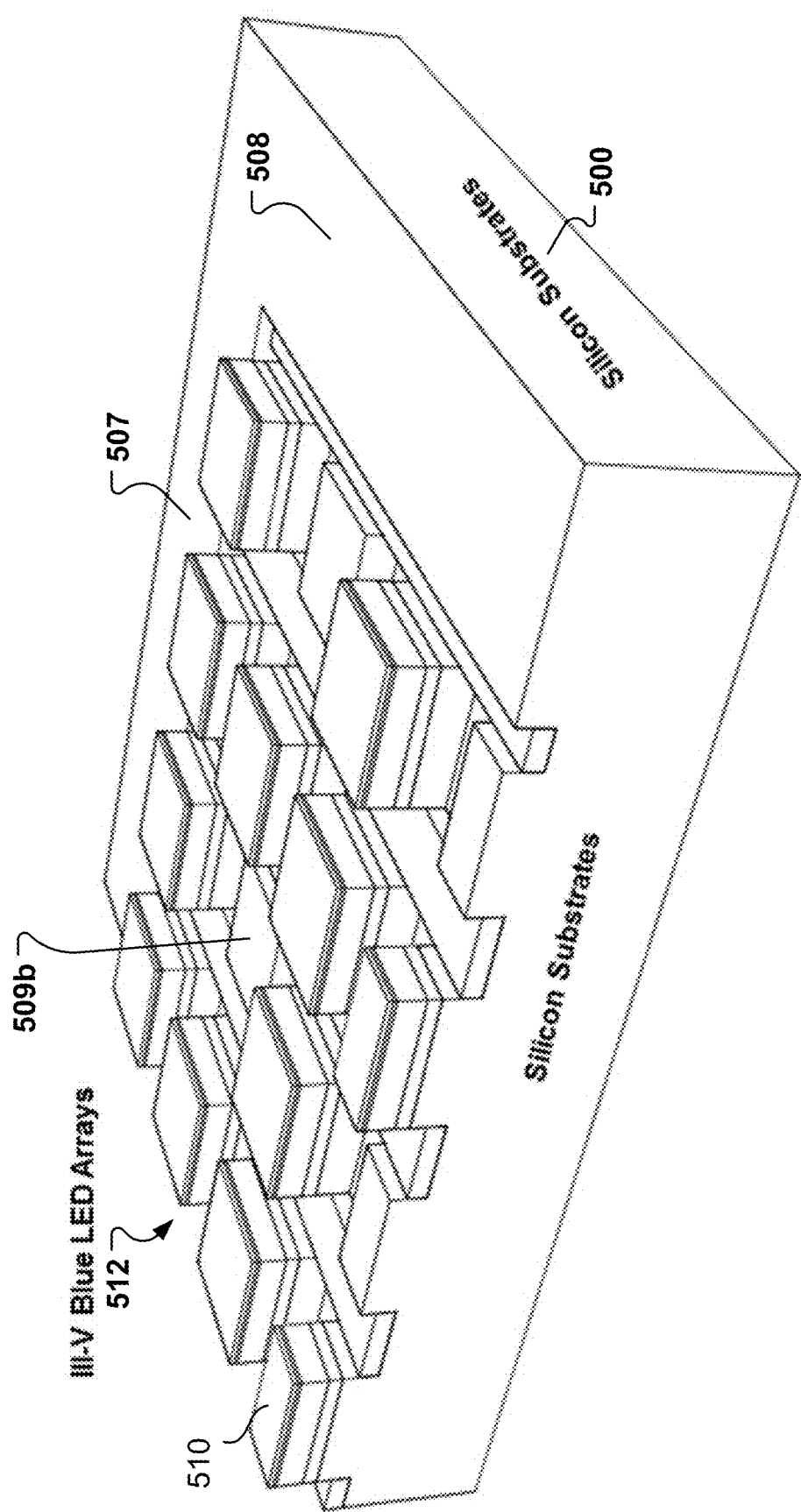

In some implementations, the areas for forming other components like non-volatile memories, data drivers, scanning drivers, bit lines, and/or word lines can be selectively opened, e.g., by etching, and/or cleaned to prepare for forming the other components. As illustrated in FIG. 5C, the areas including the edges 507 and 508 and the sub-substrates 509*b* are selectively etched and cleaned. The previously remained hard mask layer SiNx can also be removed.

Figure 5D:
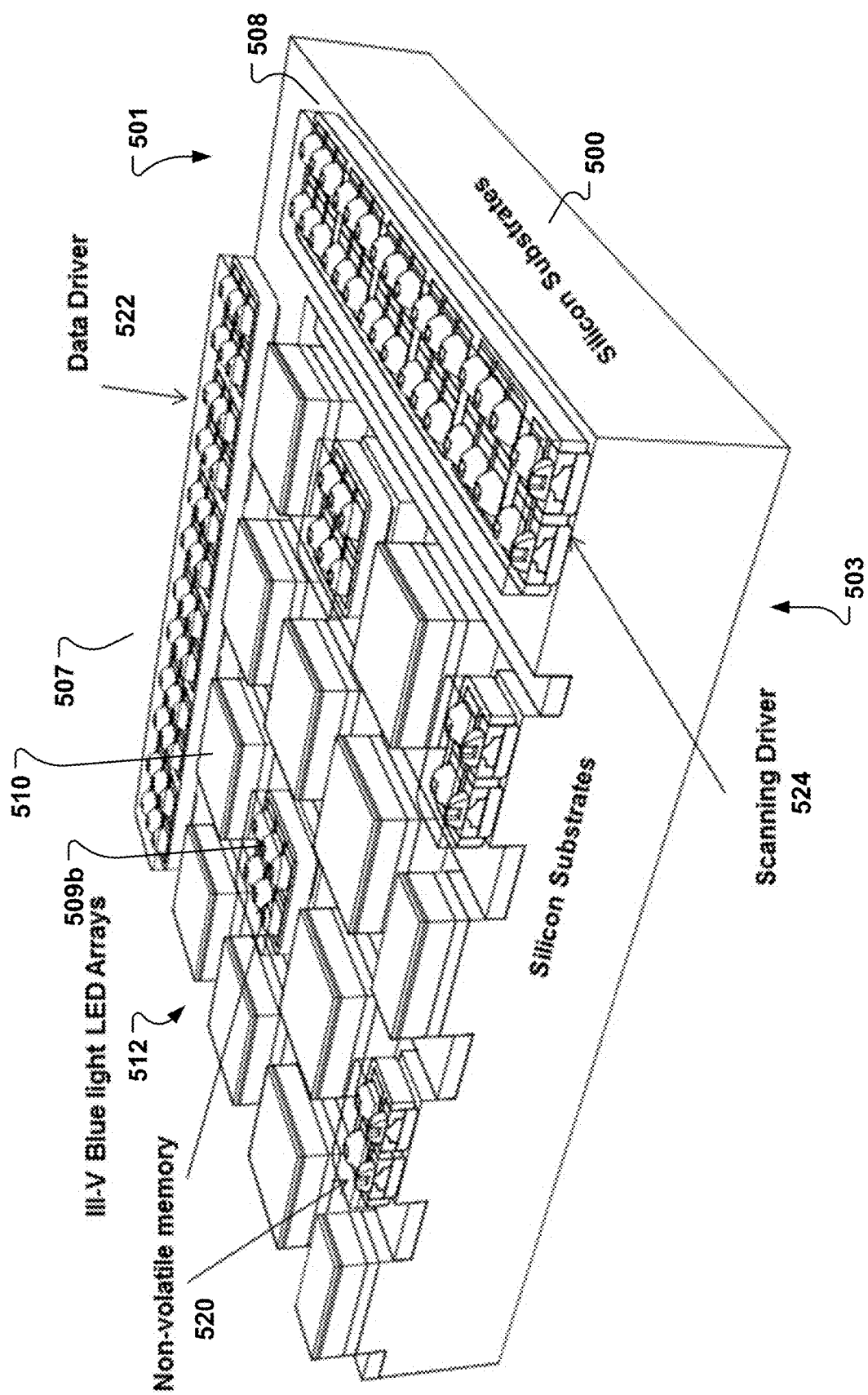

Fourth, as illustrated in FIG. 5D, non-volatile memories 520 are formed on the upper side 501 of the silicon substrate. The non-volatile memories 520 can be formed on the etched sub-substrates 509*b*. As noted above in FIG. 4A, each non-volatile memory can be coupled to a respective LED or multiple LEDs to form an active-matrix LED pixel. A plurality of data drivers 522 and a plurality of scanning drivers 524 can be also formed on the upper side 501 of the silicon substrate, e.g., on the edges 507 and 508. In some implementations, as illustrated in FIG. 1B, the data drivers 522 can also be divided into two parts formed on the edge 507 and another parallel edge on the upper side 501 for driving odd rows of bit lines and even rows of bit lines, respectively.

Figure 5E:
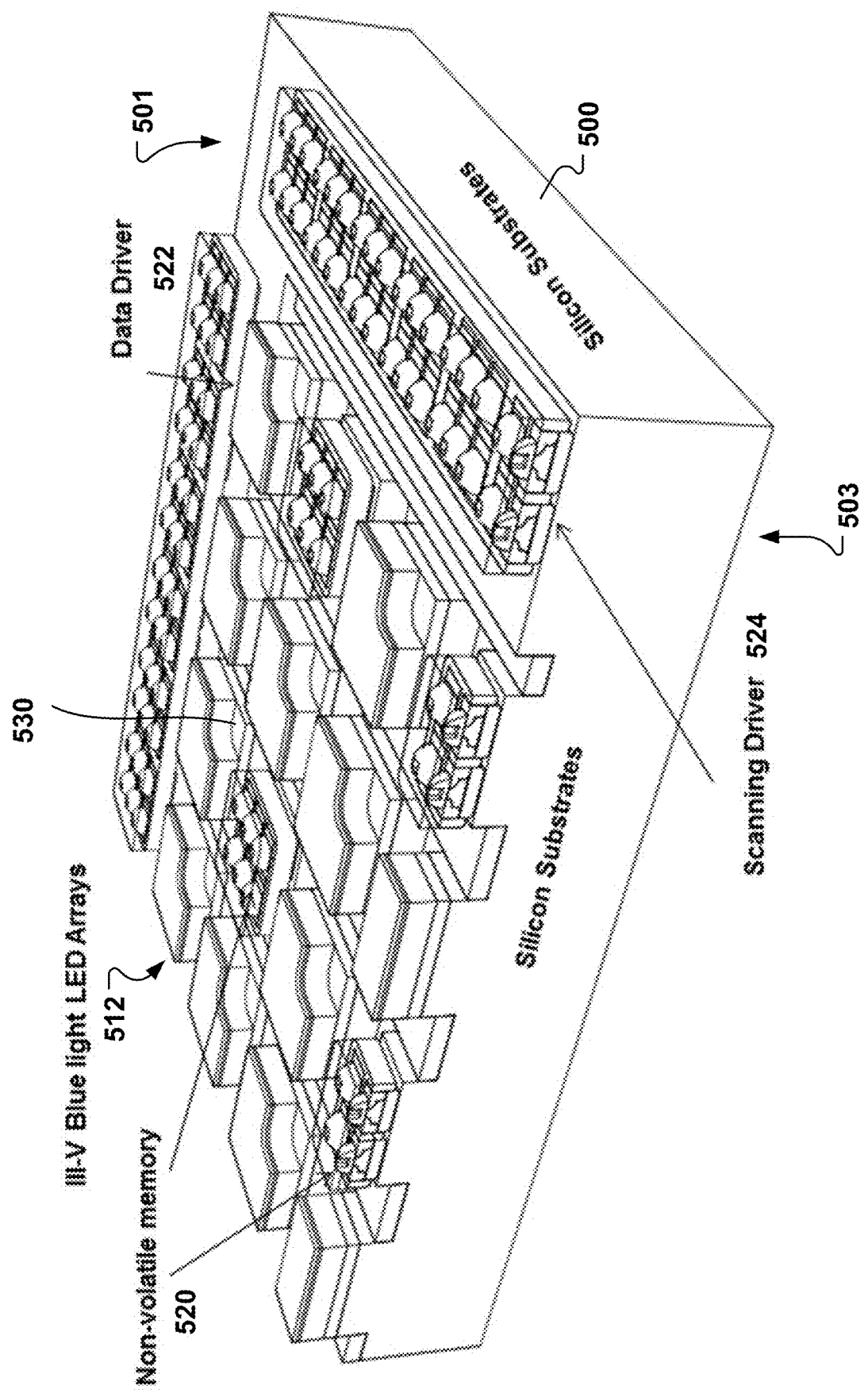

Fifth, as illustrated in FIG. 5E, the LEDs 510 are selectively etched to open for depositing ohmic Ohmic contacts 530 of the LEDs 510. For example, the LEDs 510 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the ohmic contacts 530. A top layer of the LEDs 510 can be an n-doped Group III-V compound layer, and a p-type electrode (anode), e.g., a passivation ITO layer, can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 530; the top layer of the LEDs can be p-doped Group III-V compound layer, e.g., p-GaN, and a n-type electrode (cathode) can be formed on the p-doped Group III-V compound layer.

Figure 5F:
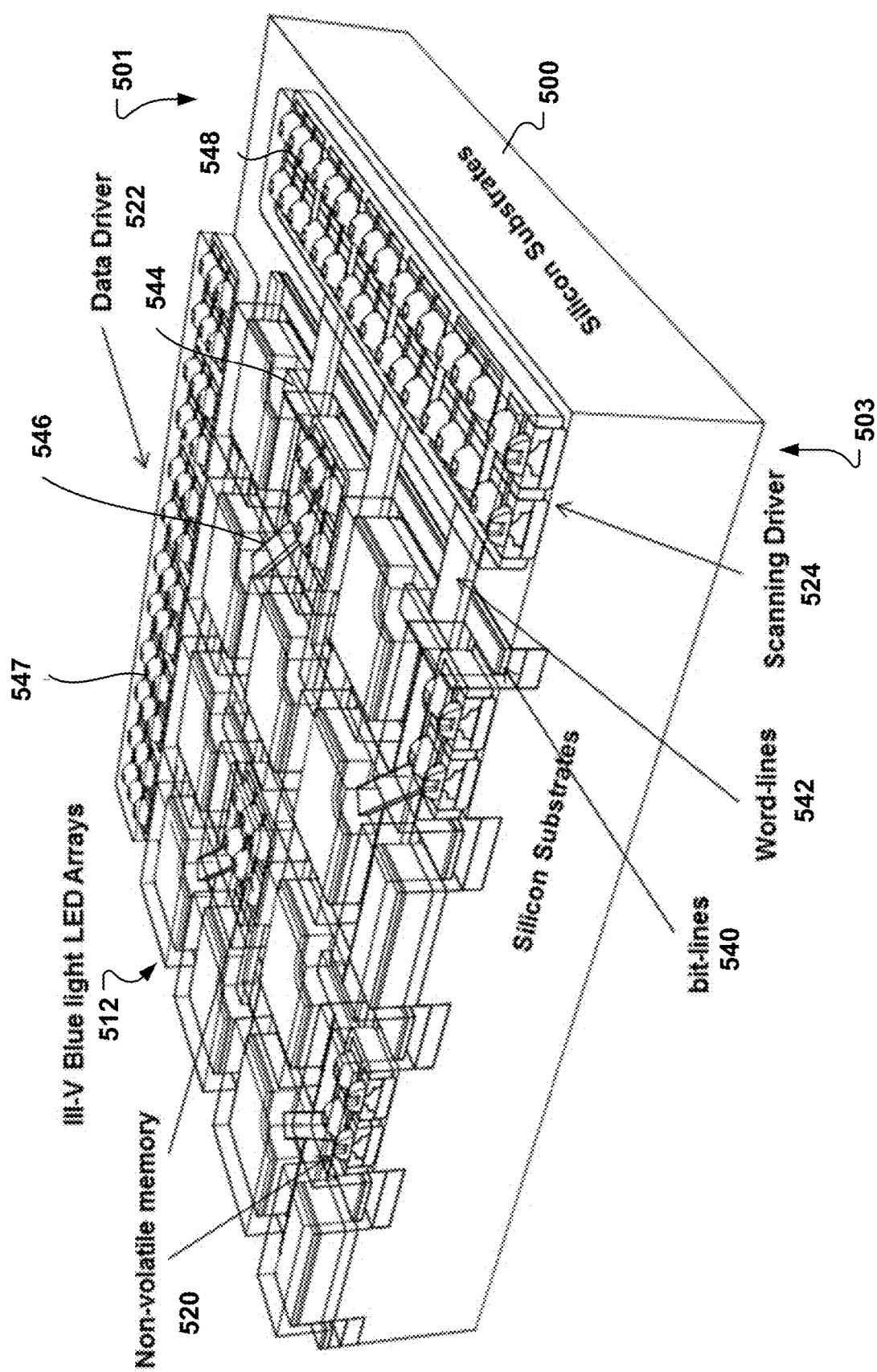

Sixth, as illustrated in FIG. 5F, bit lines 540 and word lines 542 are formed, e.g., in multiple rows and columns, respectively. The bit lines 540 and word lines 542 are conductively connected to the data drivers 522 and the scanning drivers 524, respectively. Particularly, each data driver 522 is connected to a respective row bit line 540, and each scanning driver 524 is connected to a respective column word line 542.

Interconnects 544 between the Ohmic contacts 530 of the LEDs 510 and the non-volatile memories 520 and interconnects 546 between the non-volatile memories 520 and the bit lines 540 and the word lines 542 are also formed. In such a way, each LED 510 is conductively coupled to a non-volatile memory 520 that is further coupled to a corresponding data driver 522 through a corresponding bit line 540 and to a corresponding scanning driver 524 through a corresponding word line 542. Each data driver 522 can be connected to a row of non-volatile memories 520 (thus a row of corresponding LEDs 510) through a corresponding bit line 540. Each scanning driver 524 can be connected to a column of non-volatile memories 520 (thus a column of corresponding LEDs 510) through a corresponding word line 542. In some examples, interconnects 547 among data drivers 522 and/or interconnects 548 among scanning drivers 544 are also formed.

Figure 5G:
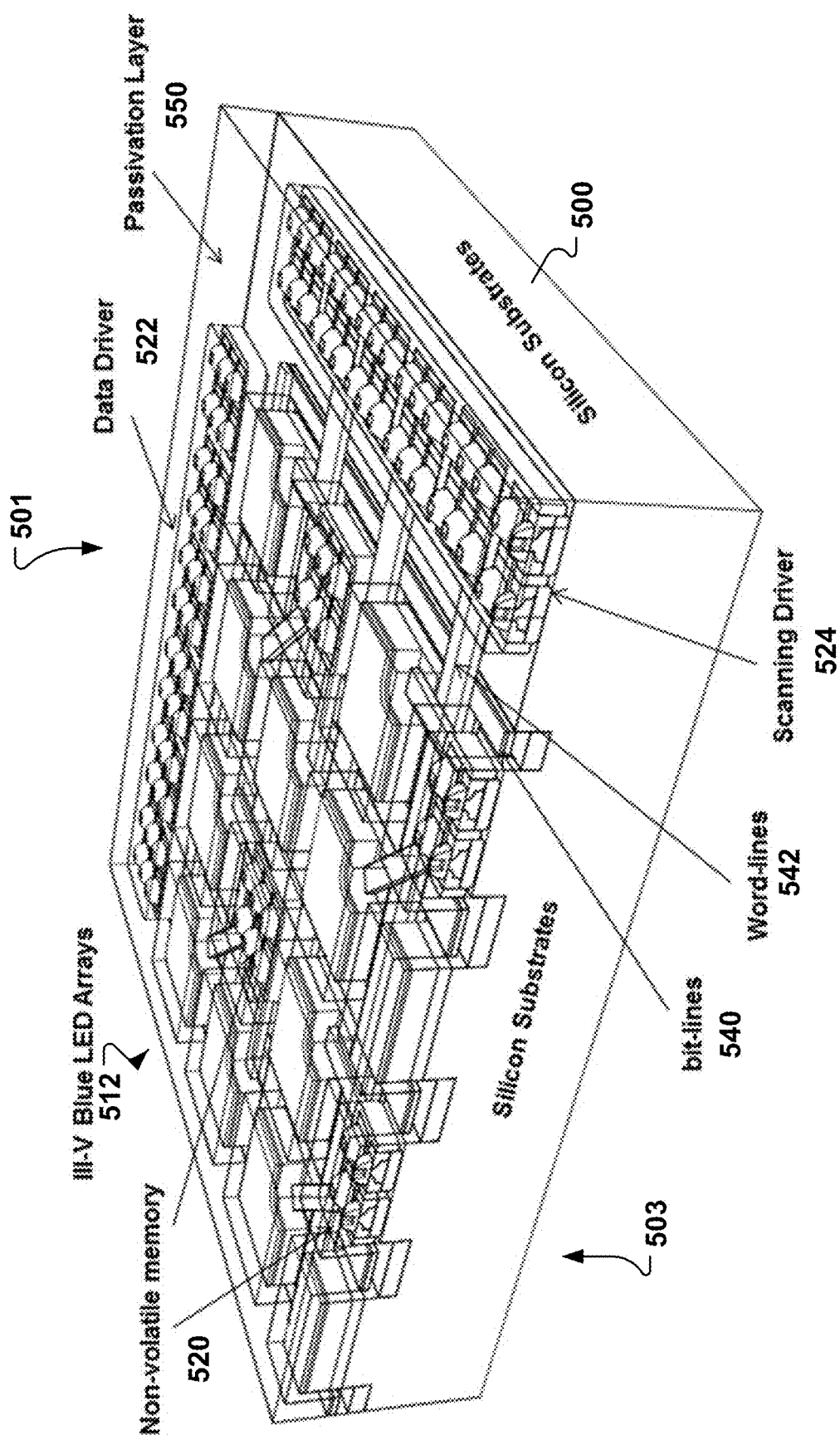

Seventh, as illustrated in FIG. 5G, a passivation layer 550, e.g., a transparent SiOx layer or ITO layer, is formed to cover surfaces of the silicon substrate, including the LED arrays 512. The passivation layer 550 can be deposited on the surfaces by MOCVD, ALD, PVD, CVD, or any suitable deposition methods. The passivation layer 550 can act as anodes or cathodes for the LEDs under the passivation layer 550. The passivation layer 550 can be connected to the ground or a supply voltage.

All the above steps are performed on the upper side 501 of the silicon substrate 500. In the following eighth step, the silicon substrate 500 is flipped from the upper side 501 to the lower side 503, and a plurality of deep trenches (or through-holes) are formed from the lower side 503, through the substrate 500, and towards the upper side 501. The deep trenches can be formed by deep etching, e.g., deep RIE or plasma etch. Then conductive electrodes are formed inside the deep trenches to form interconnects 560. In some cases, inner surfaces of the deep trenches are insulated and then metals are filled inside the deep trenches to form the conductive electrodes.

Figure 5H:
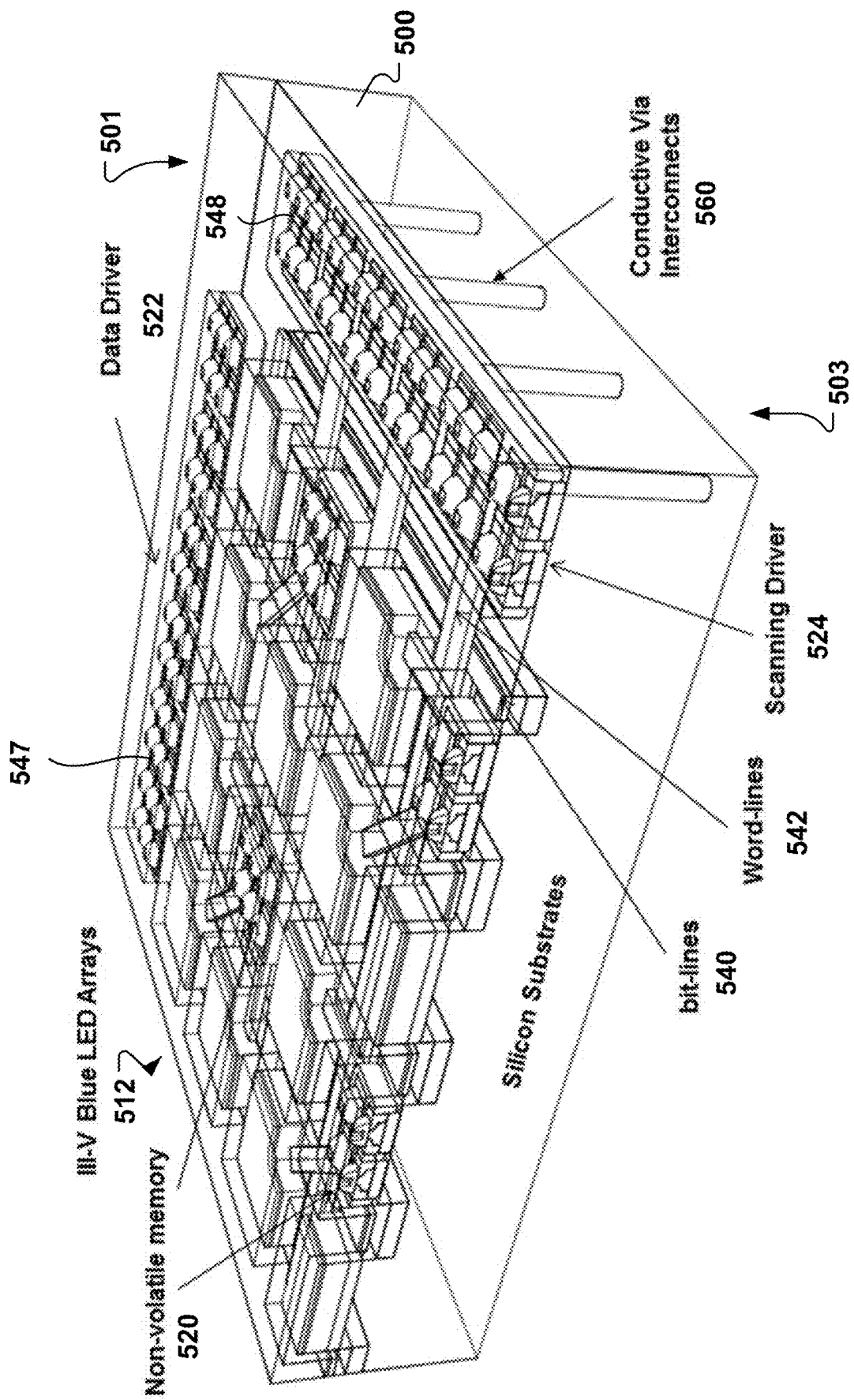

The interconnects 560 are configured to connect the plurality of data drivers 522 and the plurality of scanning drivers 524 to control electronics to be formed on the lower side 503. As the plurality of data drivers 522 can be connected together by interconnects 547 and the plurality of scanning drivers 524 can be connected together by interconnects 548, the number of interconnects 560 can be smaller than a sum of the number of data drivers 522 and the number of scanning drivers 524. As illustrated in FIG. 5H, the interconnects 560 can be distributed, e.g., evenly, among the scanning drivers 524 and the data drivers 522.

Figure 5I:
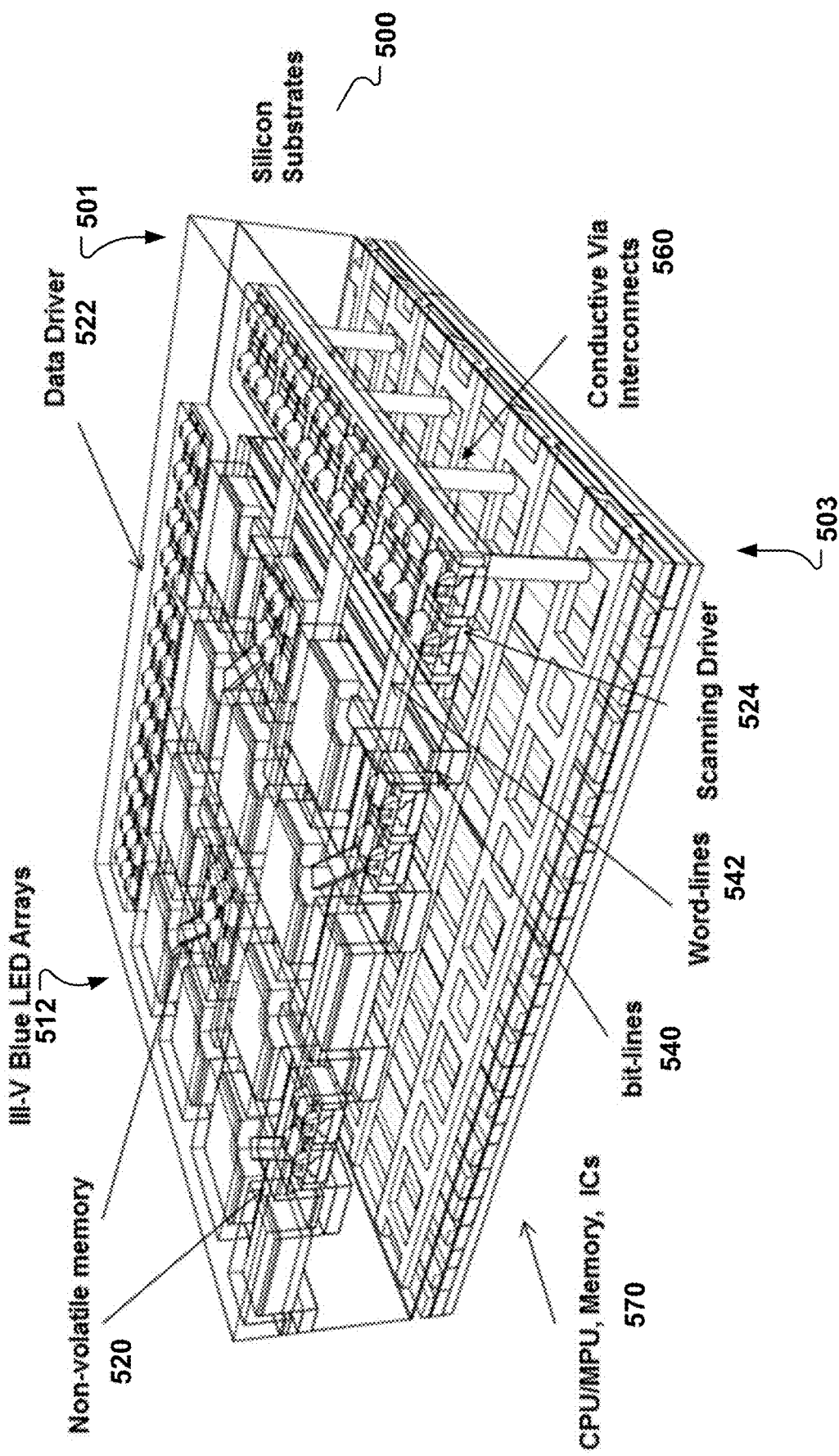

Ninth, as illustrated in FIG. 5I, control electronics 570 is formed on the bottom surface 504 of the lower side 503 of the silicon substrate 500. The control electronics 570 can be the control electronics 420 of FIGS. 4A-4B. In some implementations, the control electronics 570 has CPU/MPU, memories, and ICs including amplifiers, ADCs (analog-to-digital converters), DACs (digital-to-analog converters), controllers, and/or other ICs. Components in the control electronics 570 can be connected to each other, e.g., via internal bus. The control electronics 570 is coupled to the data drivers 522 and the scanning drivers 524 through the conductive interconnects 560.

Tenth, the silicon substrate 500 is flipped back from the lower side 503 to the upper side 501. Secondary color LEDs, e.g., red color LEDs 592 and green color LEDs 594, can be formed based on the previously-formed LEDs 510, e.g., blue color LED 510. The different color LEDs can form a multi-color LED pixel 590, e.g., the LED pixel 404 of FIGS. 4A-4B.

Secondary color LEDs can be formed on surface of the LEDs 510 by using different color phosphor materials or different size quantum-dot (QD) materials. For example, potassium fluorosilicate (PFS)/$K_2SiF_6$ (KSF) phosphors can be used to make red color LEDs with an emission wavelength of about 630 nm. Aluminate, or silicate, or green garnet (GNYAG) phosphors can be used to make green color LEDs with an emission wavelength of about 530 nm. Cerium(III)-doped YAG phosphors can be used to make white color LEDs.

In some implementations, an array of the multi-color LED pixels 590 is formed by the following processes: 1) patterning using photoresist for specific color LEDs, e.g., red LEDs 592; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays 594, but with another specific color phosphor films or another specific size QD thin-films, e.g., green phosphor films or green QD thin-films. In a particular example, a white LED is also formed to be included in each pixel to increase a sharpness of displayed images/pictures.

Figure 5J:
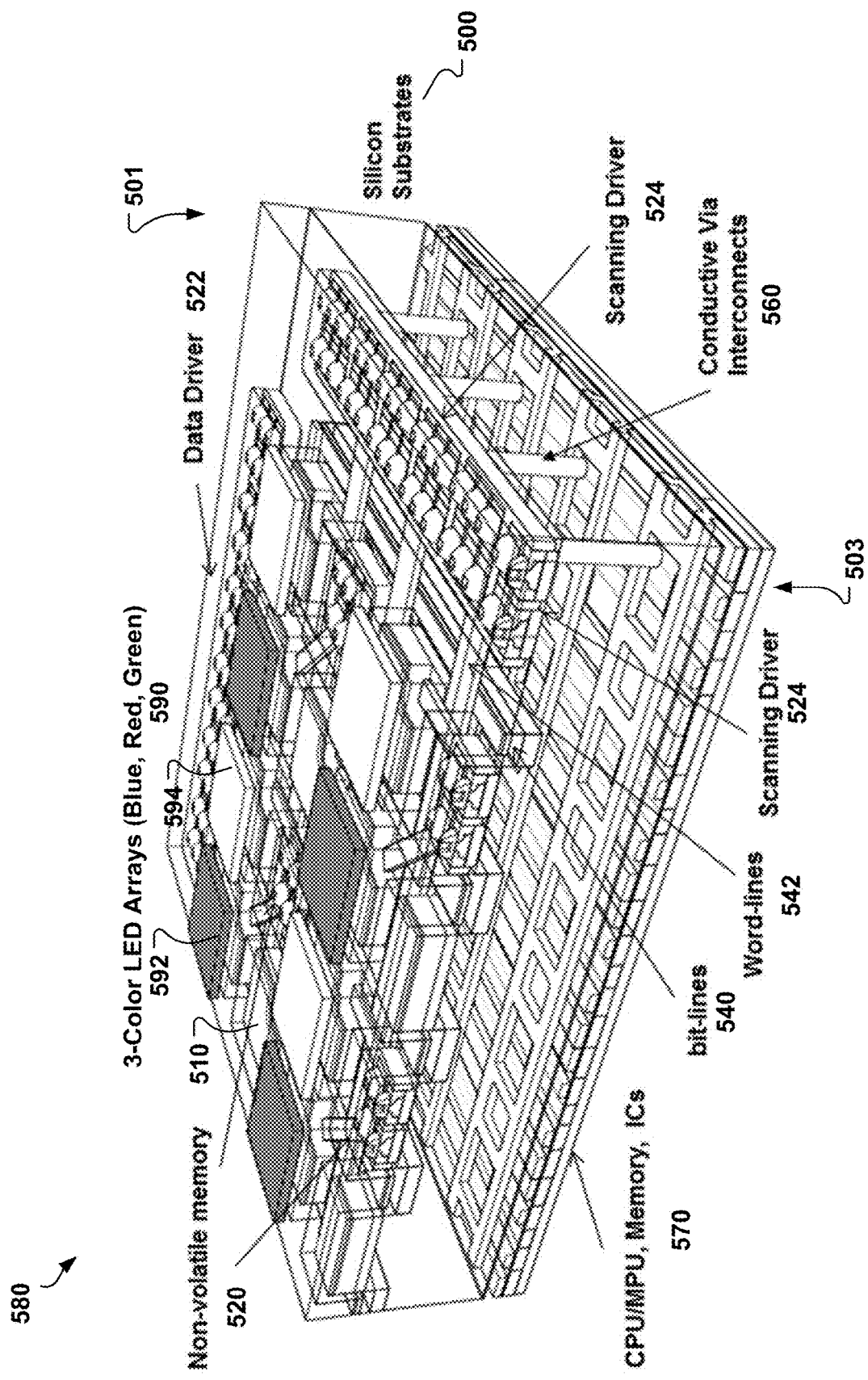

FIG. 5J shows the formed integrated LED display system 580, which can be the LED display system 400 of FIGS. 4A-4B. In the LED display system 580, blue LEDs 510 are first formed using Group III-V compound layers, e.g., In(0.3)Ga(0.7)N layer, as quantum well layers. Then other color LEDs, e.g., red LEDs, green LEDs, or white LEDs, are formed by depositing corresponding color phosphor films or corresponding size QD thin-films on the blue LEDs.

In some other implementations, red LEDs are first formed using Group III-V compound layers, e.g., InN layer, as quantum well layers. Then other color LEDs, e.g., blue LEDs, green LEDs, or white LEDs, are formed by depositing corresponding color phosphor films or QD thin-films on the red LEDs. In some other implementations, green LEDs are first formed using Group III-V compound layers, e.g., In(0.5)Ga(0.5)N layer, as quantum well layers. Then other color LEDs, e.g., blue LEDs, red LEDs, or white LEDs, are formed by depositing corresponding color phosphor films or QD thin-films on the red LEDs.

In some implementations, instead of using color phosphor films or QD thin-films on one primary color LEDs to generate the other two or more secondary color LEDs, all the color LEDs, e.g., blue LEDs, red LEDs, and green LEDs, can be formed using Group III-V compound layers as quantum well layers. For example, after the second step where the silicon substrate 500 is patterned, blue LED arrays can be first selectively formed on a first plurality of sub-substrates 509a by using Group III-V compound layers, e.g., In(0.3)Ga(0.7)N layer, as quantum well layers; then red LED arrays can be selectively formed on a second plurality of sub-substrates 509a by using Group III-V compound layers, e.g., InN layer, as quantum well layers; and then green LED arrays can be selectively formed on a third plurality of sub-substrate 509a by using Group III-V compound layers, e.g., In(0.5)Ga(0.5)N layer, as quantum well layers. The formation of the three color LED arrays can be arranged in any desired order. Each LED pixel can include a blue LED, a red LED, and a green LED. The number of the first plurality of sub-substrates 509a is identical to the number of the second plurality of sub-substrates 509a and to the number of the third plurality of sub-substrates 509a.

After forming the multi-color LED pixel display 580 as illustrated in FIG. 5J, a protective layer can be further formed on surfaces of the array of LED pixels, including the LEDs 510, 592, and 594. The protective layer can be made of transparent material, e.g., glass or plastic, coated with a conductive material, e.g., indium tin oxide (ITO). The protective layer is coupled to non-volatile memories 520 in the LED pixels under the protective layer and forms, with the non-volatile memories 520a, a touch screen position sensor. The touch screen position sensor can use capacitive sensing. As noted above, a touch on the protective layer can be converted to a capacitance change which is detected by a touch screen detector/analyzer in the control electronics 570 through conductive connections between the non-volatile memories 520 and the data drivers 522/scanning drivers 524, and interconnects 560.

Figure 6A:
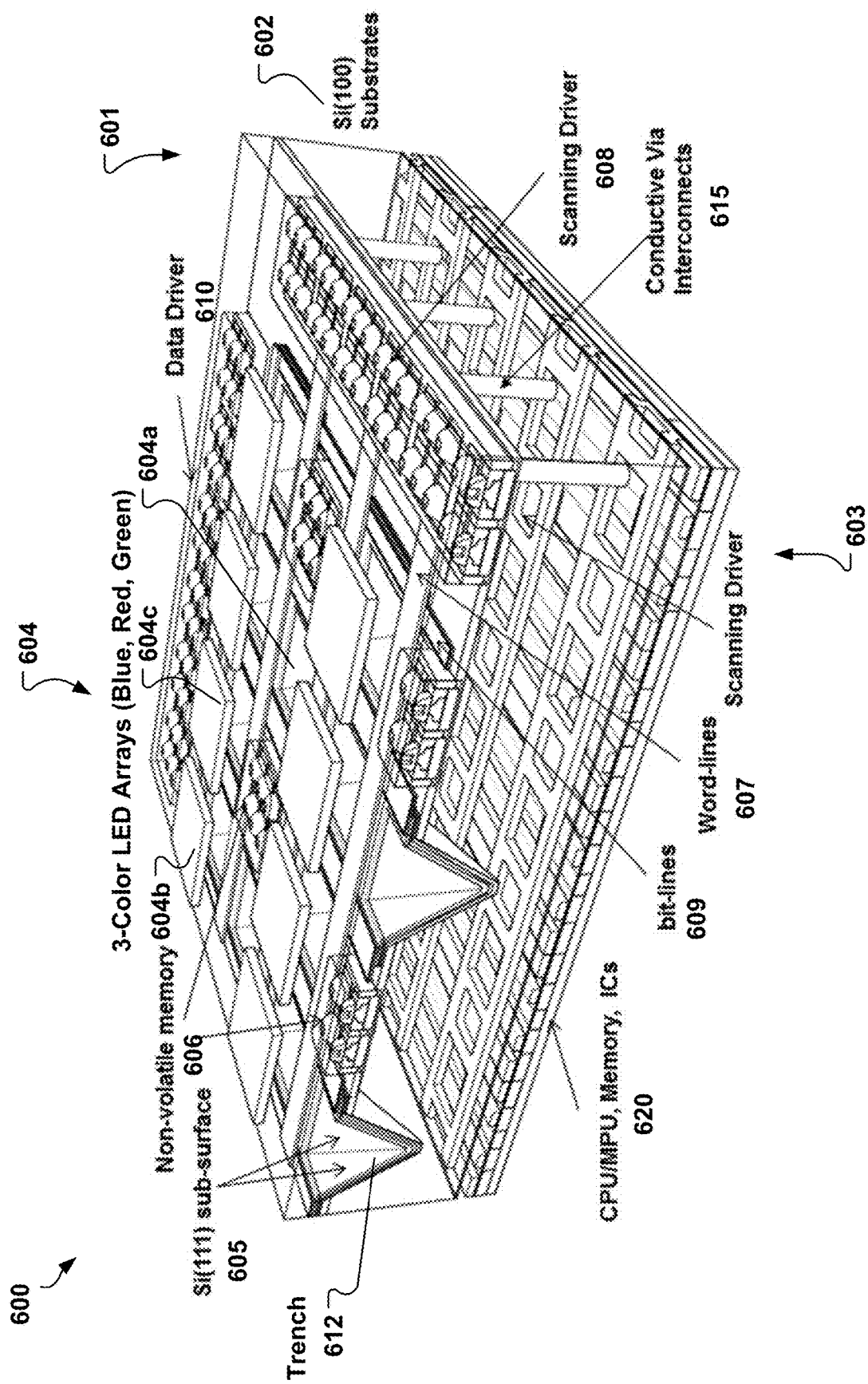
FIG. 6A is a perspective view of another example of an integrated LED display system with multi-color LED pixel arrays.
Figure 6B:
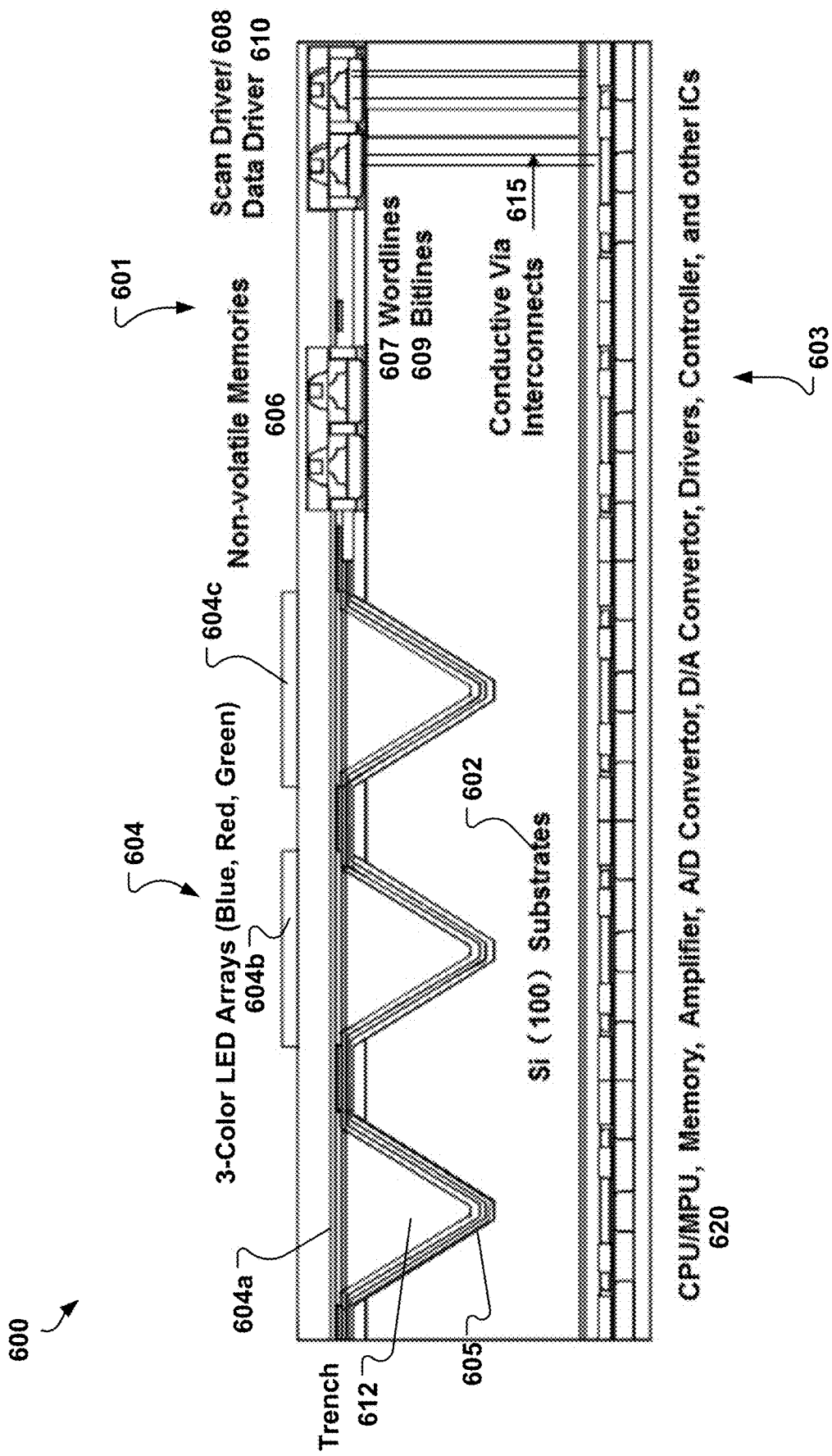
FIG. 6B is a cross-sectional view of the integrated LED display system of FIG. 6A.

FIGS. 6A-6B show another example integrated LED display system 600 with multi-color LED pixel arrays. Different from the integrated LED display system 400 described in FIGS. 4A-4B formed on a silicon semiconductor substrate with (111) orientation, the LED display system 600 is formed on a silicon semiconductor substrate 602 with (100) orientation. That is, the silicon substrate 602 has planar surfaces, e.g., an upper planar surface and a lower planar surface, parallel to (100) crystalline plane. LEDs in the LED display system 600 are formed on surfaces parallel to (111) crystalline plane, which is not parallel to the planar surfaces. As discussed in further details in FIG. 7A, the silicon (111) sub-surfaces 605 can be inner surfaces of trenches 612 formed by wet etching the silicon (100) substrate 602.

The silicon substrate 602 has a first side 601 and a second side 603. The first side 601 can be an upper side and the second side 603 can be a lower side opposite to the upper side. An array of LED pixels 604 is formed on the first side 601 and arranged in rows and columns. As an example, each LED pixel 604 in FIGS. 6A-6B includes a blue color LED 404a, a red color LED 404b, and a green color LED 404c. As discussed below in FIG. 7B, a blue color LED 404a can be directly formed on one or more silicon (111) sub-surfaces 605 of a trench 612 by depositing multiple semiconductor layers including at least one Group III-V compound layer. In a particular example, light emission surfaces of the blue LED 404a are at a 54.7° angle relative to the upper planar surface of the silicon substrate 602. For a same footprint on the upper surface, the sum of the areas of the emission surfaces on the light emission surfaces is approximately 1.73 times the area of the upper surface under the trench 612. As discussed in further details below in FIG. 7J, the red color LED 604b and/or the green color LED 604c can be formed based on light emission surfaces of a blue color LED 604a in a trench 612, e.g., by depositing different color phosphor material or different size quantum dots material in the trench 612.

The LED pixel 604 also includes a pixel memory system 606 positioned adjacent to the three LEDs. The pixel memory system 606 can be similar to the pixel memory system 406 of FIGS. 4A-4B. The pixel memory system 606 can include three non-volatile memories each coupled to one of the three LEDs, respectively. The three LEDs 604a, 604b, 604c and the pixel memory system 606 can be arranged in a rectangular shape or a square shape. Each LED can have a size of about 30 μm or less. Each LED pixel can have a size of about 100 μm or less. Note that each LED pixel 604 can also include four LEDs including a white color LED and associated non-volatile memory in the pixel memory system 606.

A plurality of scanning drivers 608 and a plurality of data drivers 610 are formed on the first side 601. For example, the scanning drivers 608 can be formed on a first edge of the substrate 602 along a first direction, e.g., perpendicular to multiple columns. The data drivers 610 can be formed on a second edge of the substrate 602 along a second direction, e.g., perpendicular to multiple rows. The second direction can be perpendicular to the first direction. In some implementations, one half of the data drivers 610 is formed on the second edge and configured to driver odd rows of LEDs, and another half of the data drivers is formed on a third edge parallel to the second edge and configured to driver even rows of LEDs.

Each LED 604a (or 604b or 604c) is coupled to a respective non-volatile memory in the pixel memory system 606. The respective non-volatile memory is coupled to a corresponding scanning driver 608 through at least one word line 607 and a corresponding data driver 610 through at least one bit line 609. Each scanning driver 608 can be coupled to a column of LEDs through one word line 607, and each data driver 610 can be coupled to a row of LEDs through one bit line 609. Thus, each LED can be individually or independently selected or controlled by a corresponding scanning driver 608 and a corresponding data driver 610. The word lines 607 and the bit lines 609 can be conductive metal lines and be formed on the first side 601 of the substrate 602.

Control electronics 620 is formed on the second side 603 of the substrate 602. The control electronics 620 can be similar to the control electronics 104 of FIG. 1A. In some implementations, the control electronics 620 has CPU/MPU, memories, and ICs including amplifiers, ADCs (analog-to-digital converters), DACs (digital-to-analog converters), controllers, and/or other ICs.

The plurality of scanning drivers 608 and the plurality of data drivers 610 are coupled to the control electronics 620 via conductive interconnects 615. Each scanning driver 608 or each data driver 610 can be individually coupled to (and controlled by) the control electronics 620, e.g., a controller or a processor, through at least one conductive interconnects 615. The conductive interconnects 615 penetrate through the substrate 602 from the first side 601 to the second side 603. The number of interconnects 615 can be smaller than a sum of the number of scanning drivers 608 and the number of data drivers 610.

FIGS. 7A-7J are perspective views at different steps of forming the integrated LED display system 600 of FIGS. 6A-6B. As noted above, the integrated LED display system 600 is formed on a silicon (100) substrate 700, e.g., a silicon (100) wafer. The silicon (100) substrate 700 has an upper side 701 including a top planar surface 702 and a lower side 703 including a bottom planar surface 704. The top planar surface 702 and the bottom planar surface 704 can be parallel to a (100) crystalline plane. The integrated LED display system 600 can be formed by the following steps, which are similar to the steps for forming the integrate LED display system 400, as illustrated in FIGS. 5A-5J except the second step for patterning the silicon substrate 700 to form trenches having silicon (111) sub-surfaces below the top planar surface 702.

First, the silicon (100) substrate 700 is prepared. The substrate 700 can be pre-treated, e.g., by cleaning the surfaces 702 and 704. In some cases, wet chemical treatment, e.g., an RCA clean procedure based on solutions, can be used to remove any organic or inorganic contaminations present on the surfaces 702 and 704. The solutions can include hydrogen peroxide, trichloroethylene, acetone, or methanol.

Figure 7A:
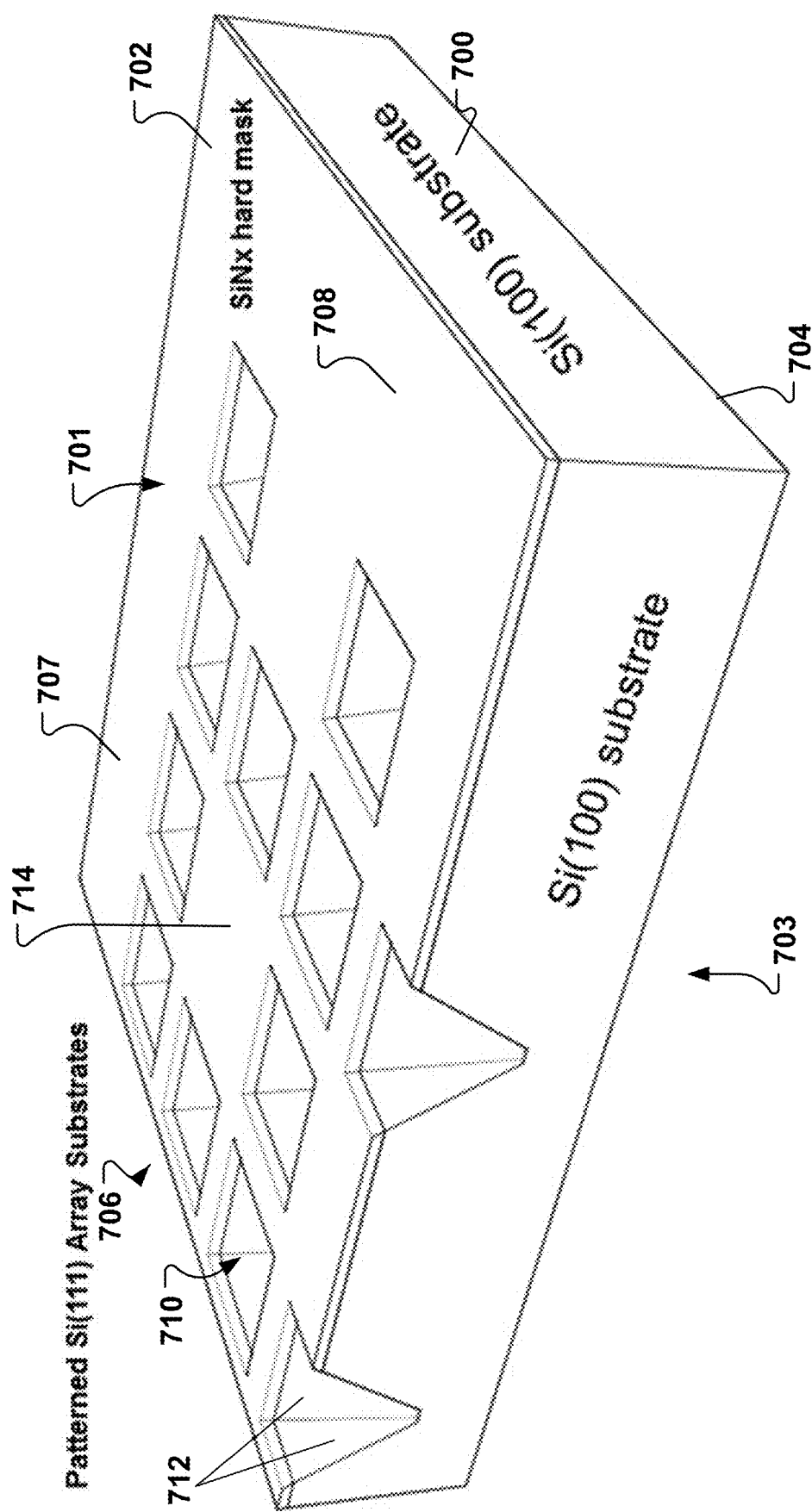
FIGS. 7A-7J are perspective views at different steps of forming the integrated LED display system of FIGS. 6A-6B.

Second, the silicon substrate 700 is patterned. The patterning of the silicon substrate 700 can include: 1) patterning a hard mask layer, e.g., SiNx, on the silicon substrate 700; 2) performing a crystal direction selective wet etch, e.g., using KOH acid solution, on the patterned top surface 702 of the silicon (100) substrate to form an array of trenches 710 having multiple Si (111) sub-surfaces 712. Each trench 710 can have four Si (111) titled sub-surfaces 712 below the top surface 702 and with an angle of 54.7° relative to the top surface 702. FIG. 7A illustrates the patterned Si (111) array substrates 706 in the trenches 710 that have multiple Si (111) sub-surfaces 712. In some cases, the patterning of the silicon substrate 700 includes removing the remaining hard mask layer and/or cleaning the silicon substrate 700.

Areas 714 are protected from etching and left for forming non-volatile memories in the LED pixels for adjacent LEDs to be formed in the trenches 710. In some cases, edges 707 and 708 of the silicon (100) substrate 700 to form data drivers and scanning drivers remain unchanged after depositing the hard mask layer.

Third, an array 716 of LEDs 718 is formed on the upper side 701 of the patterned silicon substrate. The LEDs 718 can be formed by depositing multiple layers on surfaces of the silicon (111) sub-surfaces 712 in the trenches 710. The LEDs 718 can be similar to the LEDs 510 of FIG. 5B. The multiple layers can be deposited by MOCVD, MBE, ALD, PVD, CVD, or any other suitable deposition methods in a vacuum chamber with a certain temperature. The multiple layers can include light-emitting layers, e.g., a quantum well layer including Group III-V compound, for emitting light with a specified wavelength.

Figure 7B:
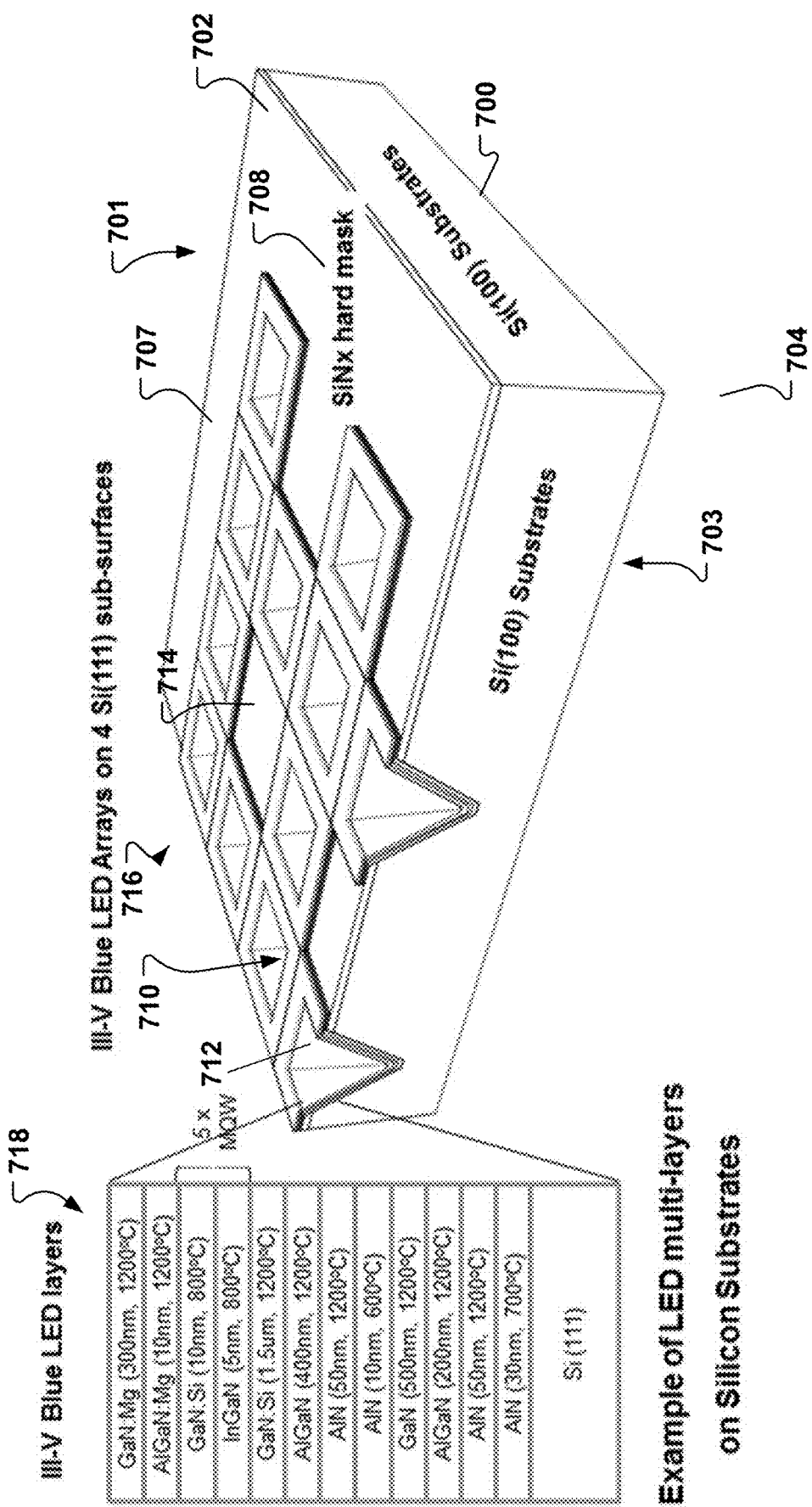

As an example illustrated in FIG. 7B, III-V blue light LEDs 718 are formed on the silicon (111) sub-surfaces 712 in the trenches 710 by using pairs of InGaN and GaN:Si as the quantum well (MQW) layer. The LEDs 718 can include one or more buffer layers deposited on the silicon (111) surfaces 712, one or more lower Group III-V compound layers on the buffer layers, one or more MQW layers on the lower Group III-V compound layers, and one or more upper Group III-V compound layers. In a particular example, the blue light LEDs are formed by sequentially epitaxially growing with MOCVD: 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

In some implementations, the LEDs 718 are selectively formed in the trenches 710. The areas 714 can be protected, e.g., by depositing a protective resist layer, from depositing the LED multiple layers and reserved for forming non-volatile memories for the LEDs. Each area 714 can be configured adjacent to three or four trenches 710. The trenches 710 and the areas 714 can be configured for forming LED pixels each with a minimized size or a specified size. Other areas on the silicon substrate, e.g., the edges 707 and 708, can also be protected from depositing the LED multiple layers and reserved for forming data drivers, scanning drivers, and bit lines and word lines. FIG. 7B shows the substrate 700 with the array 716 of LEDs 718 formed in the trenches 710.

Figure 7C:
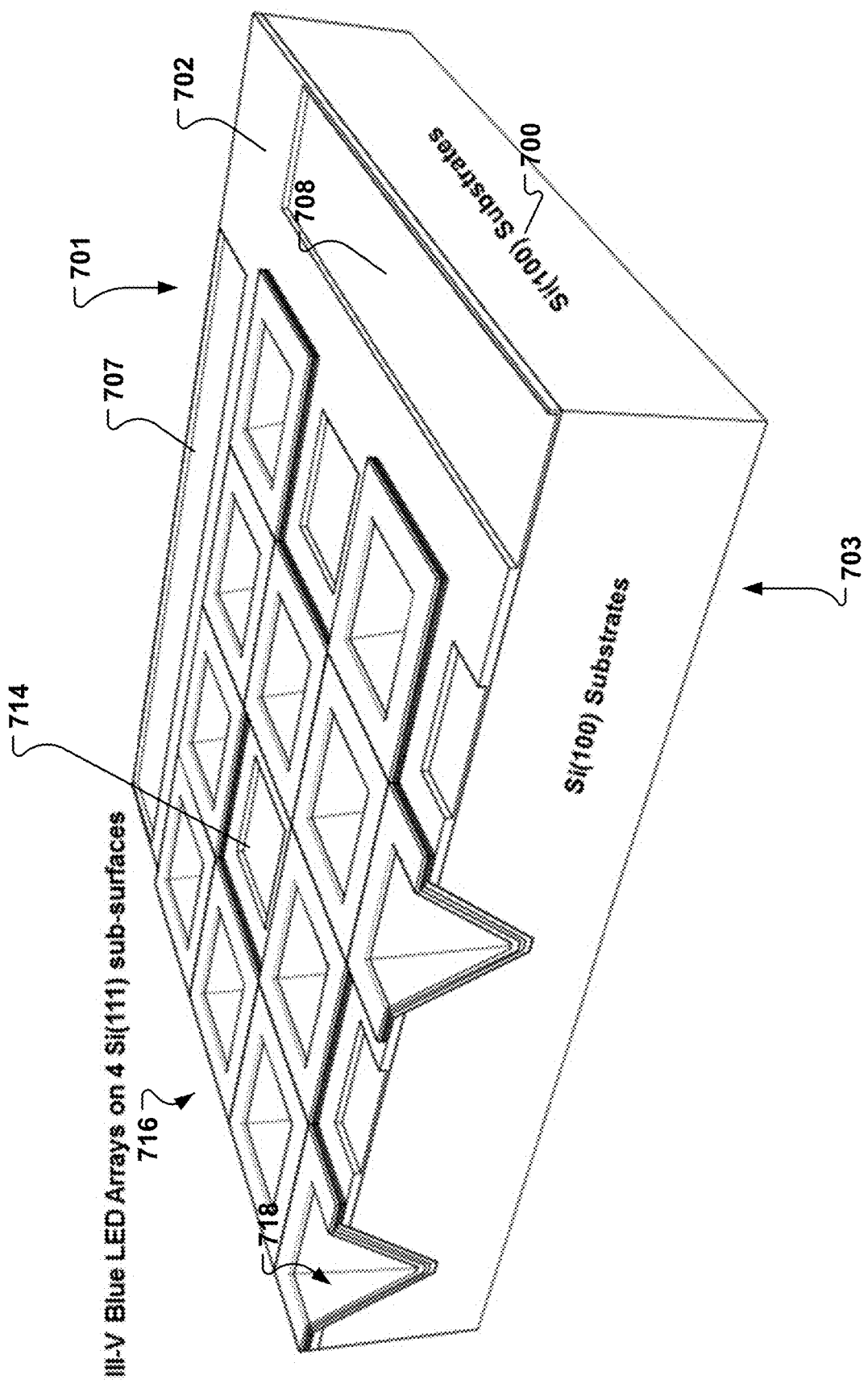

In some implementations, as illustrated in FIG. 7C, the silicon substrate 700 is selectively opened, e.g., by etching, and/or cleaned to prepare for forming the other components. For example, the areas including the edges 707 and 708 and the areas 714 and/or other areas for interconnects are selectively etched and cleaned. The previously remained hard mask layer, e.g., SiNx, can also be removed.

Figure 7D:
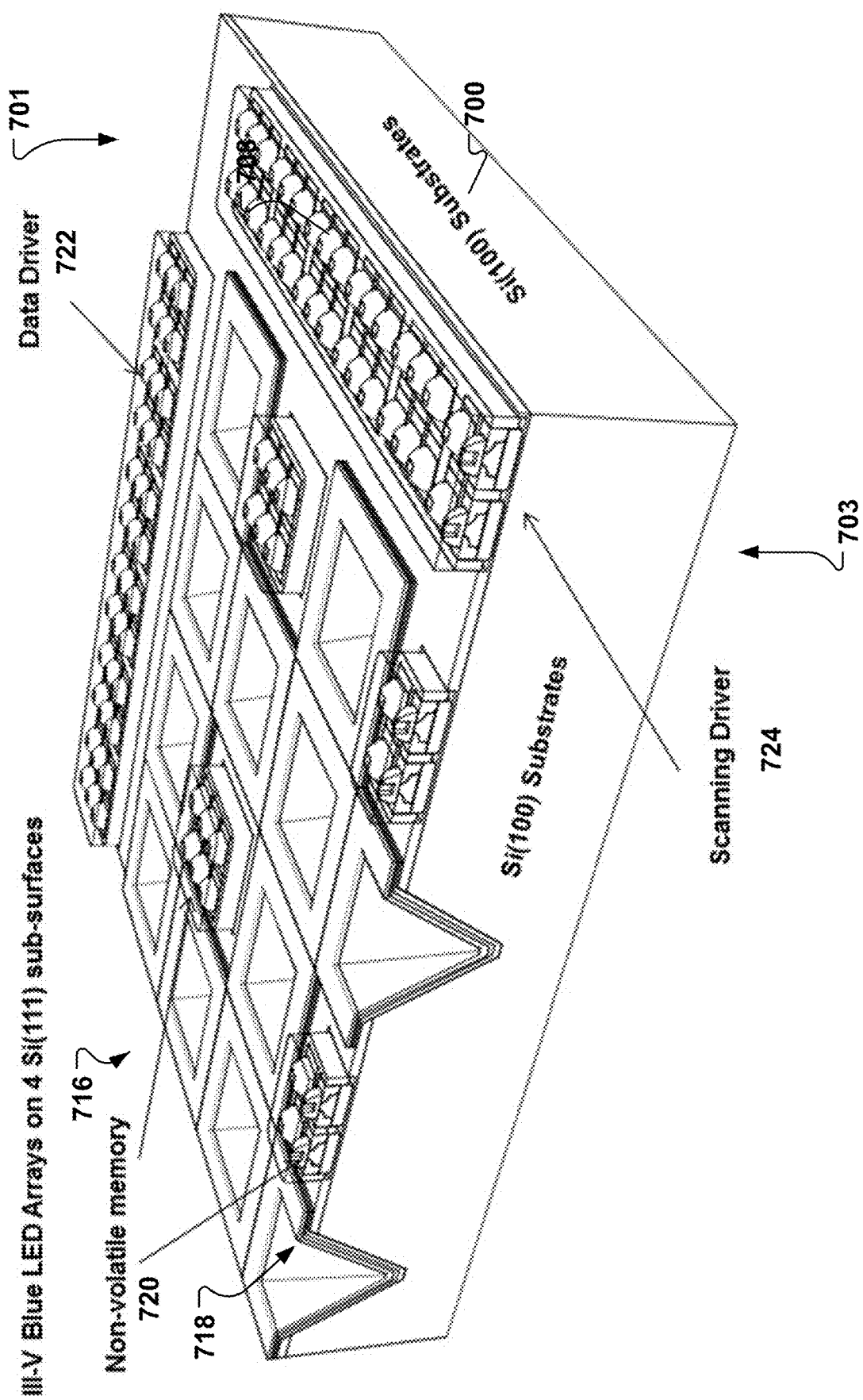

Fourth, as illustrated in FIG. 7D, non-volatile memories 720 are formed on the upper side 701 of the silicon substrate. The non-volatile memories 720 can be formed on the areas 714. As noted above in FIG. 6A, each non-volatile memory can be coupled to a respective LED or multiple LEDs to form an active-matrix LED pixel. A plurality of data drivers 722 and a plurality of scanning drivers 724 can be also formed on the upper side 701 of the silicon substrate, e.g., on the edges 707 and 708. In some implementations, as illustrated in FIG. 1B, the data drivers 722 can also be divided into two parts formed on the edge 707 and another parallel edge on the upper side 701 for driving odd rows of bit lines and even rows of bit lines, respectively.

Figure 7E:
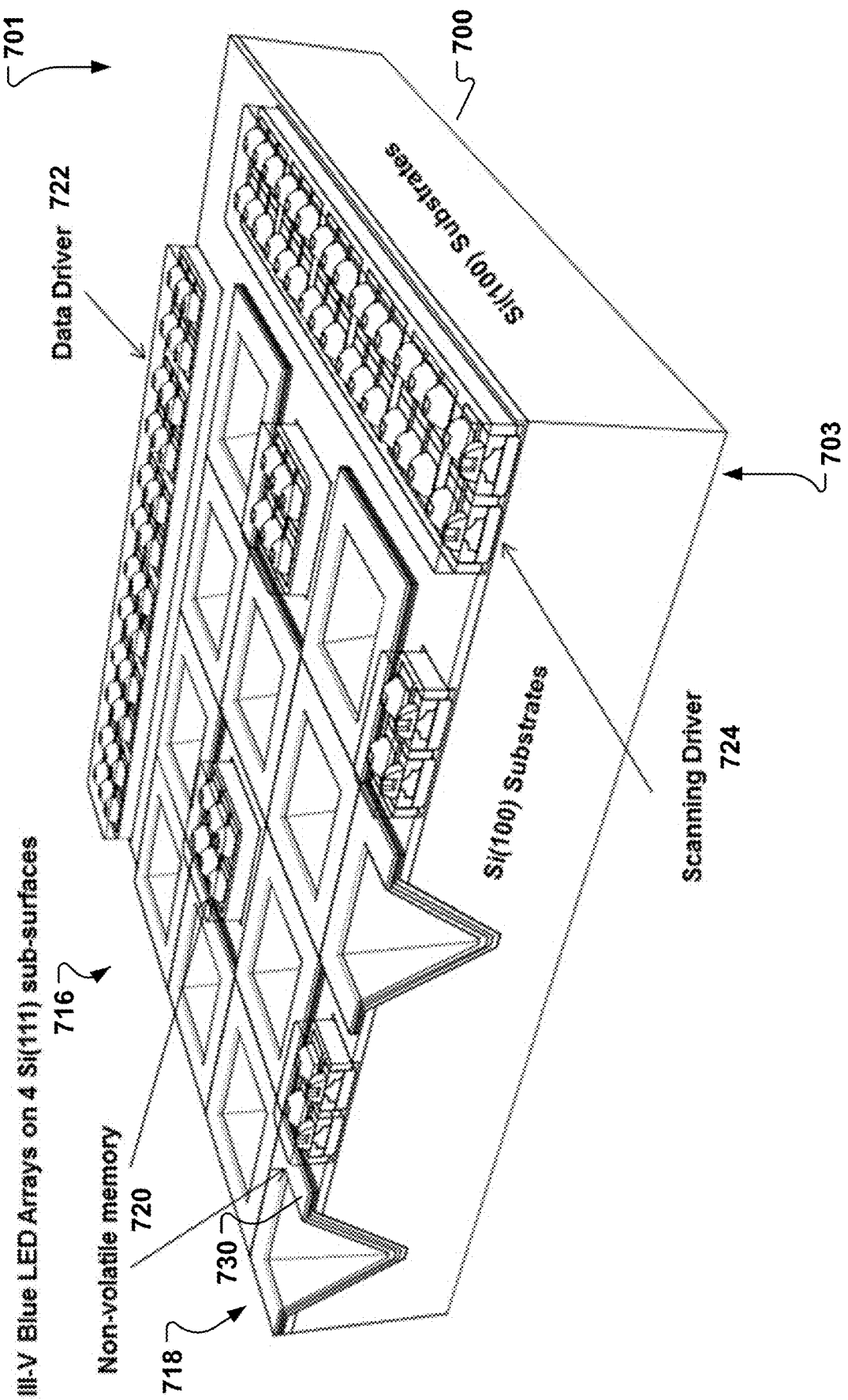

Fifth, as illustrated in FIG. 7E, the LEDs 718 formed on the titled Si (111) surfaces 712 in the trenches 710 are selectively etched to open for depositing Ohmic contacts 730 of the LEDs 718. For example, the LEDs 718 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the Ohmic contacts 730. A top layer of the LEDs 718 can be an n-doped Group III-V compound layer, and a p-type electrode (anode) can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 730; the top layer of the LEDs can be p-doped Group III-V compound layer, e.g., p-GaN, and a n-type electrode (cathode) can be formed on the p-doped Group III-V compound layer.

Figure 7F:
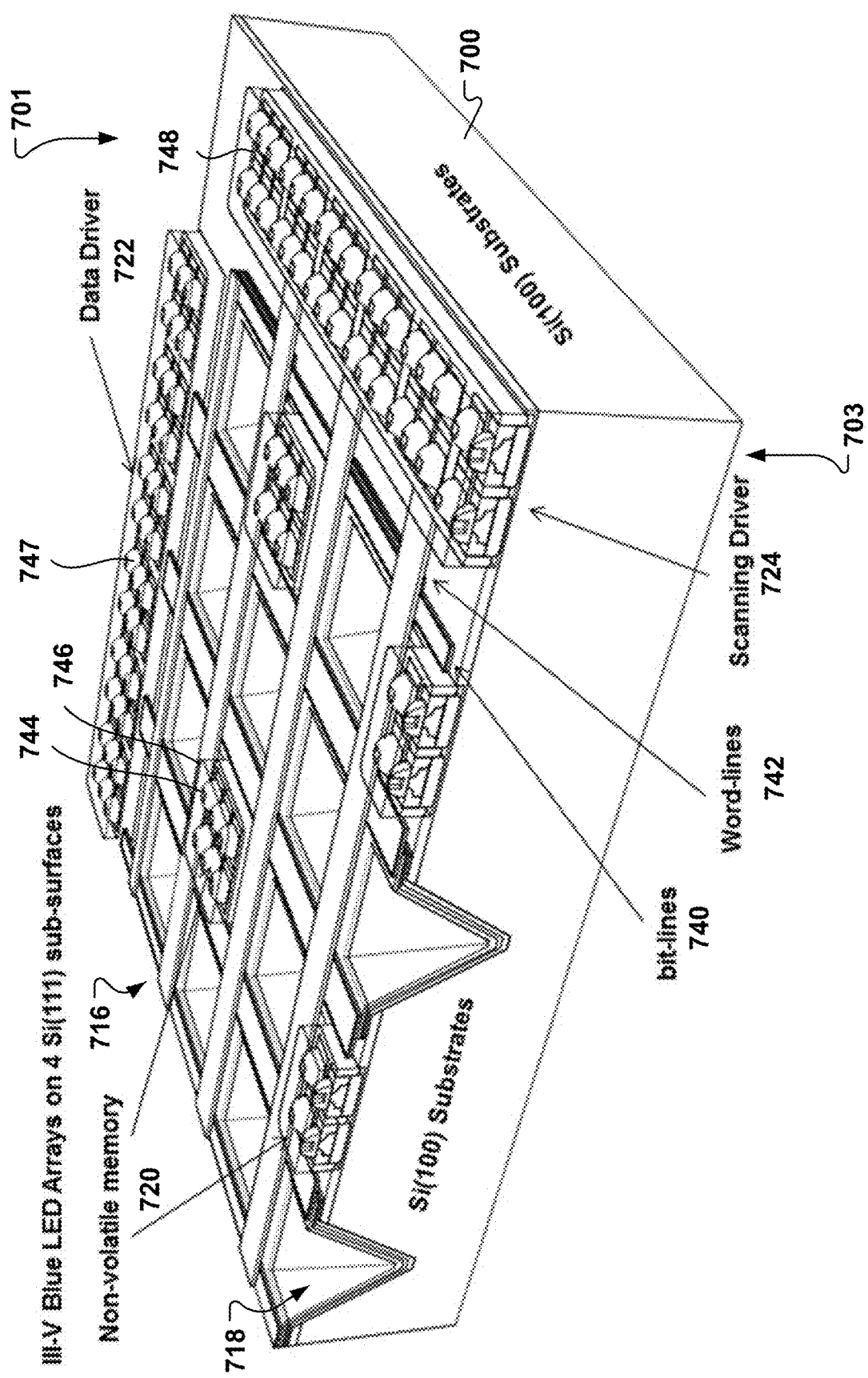

Sixth, as illustrated in FIG. 7F, bit lines 740 and word lines 742 are formed, e.g., in multiple rows and columns, respectively. The bit lines 740 and word lines 742 are conductively connected to the data drivers 722 and the scanning drivers 724, respectively. Particularly, each data driver 722 is connected to a respective row bit line 740, and each scanning driver 724 is connected to a respective column word line 742.

Interconnects 744 between the Ohmic contacts 730 of the LEDs 718 and the non-volatile memories 720 and interconnects 746 between the non-volatile memories 720 and the bit lines 740 and the word lines 742 are also formed. In such a way, each LED 718 is conductively coupled to a non-volatile memory 720 that is further coupled to a corresponding data driver 722 through a corresponding bit line 740 and to a corresponding scanning driver 724 through a corresponding word line 742. Each data driver 722 can be connected to a row of non-volatile memories 720 (thus a row of corresponding LEDs 718) through a corresponding bit line 740. Each scanning driver 724 can be connected to a column of non-volatile memories 720 (thus a column of corresponding LEDs 718) through a corresponding word line 742. In some examples, interconnects 747 among data drivers 722 and/or interconnects 748 among scanning drivers 744 are also formed.

Figure 7G:
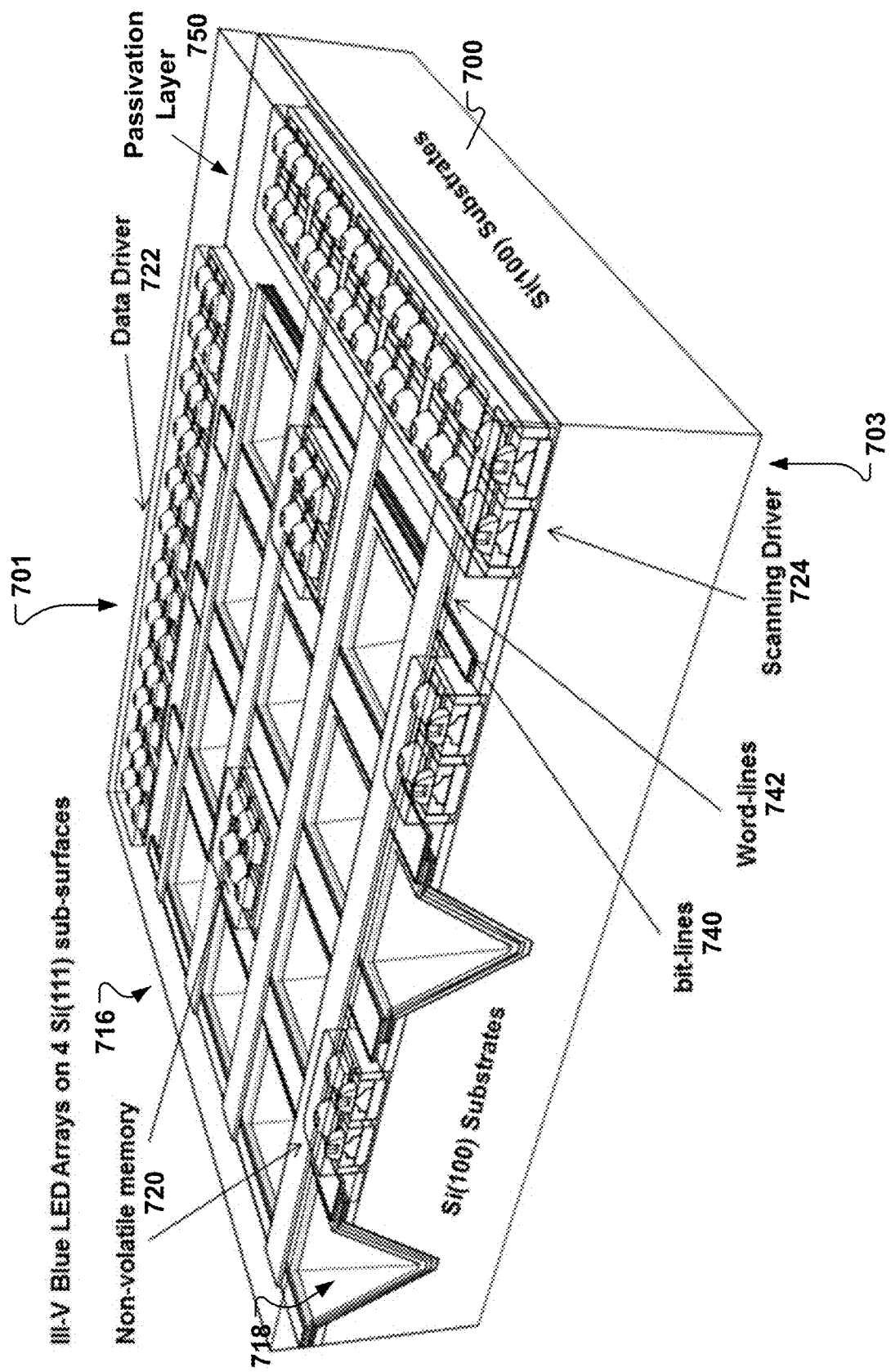

Seventh, as illustrated in FIG. 7G, a passivation layer 750, e.g., a transparent SiOx layer or ITO layer, is formed to cover surfaces of the silicon substrate. The passivation layer 750 can be deposited on the surfaces by MOCVD, ALD, PVD, CVD, or any suitable deposition methods. The passivation layer 750 can also act as an anode or cathode for the LEDs 718. The passivation layer 750 can be connected to the ground or a supply voltage.

All the above steps are performed on the upper side 701 of the silicon substrate 700. In the following eighth step, the silicon substrate 700 is flipped from the upper side 701 to the lower side 703, and a plurality of deep trenches (or through-holes) are formed from the lower side 703, through the substrate 700, and towards the upper side 701. The deep trenches can be formed by deep etching, e.g., deep RIE or plasma etching. Then conductive electrodes are formed inside the deep trenches to form interconnects 760. In some cases, inner surfaces of the deep trenches are insulated and then metals are filled inside the deep trenches to form the conductive electrodes.

Figure 7H:
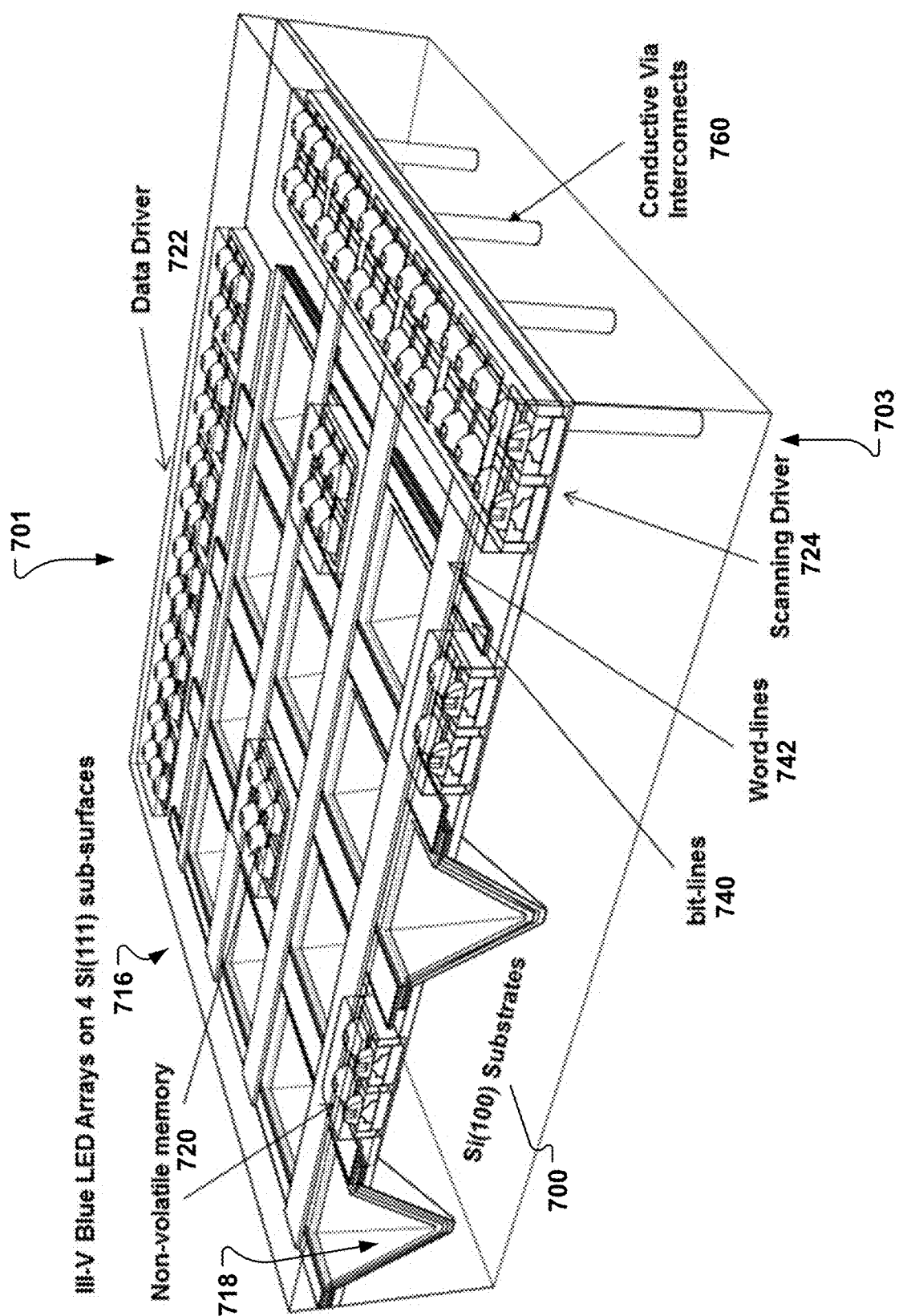

The interconnects 760 are configured to connect the plurality of data drivers 722 and the plurality of scanning drivers 724 to control electronics to be formed on the lower side 703. As the plurality of data drivers 722 can be connected together by interconnects 747 and the plurality of scanning drivers 724 can be connected together by interconnects 748, the number of interconnects 760 can be smaller than a sum of the number of data drivers 722 and the number of scanning drivers 724. As illustrated in FIG. 7H, the interconnects 760 can be distributed, e.g., evenly, among the scanning drivers 724 and the data drivers 722.

Figure 7I:
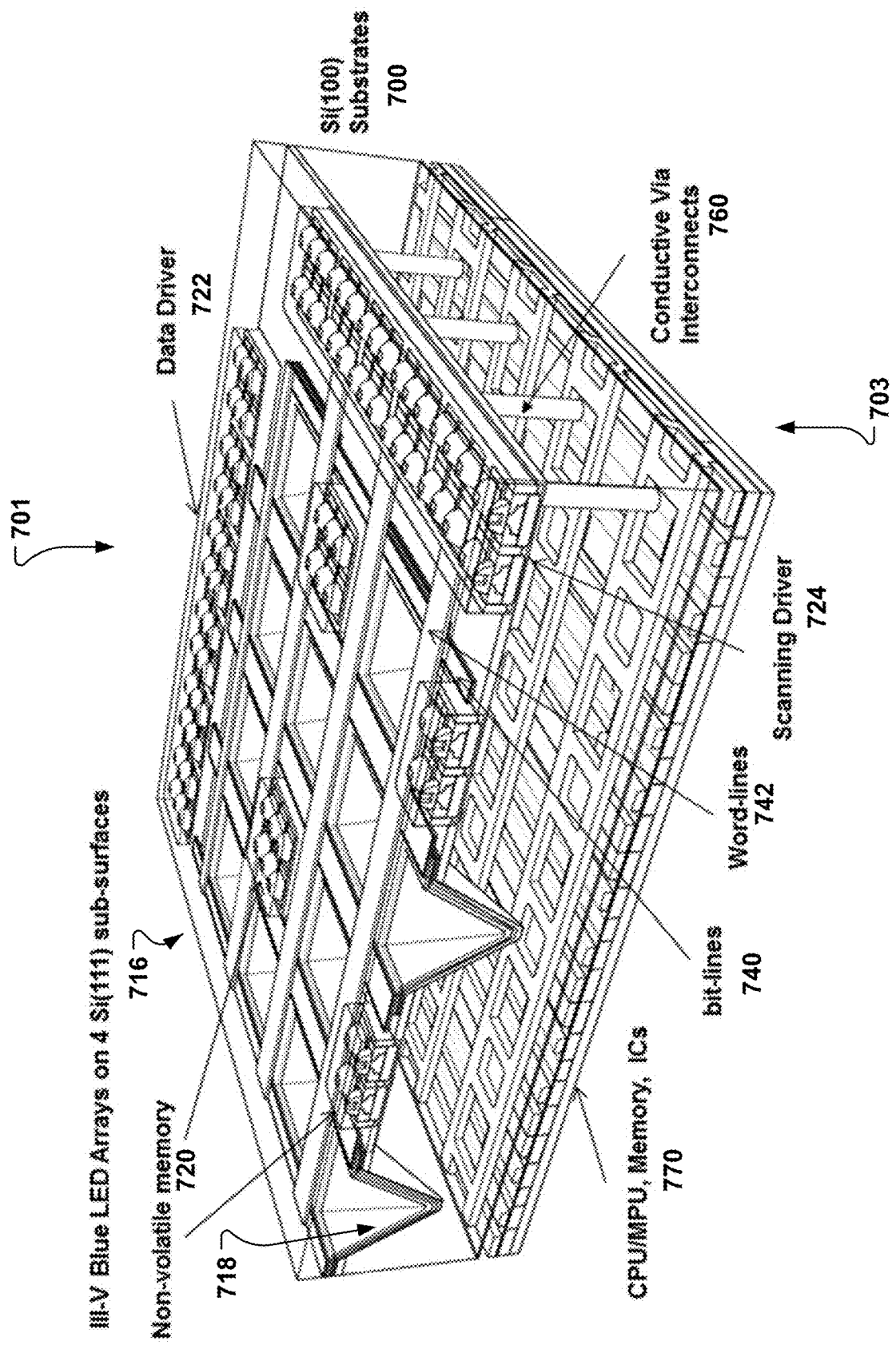

Ninth, as illustrated in FIG. 7I, control electronics 770 is formed on the bottom surface 704 of the lower side 703 of the silicon substrate 700. The control electronics 770 can be the control electronics 720 of FIGS. 6A-6B. In some implementations, the control electronics 770 has CPU/MPU, memories, and ICs including amplifiers, ADCs (analog-to-digital converters), DACs (digital-to-analog converters), controllers, and/or other ICs. Components in the control electronics 770 can be connected to each other, e.g., via internal bus. The control electronics 770, e.g., one or more digital signal processors, is coupled to the data drivers 722 and the scanning drivers 724 through the conductive interconnects 760.

Tenth, the silicon substrate 700 is flipped back from the lower side 703 to the upper side 701. Secondary color LEDs, e.g., red color LEDs 792 and green color LEDs 794, can be formed based on the previously-formed LEDs 718, e.g., blue color LED 718. The different color LEDs can form a multi-color LED pixel 790, e.g., the LED pixel 604 of FIGS. 6A-6B.

Secondary color LEDs are formed on surface of the LEDs 718 by using different color phosphor materials or different size quantum-dot (QD) materials. In some implementations, an array of the multi-color LED pixels 790 is formed by the following processes: 1) patterning using photoresist for specific color LEDs, e.g., red LEDs 792; 2) depositing, e.g., ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays 794, but with another specific color phosphor films or another specific size QD thin-films, e.g., green phosphor films or green QD thin-films. In a particular example, a white LED is also formed to be included in each pixel to increase a sharpness of displayed images/pictures.

Figure 7J:
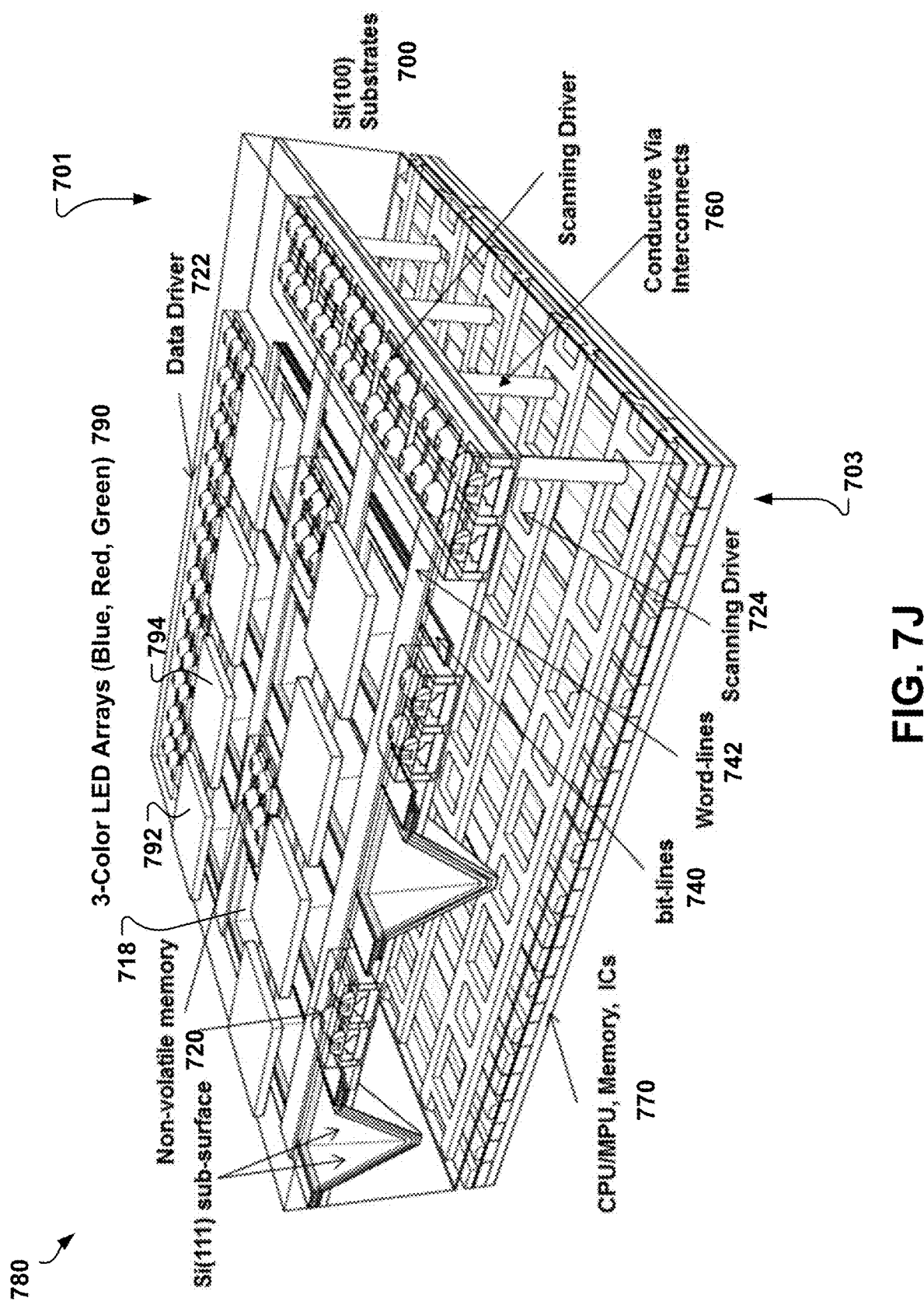

FIG. 7J shows the formed integrated LED display system 780, which can be the LED display system 600 of FIGS. 6A-6B. In the LED display system 580, blue LEDs 510 are first formed using Group III-V compound layers, e.g., In(0.3)Ga(0.7)N layer, as quantum well layers. Then other color LEDs, e.g., red LEDs, green LEDs, or white LEDs, are formed by depositing corresponding color phosphor films or corresponding size QD thin-films on the blue LEDs.

In some other implementations, red LEDs are first formed using Group III-V compound layers, e.g., InN layer, as quantum well layers. Then other color LEDs, e.g., blue LEDs, green LEDs, or white LEDs, are formed by depositing corresponding color phosphor films or QD thin-films on the red LEDs. In some other implementations, green LEDs are first formed using Group III-V compound layers, e.g., In(0.5)Ga(0.5)N layer, as quantum well layers. Then other color LEDs, e.g., blue LEDs, red LEDs, or white LEDs, are formed by depositing corresponding color phosphor films or QD thin-films on the red LEDs.

In some implementations, instead of using color phosphor films or QD thin-films on one color LEDs to generate the other two or more color LEDs, all the color LEDs, e.g., blue LEDs, red LEDs, and green LEDs, can be formed using Group III-V compound layers as quantum well layers. For example, after the second step where the silicon substrate 700 is patterned, blue LED arrays can be first selectively formed on Si (111) sub-surfaces of a first plurality of trenches by using Group III-V compound layers, e.g., In(0.3) Ga(0.7)N layer, as quantum well layers; then red LED arrays can be selectively formed on Si (111) sub-surfaces of a second plurality of trenches by using Group III-V compound layers, e.g., InN layer, as quantum well layers; and then green LED arrays can be selectively formed on Si (111) sub-surfaces of a third plurality of trenches by using Group III-V compound layers, e.g., In(0.5)Ga(0.5)N layer, as quantum well layers. The formation of the three color LED arrays can be arranged in any desired order. Each LED pixel can include a blue LED, a red LED, and a green LED. The number of the first plurality of trenches is identical to the number of the second plurality of trenches and to the number of the third plurality of trenches.

After forming the multi-color LED pixel display 780 as illustrated in FIG. 7J, a protective layer can be further formed on surfaces of the array of LED pixels, including the LEDs 718, 792, and 794. The protective layer can be made of transparent material, e.g., glass or plastic, coated with a conductive material, e.g., indium tin oxide (ITO). The protective layer is coupled to non-volatile memories 720 in the LED pixels under the protective layer and forms a touch screen position sensor with the non-volatile memories 720. The touch screen position sensor can use capacitive sensing. As noted above, a touch on the protective layer can be converted to a capacitance change which is detected by a touch screen detector/analyzer in the control electronics 770 through conductive connections between the non-volatile memories 720 and the data drivers 722/scanning drivers 724 and interconnects 760.

Figure 8A:
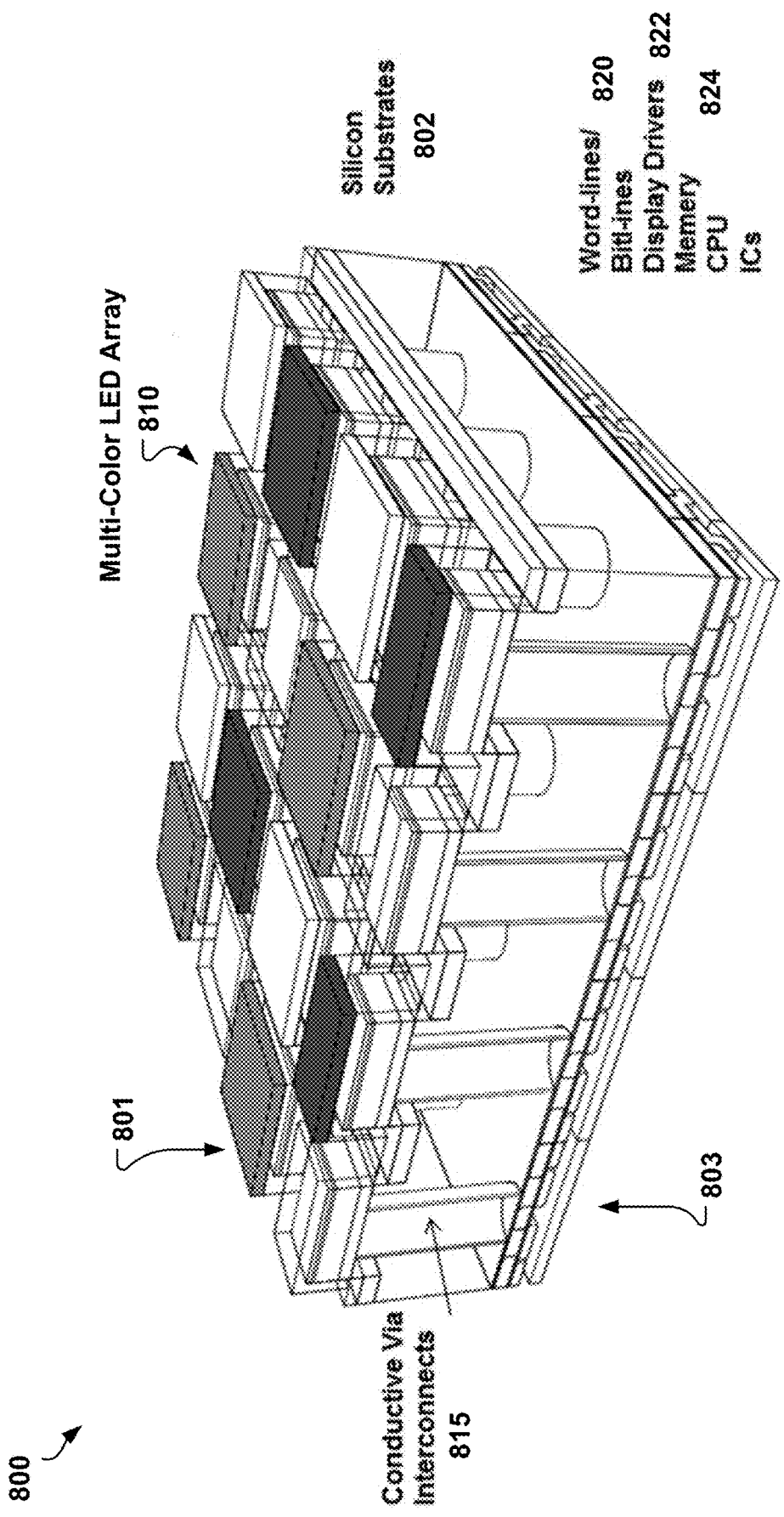
FIG. 8A is a perspective view of a third example of an integrated LED display system with multi-color LED pixel arrays.

FIG. 8A is a perspective view of another example integrated LED display system 800 formed on a silicon (111) substrate 802. The silicon substrate 802 has an upper side 801 and a lower side 803. The display system 800 includes multi-color LED arrays 810 formed on the upper side 803. Word lines/bit lines 820, display drivers 822 (e.g., scanning drivers/data drivers), and control electronics 824 (including CPU, MCU, memory, and/or other ICs) are formed on the lower side 803 of the substrate 802. The word lines/bit lines 820 are connected to the display driver 822. The display driver 822 is connected to the control electronics 824 on the lower side 803. Conductive interconnects 815 are formed in through-holes of the substrate and penetrate through the substrate from the upper side 801 to the lower side 803.

Each LED pixel can include three LEDs (e.g., blue, red, green) or four LEDs (e.g., blue, red, green, and white). In some implementations, each LED pixel is a passive-matrix LED pixel and driven by at least one display driver 822 through a corresponding interconnect 815 and at least one corresponding word line/bit line 820. In some implementations, each LED pixel is an active-matrix LED pixel that includes at least one LED and at least one non-volatile memory. In some examples, the non-volatile memory is formed on the lower side 803 and coupled to the LED through the conductive interconnect 815. The non-volatile memory can be coupled to at least one display driver 822 through at least one word line/bit line 820 on the lower side 803.

Figure 8B:
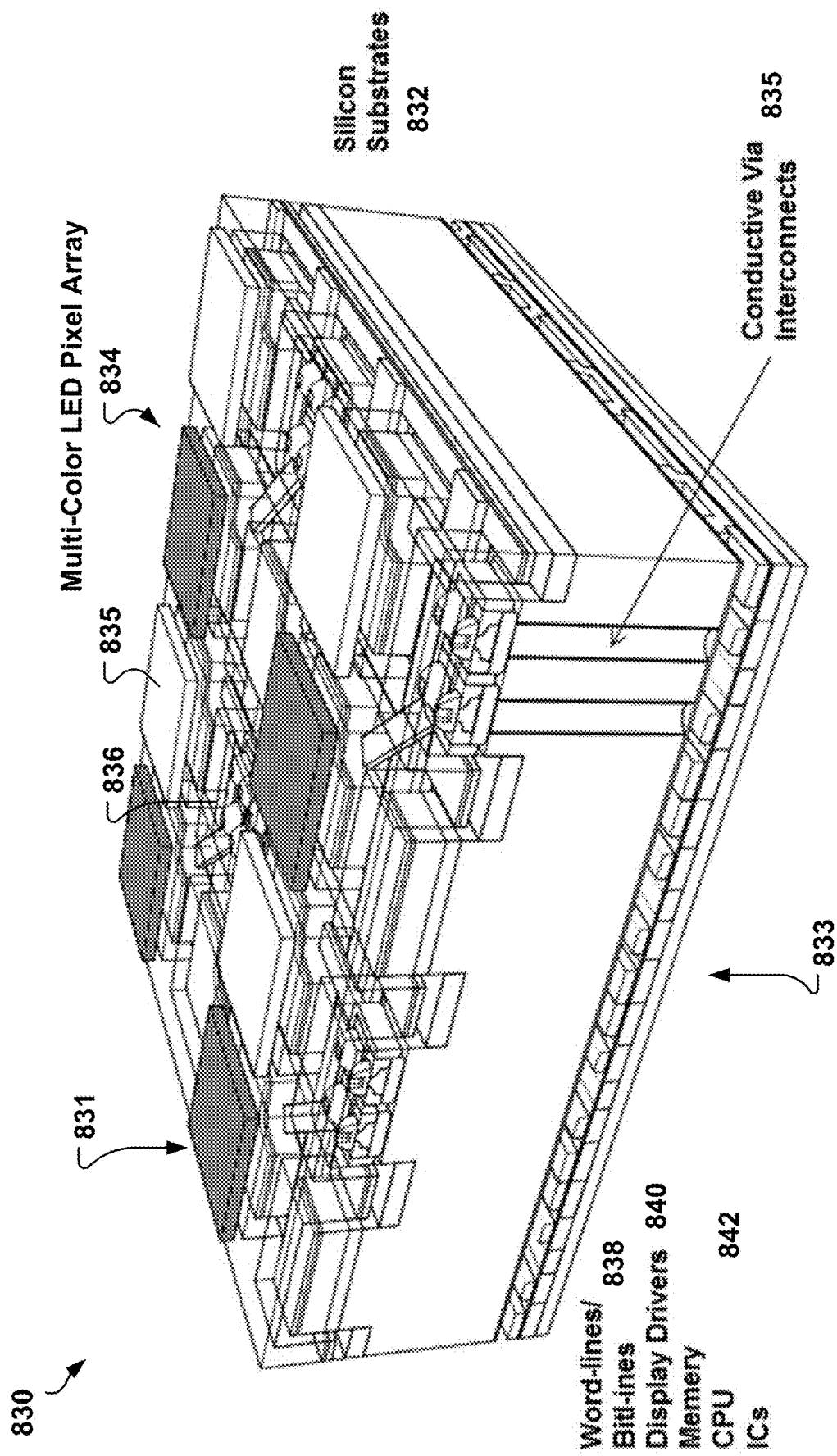
FIG. 8B is a perspective view of a fourth example integrated LED display system with multi-color LED pixel arrays.

FIG. 8B shows another example integrated LED display system 830 formed on a silicon (111) substrate 832. The silicon substrate 832 has an upper side 831 and a lower side 833. The LED display system 830 includes an array of multi-color LED pixels 834. Each LED pixel 834 is an active-matrix LED pixel, e.g., the LED pixel 200 of FIG. 2A or 230 of FIG. 2B. Each LED pixel 834 includes at least one LED 835 and at least one non-volatile memory 836 coupled to the at least one LED 835. The at least one LED 835 and the at least one non-volatile memory 836 are formed on the same side, i.e., the upper side 831. Particularly, the at least on LED 835 and the at least one-volatile memory 836 are positioned adjacent to each other.

Word lines/bit lines 838, display drivers 840 (e.g., scanning drivers/data drivers), and control electronics 842 (e.g., CPU, MCU, memory, or other ICs) are formed on the lower side 833 of the substrate 832. The word lines/bit lines 838 are connected to the display driver 840. The display driver 840 is connected to the control electronics 842 on the lower side 833. Conductive interconnects 835 are formed in through-holes of the substrate and penetrate through the substrate from the upper side 831 to the lower side 833. Each LED pixel 834, e.g., the at least one non-volatile memory 836, is coupled to at least one display driver 840 through a corresponding interconnect 815 and at least one corresponding word line/bit line 820.

Figure 8C:
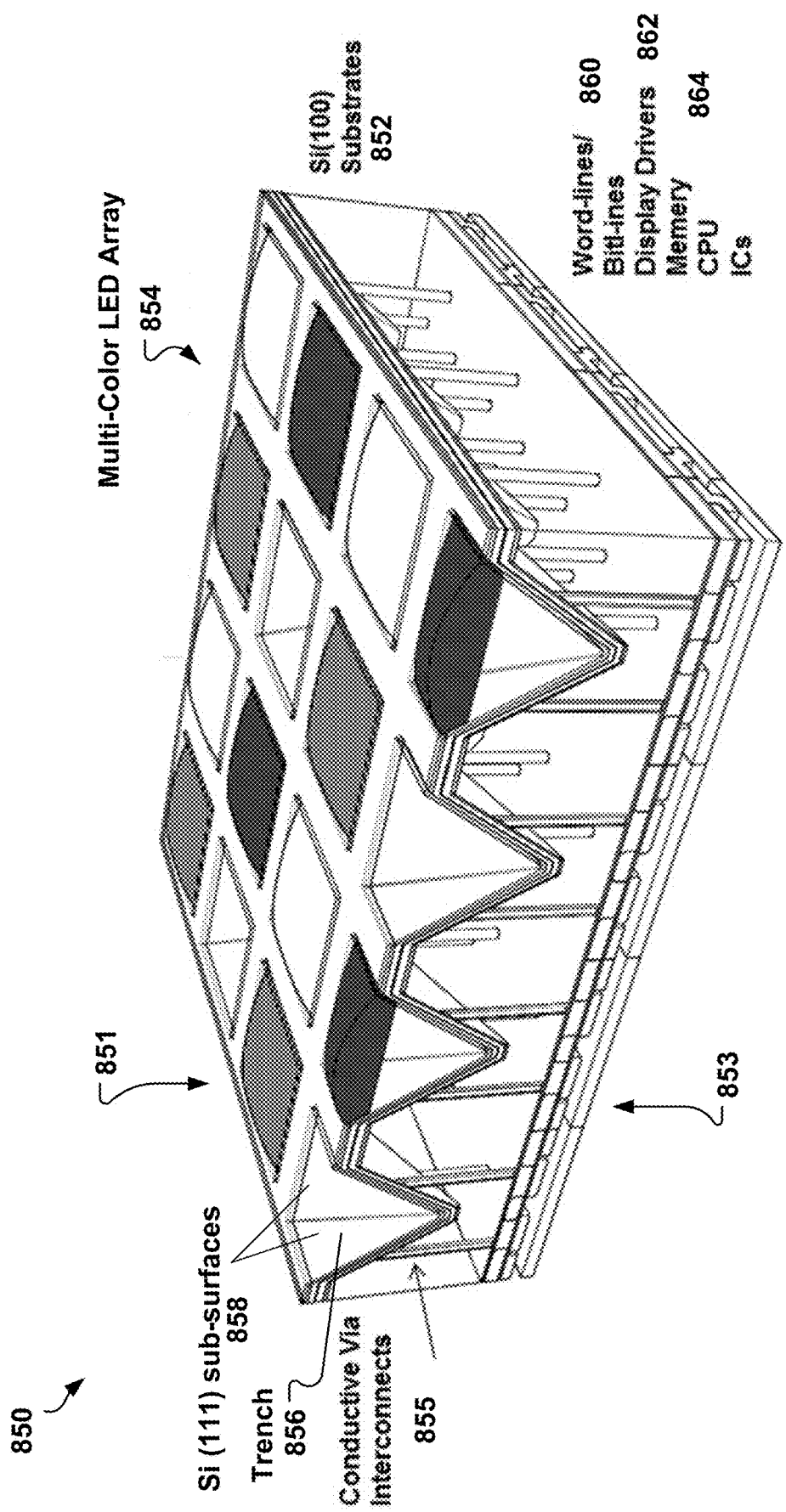
FIG. 8C is a perspective view of a fifth example of an integrated LED display system with multi-color LED pixel arrays.

FIG. 8C is a perspective view of another example integrated LED display system 850 formed on a silicon (100) substrate 852. The silicon (100) substrate 852 has an upper side 851 and a lower side 853. Different from the multi-color LED arrays 810 of FIG. 8A, a multi-color LED array 854 of the LED display system 850 is formed in trenches 856 that have multiple Si (111) sub-surfaces 858 on the upper side 851. As discussed in FIG. 7J, the multi-color LEDs can be formed by first growing primary color LEDs, e.g., Group III-V based blue LEDs, on the Si (111) sub-surface 858, then forming secondary color LEDs, e.g., red LEDs and/or green LEDs, with different color phosphor materials or different size quantum dot materials deposited/printed in the trenches 856.

Word lines/bit lines 860, display drivers 862 (e.g., scanning drivers/data drivers), and control electronics 864 (including CPU, memory, or other ICs) are formed on the lower side 853 of the substrate 852. The word lines/bit lines 860 are connected to the display driver 862. The display driver 862 is connected to the control electronics 864 on the lower side 853. Conductive interconnects 855 are formed in through-holes of the substrate and penetrate through the substrate from the upper side 851 to the lower side 853.

In some implementations, each LED pixel including at least one LED is a passive-matrix LED pixel and driven by at least one display driver 862 through a corresponding interconnect 855 and at least one corresponding word line/bit line 860. In some implementations, each LED pixel including at least one LED is an active-matrix LED pixel that includes at least one LED and at least one non-volatile memory. In some examples, the non-volatile memory is formed on the lower side 853 and coupled to the LED through the conductive interconnect 855. The non-volatile memory can be coupled to at least one display driver 862 through at least one word line/bit line 860 on the lower side 853. In some examples, the non-volatile memory is formed on the upper side 851 and coupled to the LED through conductive connections. The non-volatile memory can be coupled to at least one display driver 862 through the interconnect 855 and at least one word line/bit line 860.

A number of example integrated LED display systems with multi-color LED pixel arrays have been described above in the present disclosure. Other implementations are also possible. In some implementations, an array of passive-matrix LEDs is formed on a first side of a substrate. Display divers (e.g., scanning drivers and data drivers) and connections lines (e.g., word lines and bit lines) are also formed on the first side and coupled to the passive-matrix LEDs. For example, each LED can be coupled to a corresponding scanning driver through at least one word line and to a corresponding data driver through at least one bit line. Control electronics are formed on a second side of the substrate and coupled to the display drivers on the first side through conductive interconnects that penetrate through the substrate from the second side to the first side. The substrate can be a Si (111) substrate or a Si (100) substrate, as discussed above.

In some implementations, an array of LED pixels, e.g., passive-matrix LEDs or active-matrix LED pixels, is formed on a first side of a primary substrate, and display drivers are formed on a second side of the primary substrate and coupled to the LED pixels through interconnects penetrating through the primary substrate. Control electronics, including CPU, memory, controller, or other ICs, is formed or assembled on a secondary substrate and communicates, e.g., wired or wireless, to the display drivers on the primary substrate.

In some implementations, a first part of control electronics for the LED pixel array is integrated (formed or assembled) on the primary substrate, while a second part of the control electronics is on a secondary substrate and communicates with the first part of the control electronics. In one example, the control electronics includes one or more analog signal processors and one or more digital signal processors. The one or more analog signal processors can be on the secondary substrate and the one or more digital signal processors can be integrated on the primary substrate and communicate with the one or more analog signal processors. The digital signal processors are configured to control the LED pixel array. In another example, a controller is integrated on the primary substrate and configured to control the LED pixel array via display drivers, and other components including CPU, memory, and/or ICs, are on the secondary substrate. In some examples, part of the control electronics is formed/fabricated on the substrate, and the other part of the control electronics are external components and assembled, e.g., by bonding, on the substrate.

Example Fabrication Processes

Figure 9:
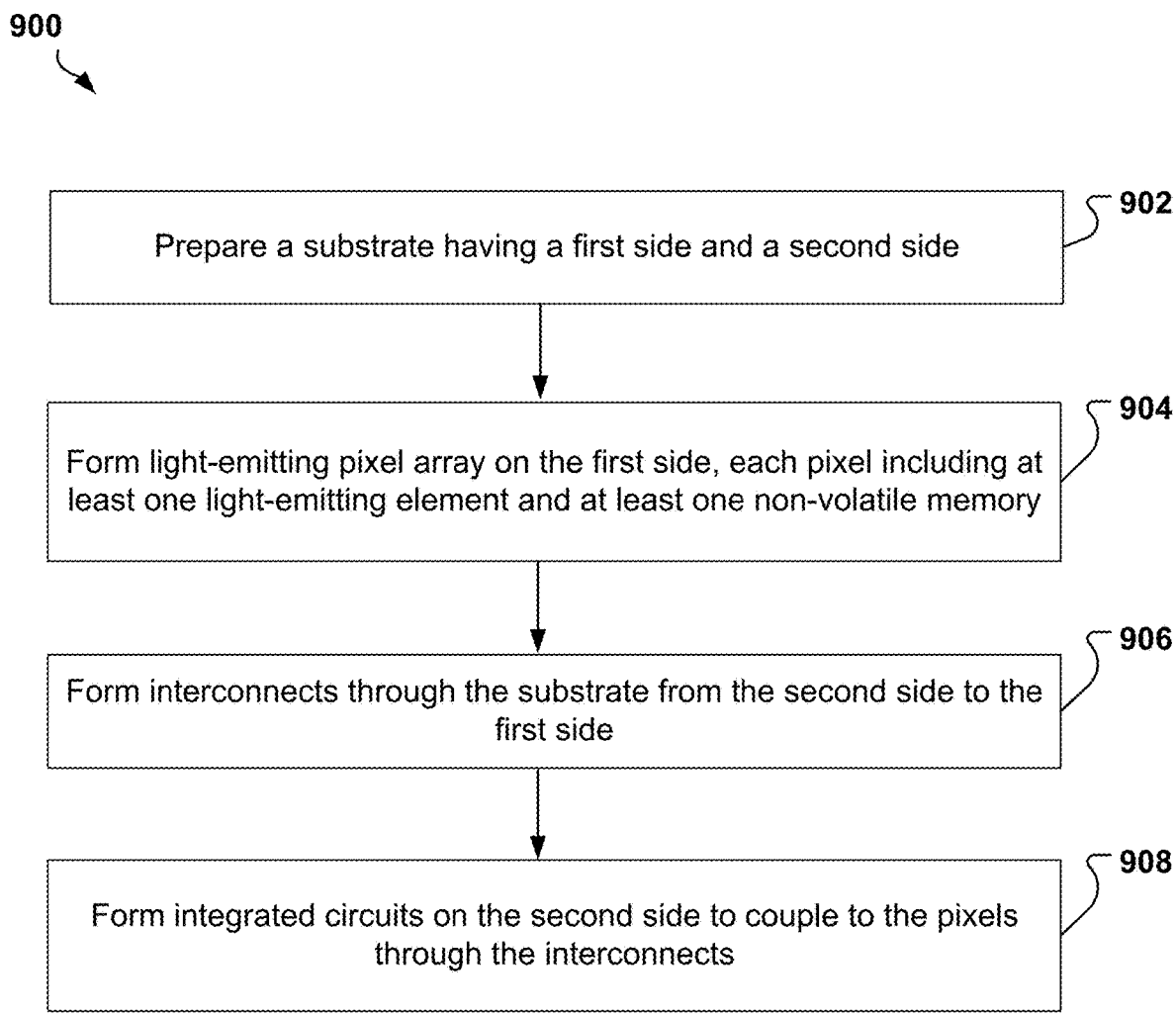
FIG. 9 is a flow diagram of an example process of forming an integrated active-matrix light-emitting pixel display system on a substrate.

FIG. 9 is a flow diagram of an example process 900 of forming an integrated active-matrix light-emitting pixel display system on a substrate. The light-emitting pixel display system can be the LED pixel display system 100 of FIG. 1A, 400 of 4A-4B, 600 of 6A-6B, or 830 of FIG. 8B. The example process 900 can be similar to the processes described according to FIGS. 5A-5J or the processes described according to FIGS. 7A-7J. The substrate can be a Si (111) substrate or a Si (100) substrate.

The substrate is prepared (902). The substrate can be pre-treated, e.g., by cleaning surfaces of the substrate. The substrate can include a first side, e.g., an upper side, and a second side, e.g., a lower side opposite to the upper side.

A light-emitting pixel array is formed on the first side of the substrate (904). Each pixel includes at least one light-emitting element and at least one non-volatile memory coupled to the at least one light-emitting element. The at least one non-volatile memory can be arranged adjacent to the at least one light-emitting element. Each light-emitting element can be connected to one respective non-volatile memory in one pixel.

In some implementations, the substrate is a (111) silicon semiconductor substrate having a first surface on the first side and a second surface on the second side and opposite to the first surface, and the light-emitting elements and the non-volatile memories are formed on the first surface. In some implementations, the substrate is a (100) silicon semiconductor substrate having a first surface along a (100) crystalline plane direction on the first side and a second surface along the (100) crystal plane direction on the second side, the second surface being parallel to the first surface. Preparing the substrate could include etching the first side of the substrate to form a third surface having along a (111) crystalline plane, e.g., a Si (111) sub-surface, the third surface being not parallel to the first surface. Forming light-emitting pixel arrays on the first side can include forming the light-emitting elements of the pixels on the third surface; and forming the non-volatile memories on the first surface.

The light-emitting elements can be light-emitting diodes (LEDs) having one or more quantum well layers including Group III-V compounds, e.g., InGaN. The LEDs can be epitaxially grown (e.g., by MOCVD, MBE, or ALD) on Si (111) surfaces. In some implementations, the light-emitting pixel array is a multi-color pixel array, e.g., including blue, red, green, and/or white colors. As noted above, an array of primary LEDs emitting a first color, e.g., blue, is first formed on the substrate. Secondary color LEDs, e.g., red or green, can be formed by depositing different color phosphor materials or different size quantum dot materials, on surfaces of the primary LED.

Conductive interconnects are formed from the second side to the first side (906). The substrate can be first deep etched from the second side, e.g., by dry reaction ion etching (ME) or plasma etching, to form through-holes or deep trenches in the substrate. Then inner surfaces of the through-holes or deep trenches are insulated, and metals or other conductive materials are filled in the through-holes or deep trenches to form the conductive interconnects.

One or more integrated circuits are formed on the second side to be coupled to the pixels through the interconnects (908). The one or more integrated circuits can include a controller, a processor, and/or other ICs. The integrated circuits are configured to control the pixels through the interconnects.

In some implementations, display drivers including scanning drivers and data drivers are formed on the first side. Connection lines including word lines and bit lines are also formed on the first side. Each pixel is coupled to one of the scanning drivers through at least one word line and to one of the data drivers through at least one bit line. The scanning drivers and the data drivers are coupled to the one or more integrated circuits through the interconnects.

In some implementations, scanning drivers and data drivers are formed on the second side. The scanning drivers and the data drivers are conductively coupled to the one or more integrated circuits on the second side. Word lines and bit lines are formed on the second side, and the pixels are coupled to the word lines and bit lines through the interconnects, such that each pixel is coupled to one of the scanning drivers through at least one word line and to one of the data drivers through at least one bit line.

In some implementations, a protective layer is formed to cover the light emitting pixel array on the first side. The protective layer is coupled to the non-volatile memories in the light emitting pixels to form a touch screen position sensor. The one or more integrated circuits can include a touch screen detector configured to detect a change of the touch screen position sensor, such that the integrated LED pixel display system can function as a touch screen display.

Figure 10:
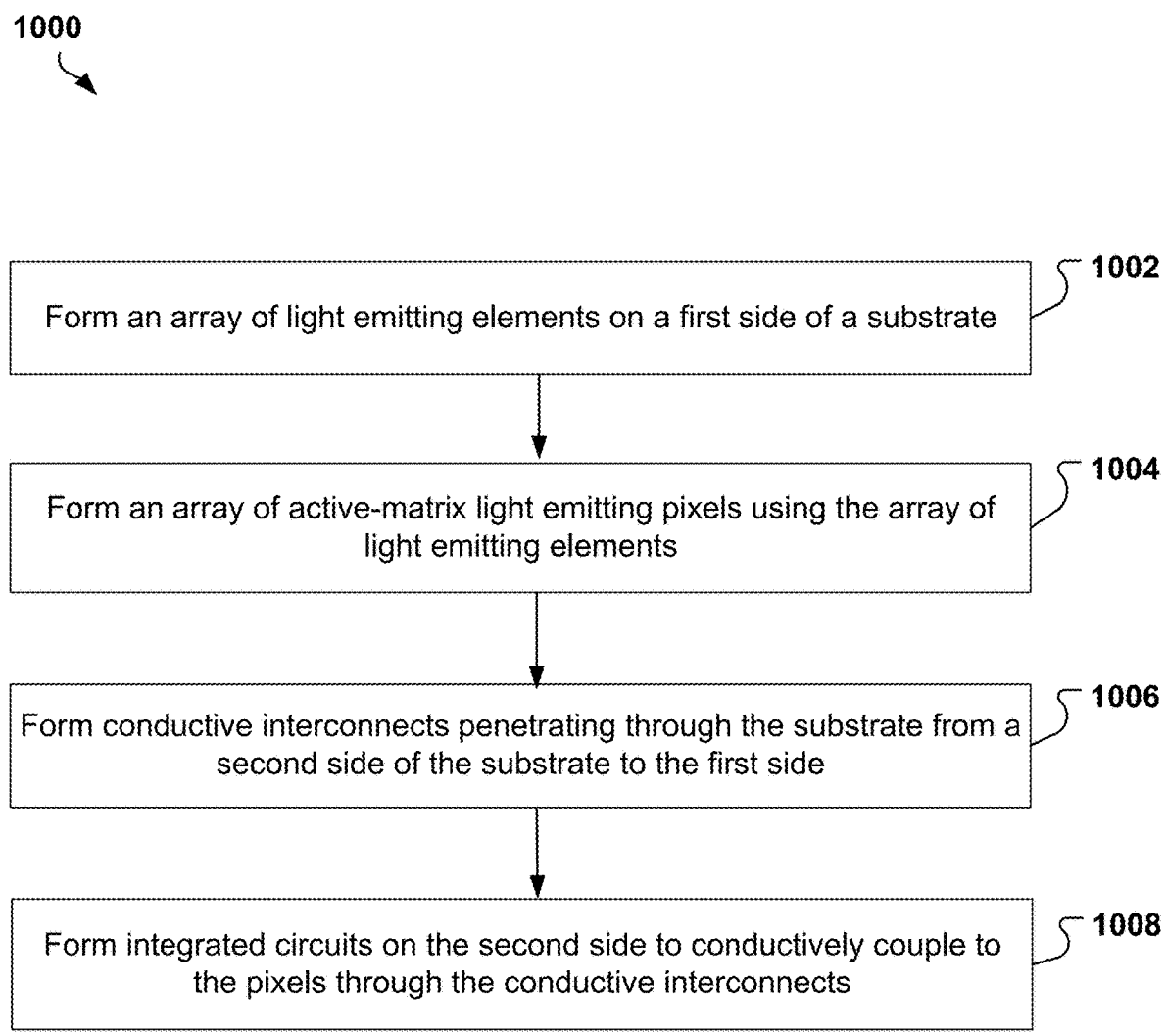
FIG. 10 is a flow diagram of another example process of forming an integrated active-matrix light-emitting pixel array based display on a substrate.

FIG. 10 is a flow diagram of another example process 1000 of forming an integrated active-matrix light-emitting pixel array based display on a substrate. The substrate can be a (111) silicon semiconductor substrate. The light-emitting pixel array based display can be the LED pixel display system 100 of FIG. 1A, 400 of FIGS. 4A-4B, 800 of FIG. 8A, 830 of FIG. 8B, 1150 of FIG. 11J, or 1250 of FIG. 12M. For illustration purposes only, FIGS. 11A-11J show perspective views at different steps of forming an integrated active-matrix LED pixel array based display 1150 according to the process 1000. FIGS. 12A-12N show perspective views at different steps of forming another integrated active-matrix LED pixel array based display 1250, according to the process 1000.

Referring to FIG. 10, an array of light emitting elements on a first side of the substrate is formed (1002). The substrate can be pre-treated, e.g., by cleaning surfaces of the substrate. The substrate can include the first side, e.g., an upper side, and a second side, e.g., a lower side opposite to the upper side.

Figure 11A:
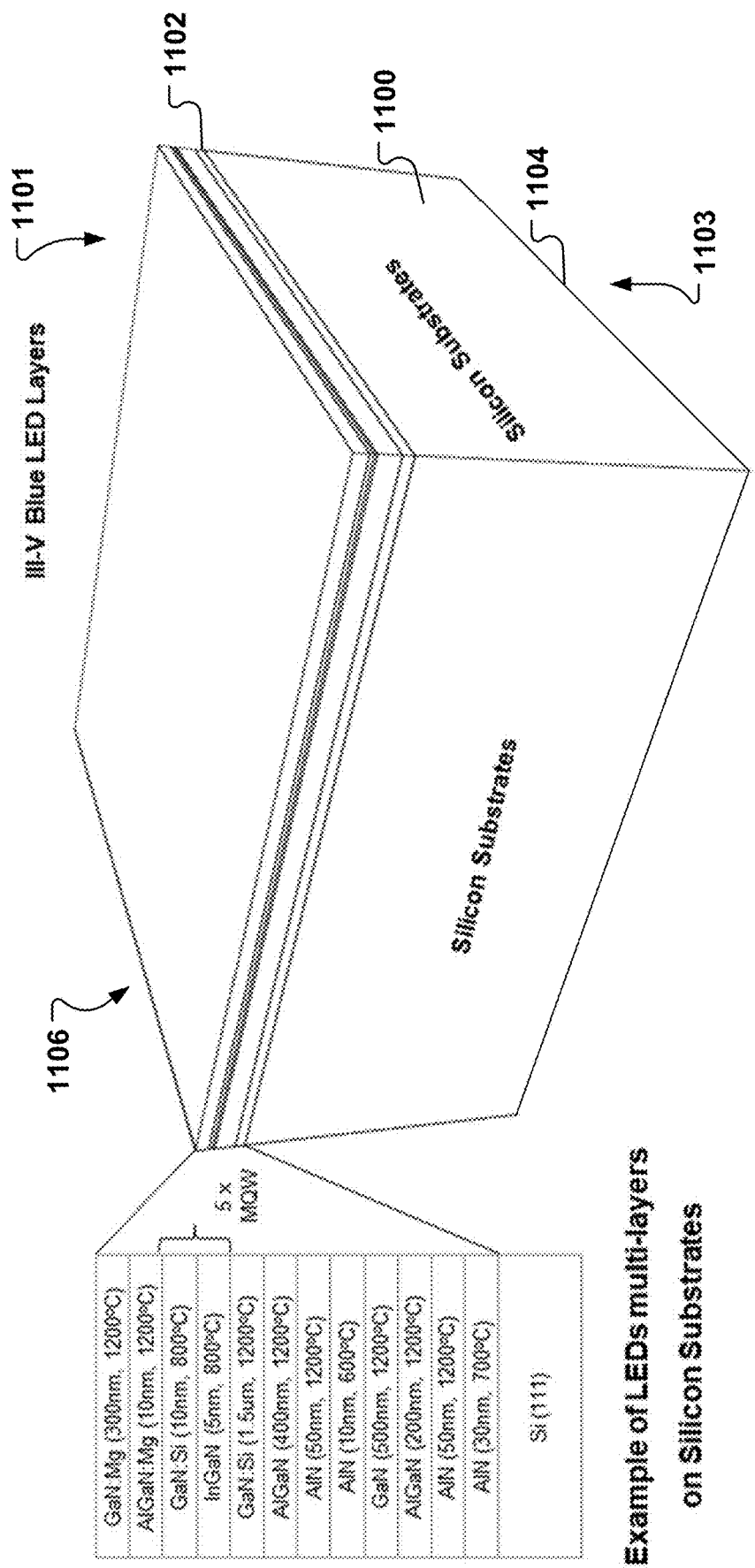
FIGS. 11A-11K are perspective views at different steps of forming an integrated active-matrix LED pixel array based display.
Figure 12A:
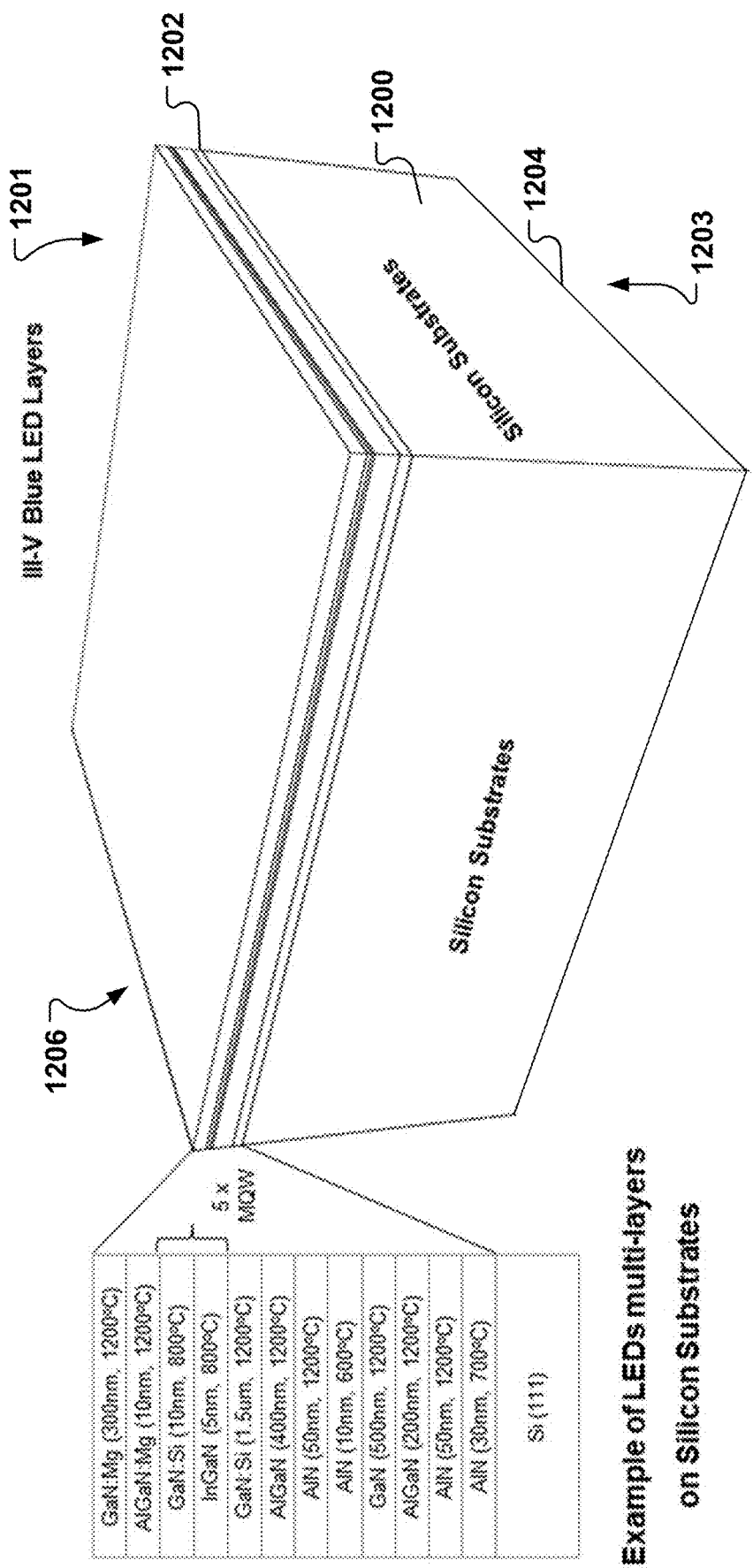
FIGS. 12A-12N are perspective views at different steps of forming another integrated active-matrix LED pixel array based display.
Figure 12B:
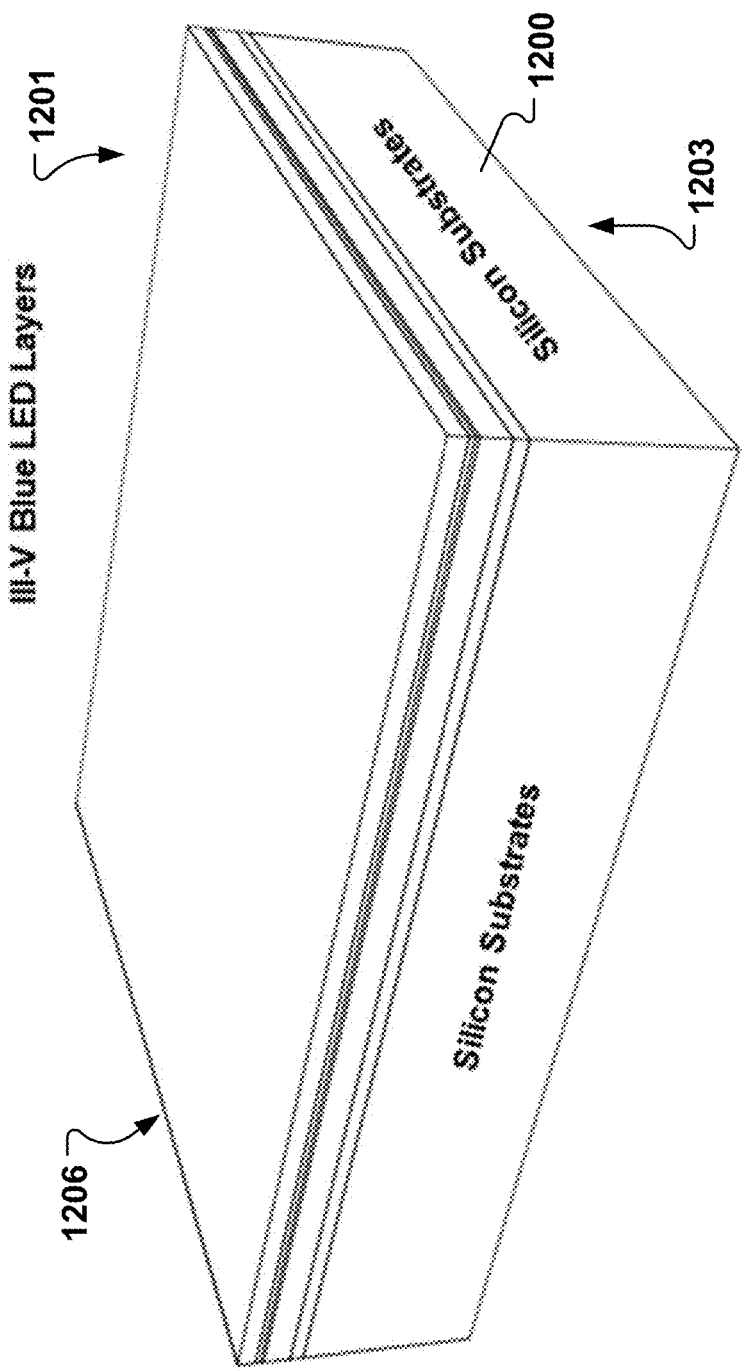
Figure 12C:
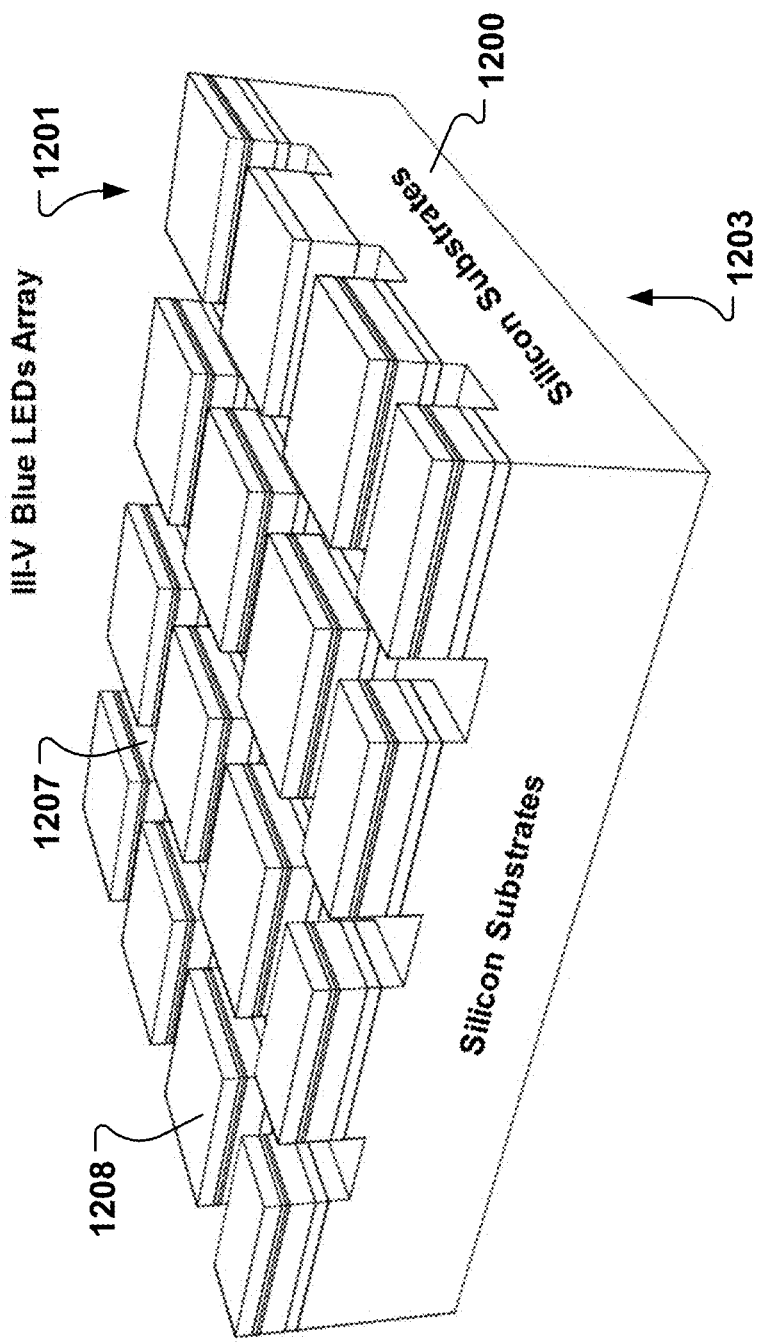
Figure 12D:
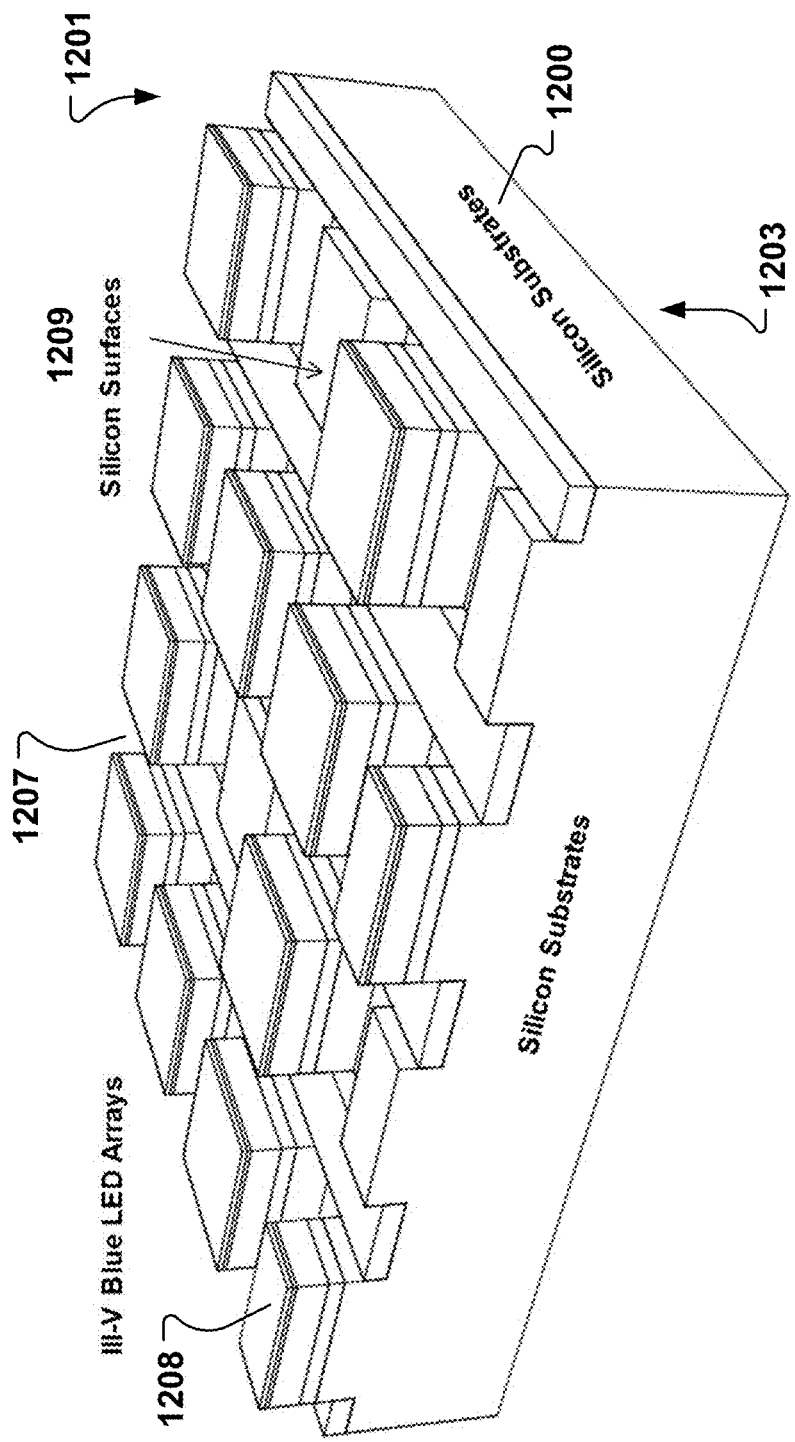

In some implementations, as illustrated in FIG. 11A, forming the array of light emitting elements includes forming a plurality of semiconductor layers on the first side of the substrate to form a light emitting structure. The formed light emitting structure is configured to be activated to emit light with a single color, and each of the light emitting elements is configured to emit light with the single color. For example, the semiconductor layers can include one or more quantum well layers including Group III-V compounds, the light emitting structure is a light emitting diode (LED) structure, and each of the light emitting elements can be an LED. In a particular example, the semiconductor layers include a plurality of pairs of alternating GaN:Si layer and InGaN layer, and each of the light emitting elements is a blue LED operable to emit blue light.

Figure 11B:
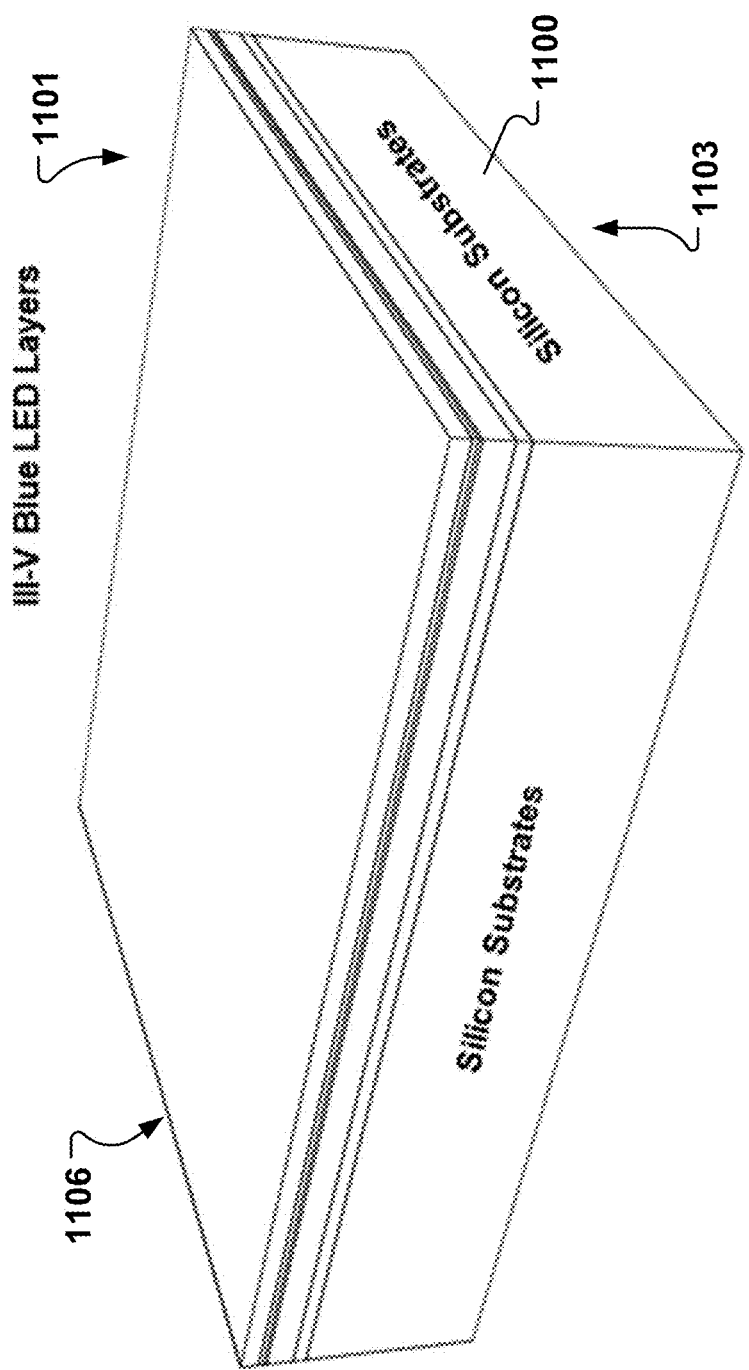
Figure 11C:
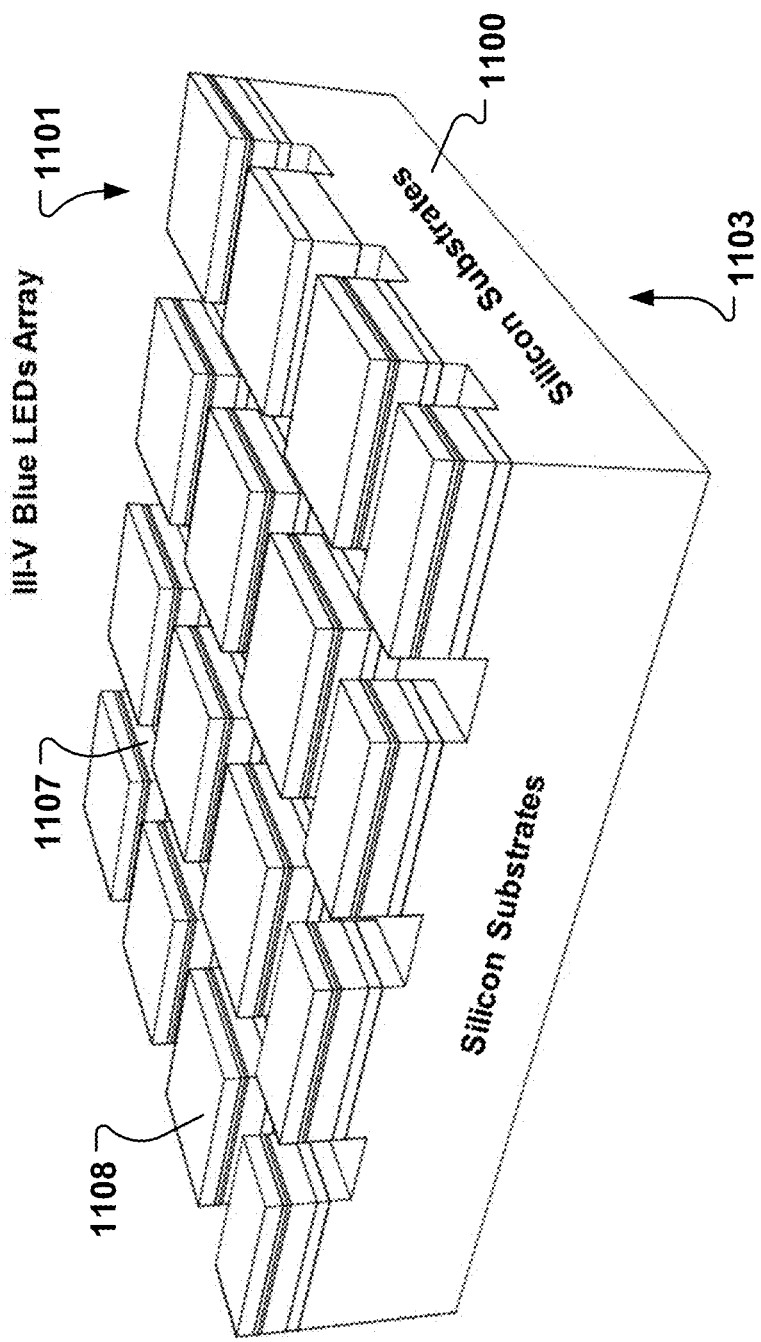

Then, as illustrated in FIG. 11C, the formed light emitting structure is patterned to form the array of light emitting elements. A patterned mask, e.g., a photoresist mask, can be formed on the light emitting structure, e.g., by photolithography, and the semiconductor layers are etched through into the substrate to form light emitting elements separated from each other.

Figure 11D:
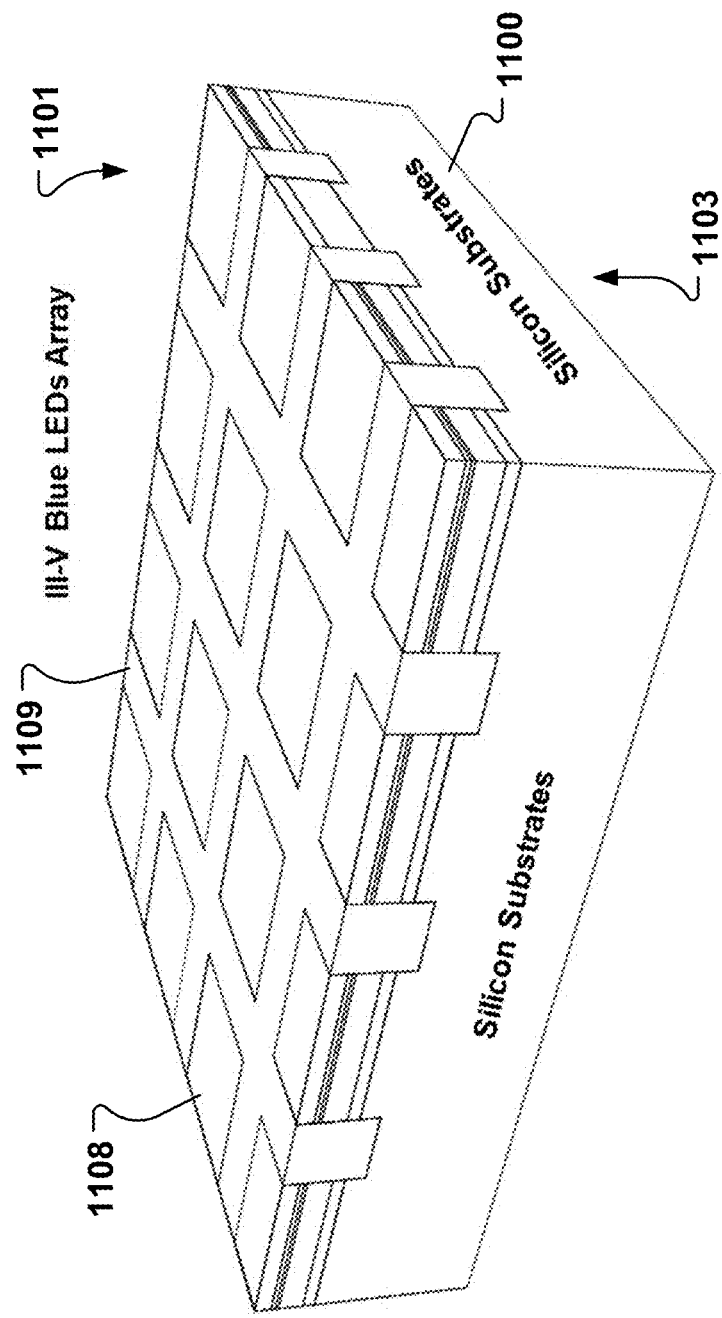
Figure 11E:
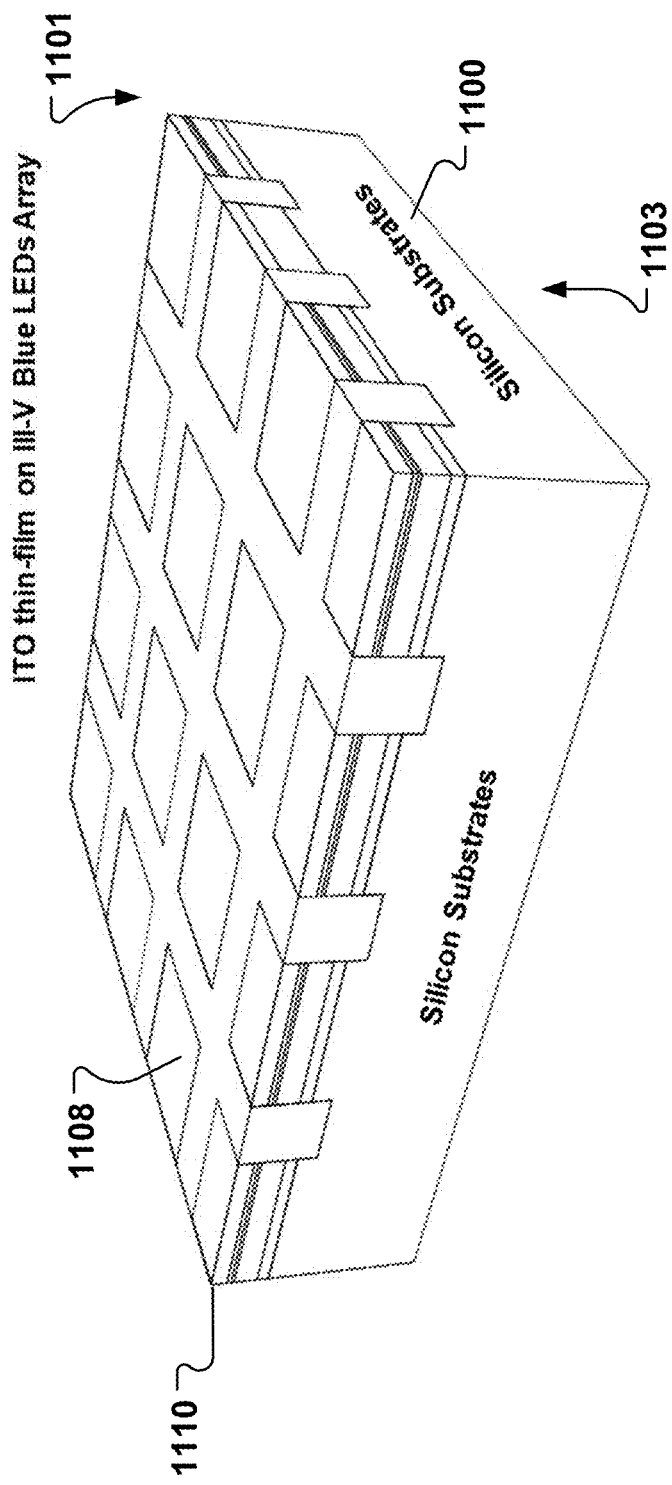

In some implementations, as illustrated in FIG. 11D, an isolation material is filled into gaps between adjacent light emitting elements on the first side. For example, a dielectric material such as $SiO_2$ can be deposited in the gaps by chemical vapor deposition (CVD). Then, topology planarization, e.g., polishing by chemical-mechanical polishing (CMP), is performed on the first side to form a flat surface across the array of light emitting elements. A conductive layer, e.g., indium tin oxide (ITO) film, can be formed on the flat surface to form a common ground for the array of light emitting elements, as illustrated in FIG. 11E.

An array of active-matrix light emitting pixels is formed using the array of light emitting elements (1004). Each pixel includes at least one light-emitting element and at least one non-volatile memory coupled to the at least one light-emitting element. The at least one non-volatile memory can be arranged adjacent to the at least one light-emitting element. Each light-emitting element can be connected to one respective non-volatile memory in one pixel.

Figure 11F:
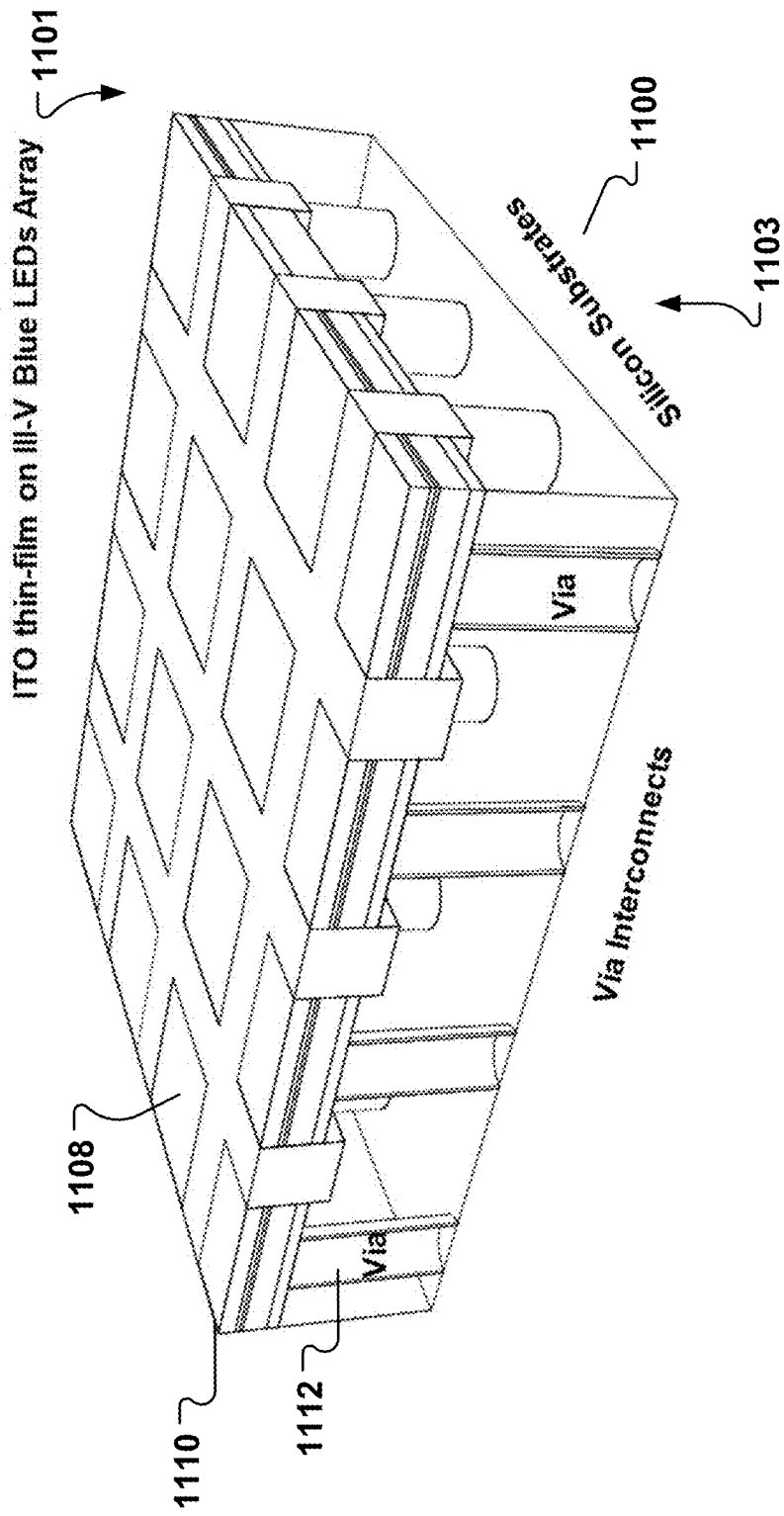

Conductive interconnects are formed penetrating through the substrate from the second side to the first side (1006), as illustrated in FIG. 11F. The substrate can be first deep etched from the second side, e.g., by dry reaction ion etching (RIE) or plasma etching, to form deep trenches in the substrate. Then inner side wall surfaces of the deep trenches are insulated, e.g., by deposition of dielectric material, and metals or other conductive materials are filled in the deep trenches to form the conductive interconnects.

One or more integrated circuits are formed on the second side to be conductively coupled to the pixels through the conductive interconnects (1008). The integrated circuits are configured to control the pixels through the interconnects. The integrated circuits can include control electronics, e.g., CPU/MPU, memory, A/D converters, D/A converters, amplifiers, and other ICs.

In some implementations, the integrated circuits include one or more digital signal processors including at least one of: a digital signal analyzer, a digital processor, an image processor, a volatile memory, a non-volatile memory, or a touch screen processor. In some implementations, the integrated circuits include one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

Figure 11G:
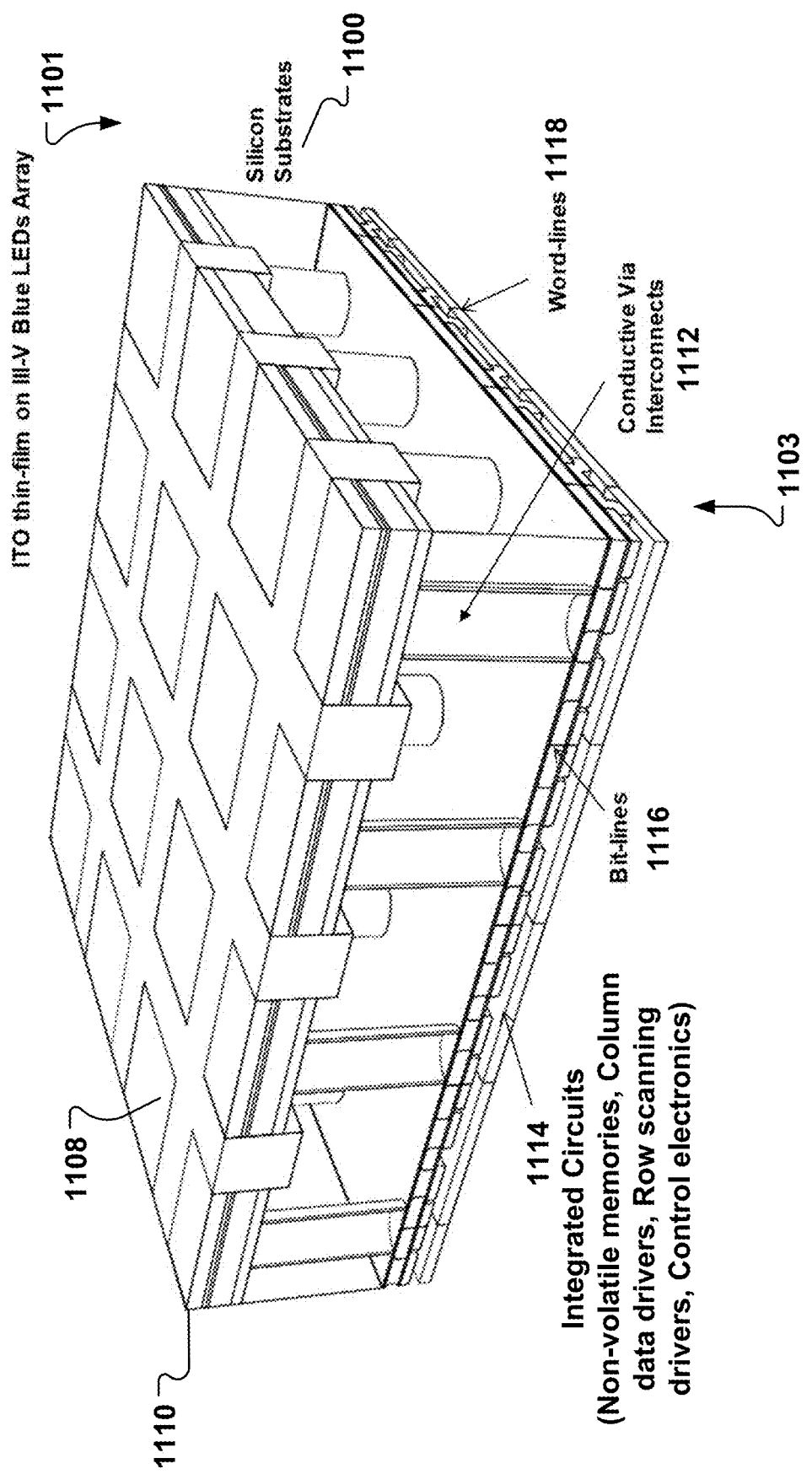

In some implementations, the non-volatile memories in the active-matrix light emitting pixels are formed on the second side. The array of light-emitting elements on the first side are conductively connected to the non-volatile memories on the second side via the conductive interconnects, as illustrated in FIG. 11G, to therefore form the active-matrix light emitting pixels. Accordingly, scanning drivers and data drivers are formed on the second side and conductively coupled to the one or more integrated circuits on the second side. Word lines and bit lines are also formed on the second side and conductively coupled to the scanning drivers and the data drivers and the non-volatile memories, such that each of the non-volatile memories is coupled to one of the scanning drivers through at least one word line and to one of the data drivers through at least one bit line.

Figure 12E:
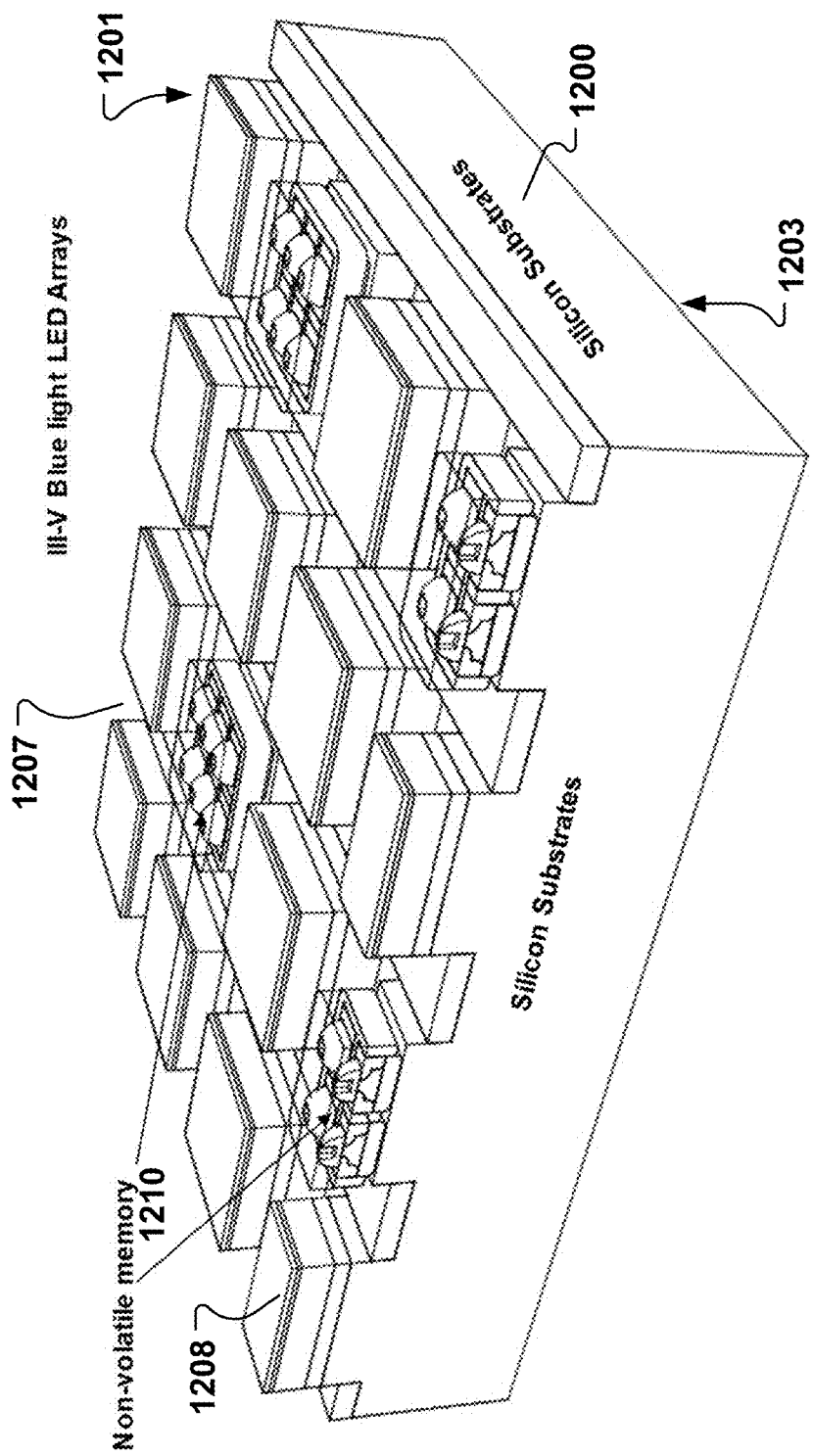
Figure 12F:
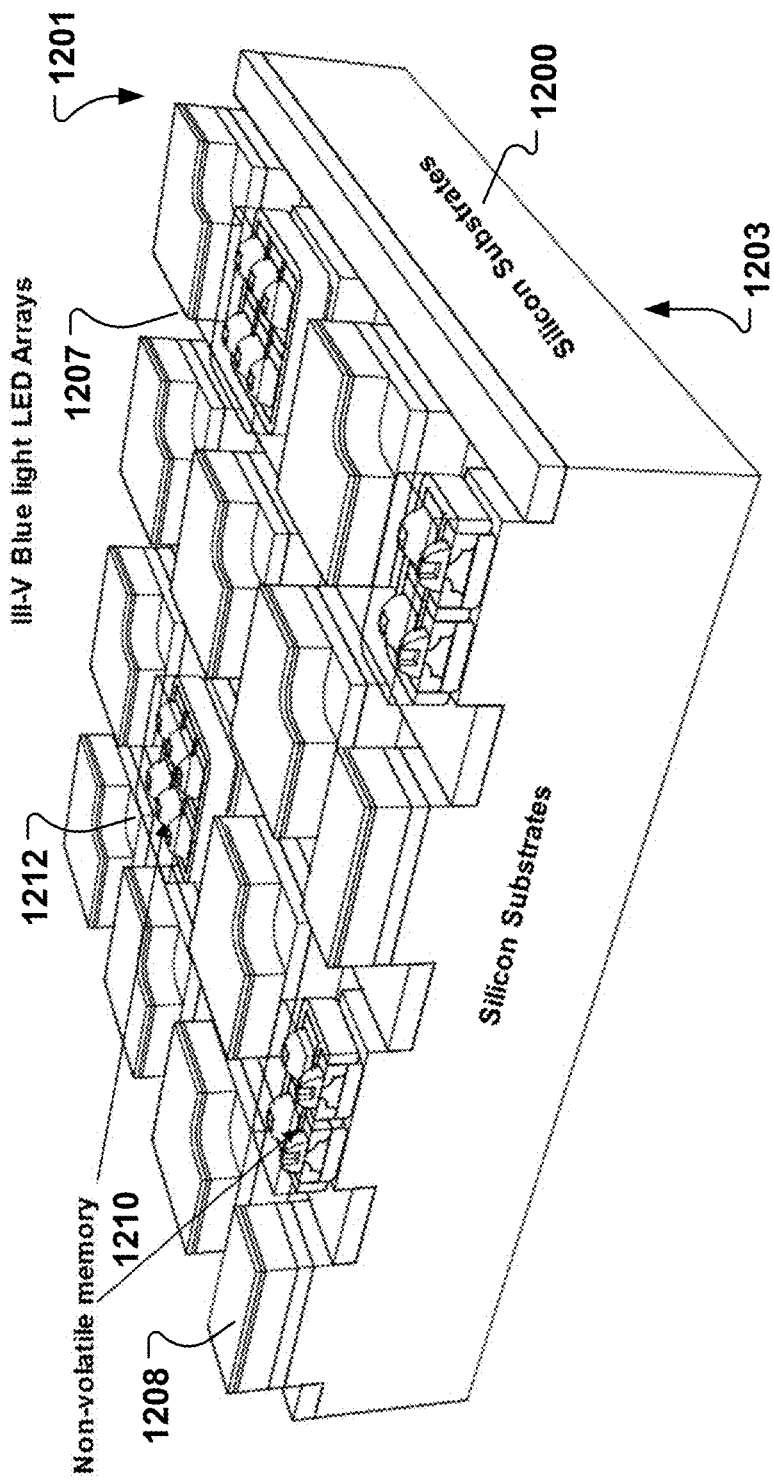
Figure 12G:
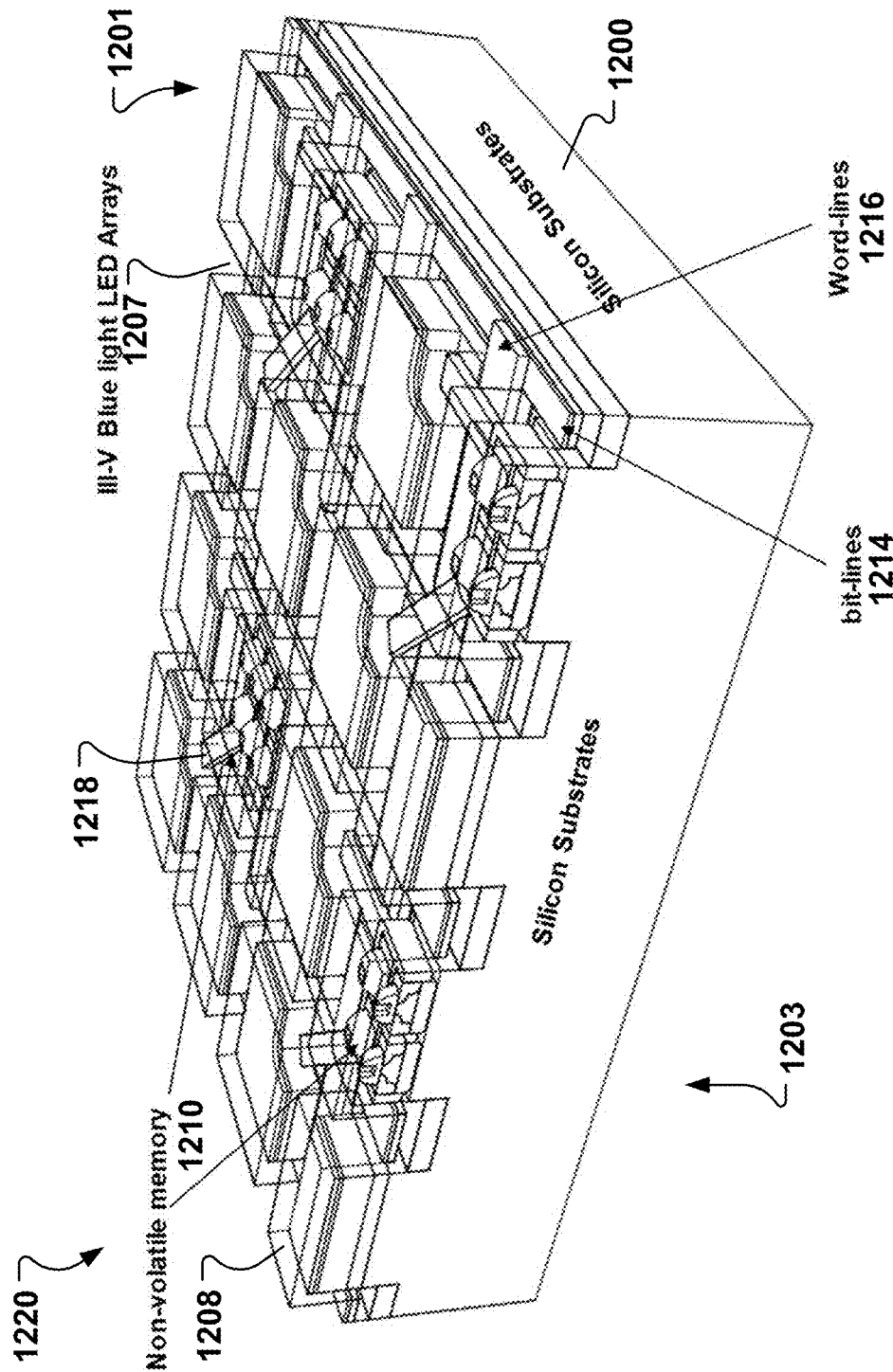
Figure 12H:
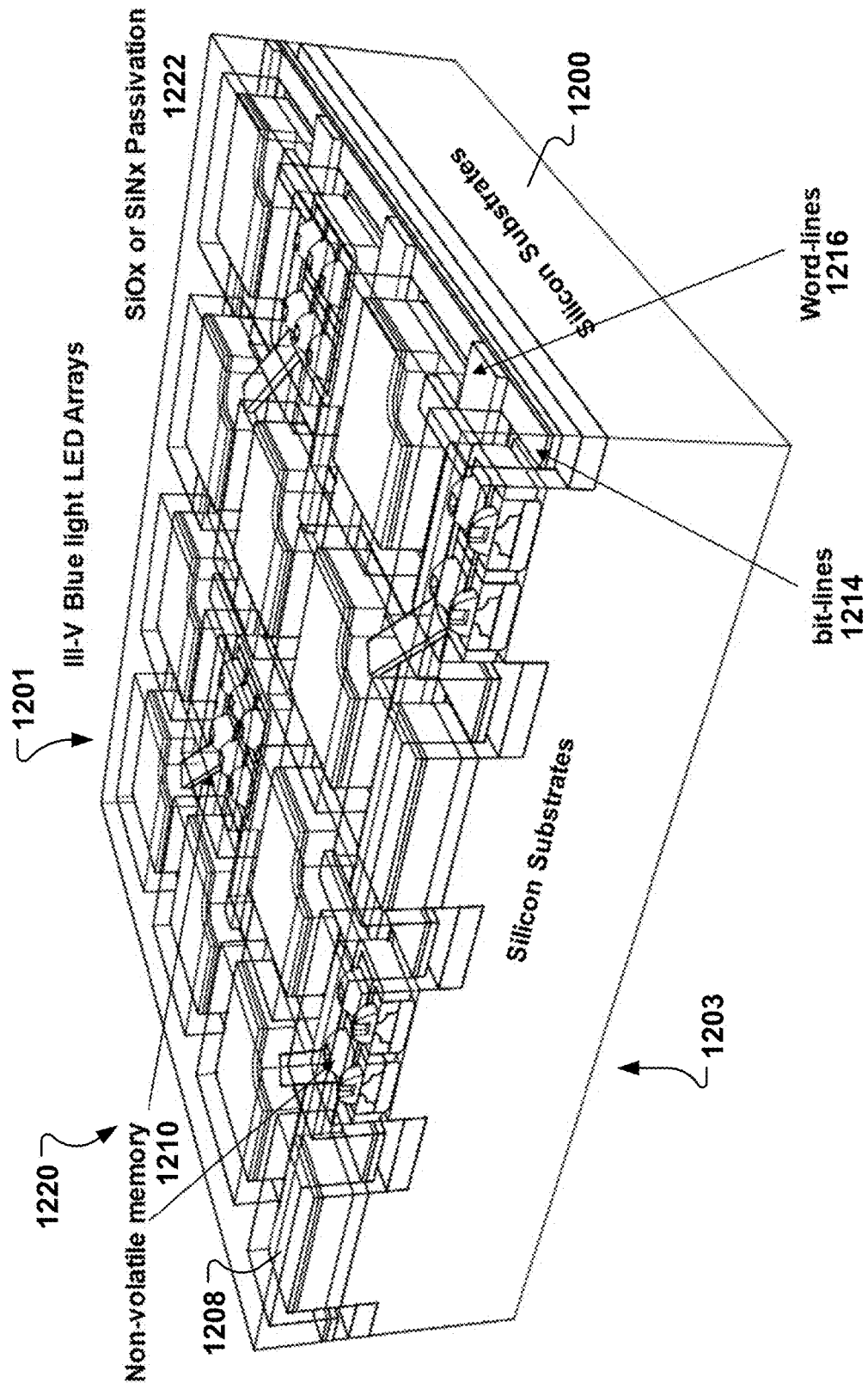
Figure 12I:
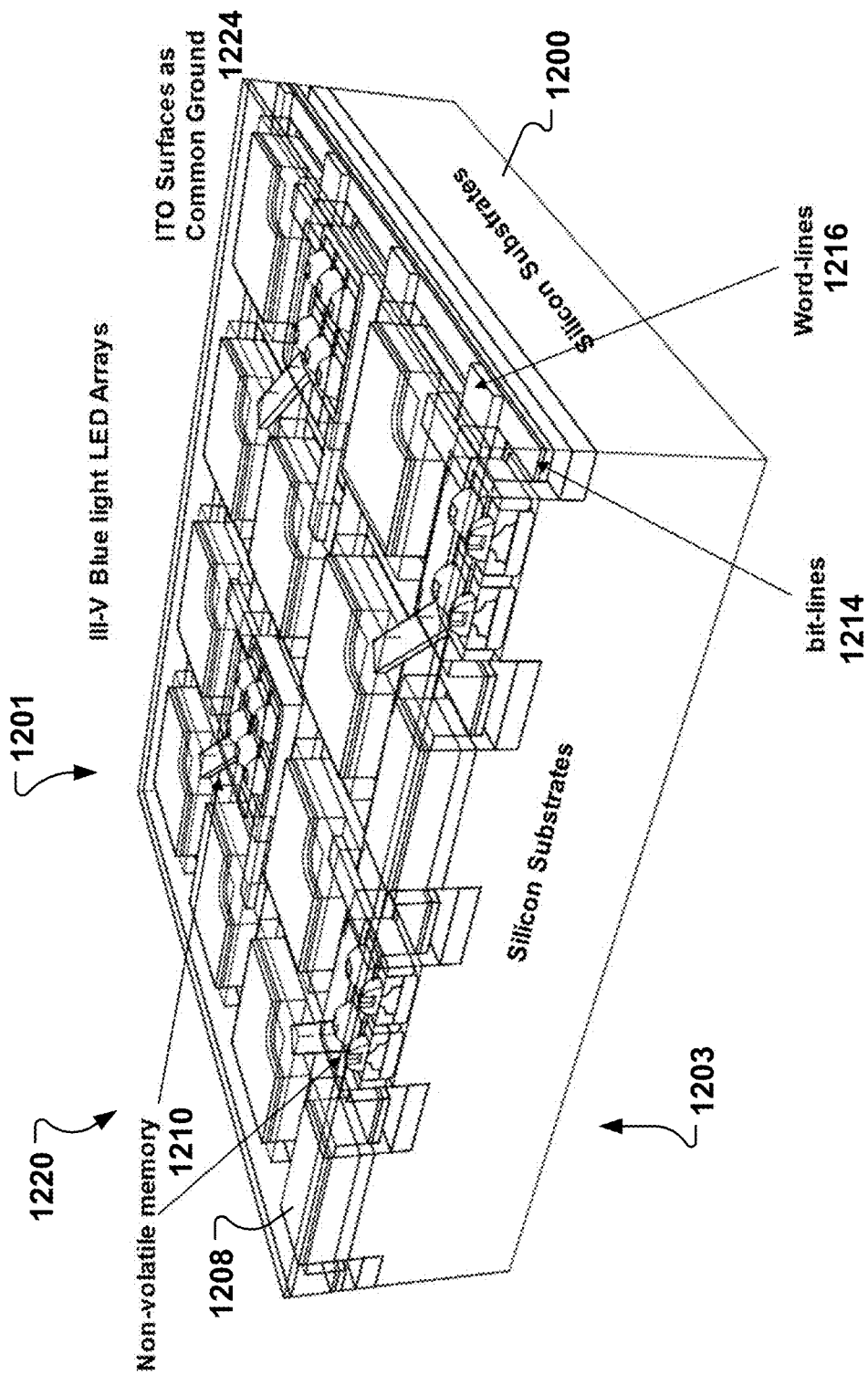
Figure 12J:
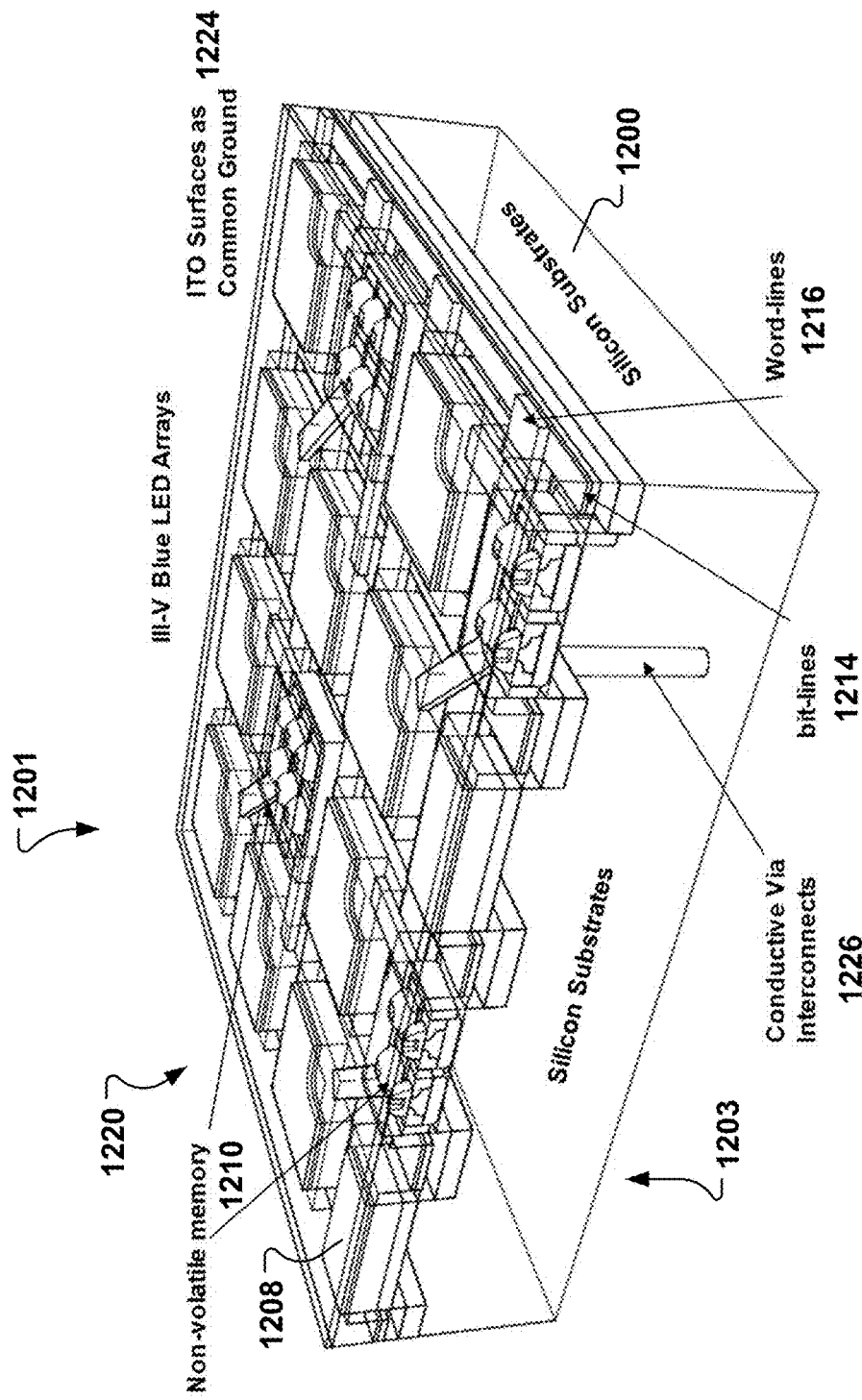

In some implementations, the non-volatile memories in the active-matrix light emitting pixels are formed on the first side, and each of the non-volatile memories is adjacent to one or more light emitting elements of a corresponding pixel, as illustrated in FIG. 12E.

In some examples, scanning drivers and data drivers are formed on the first side, but other integrated circuits, e.g., the controller and memory, are formed on the second side. The scanning drivers and the data drivers are conductively coupled to the one or more integrated circuits on the second side through the conductive interconnects. The word lines and bit lines are also formed on the first side and conductively coupled to the scanning drivers, the data drivers, and the non-volatile memories, such that each of the non-volatile memories is coupled to one of the scanning drivers through at least one word line and to one of the data drivers through at least one bit line.

For fabrication, after forming the array of light emitting elements on the first side, particular areas on the first side are selectively etched for forming the non-volatile memories and the scanning drivers and data drivers. For example, particular light emitting elements are selected to be etched for forming the non-volatile memories, such that a non-volatile memory can be adjacent to one or more light emitting elements, e.g., three light emitting elements, to form a corresponding pixel. Peripheral areas can be selected to be etched for forming the scanning drivers and data drivers. The etching can be into the substrate. Then open surfaces of the substrate on the particular areas can be cleaned and the non-volatile memories and the scanning drivers and data drivers are formed on the cleaned open surfaces. The word lines and the bit lines and conductive connections can be formed, e.g., on gaps between adjacent light emitting elements, to connect the non-volatile memories and the scanning drivers and data drivers.

Figure 12K:
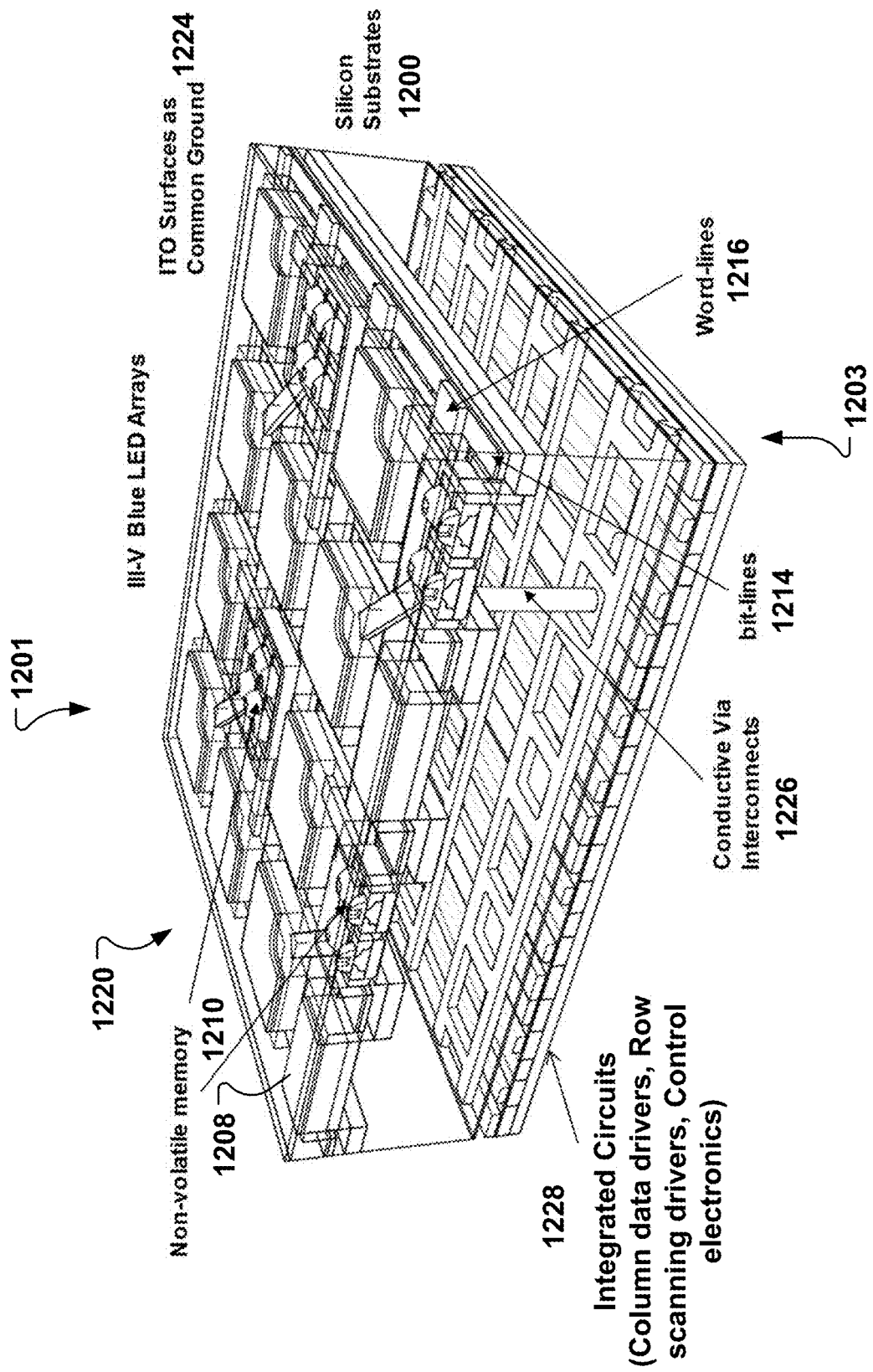

In some examples, as illustrated in FIG. 12K, the word lines and the bit lines are formed on the first side and conductively coupled to the non-volatile memories. Scanning drivers and data drivers are formed on the second side and conductively coupled to the one or more integrated circuits on the second side. The word lines and bit lines are conductively coupled to the scanning drivers and the data drivers through the conductive interconnects, such that each of the non-volatile memories is coupled to one of the scanning drivers through at least one word line and to one of the data drivers through at least one bit line.

For fabrication, after forming the array of light emitting elements on the first side, particular areas, e.g., particular light emitting elements, are selectively etched for forming the non-volatile memories, as illustrated in FIG. 12D. Then open surfaces of the substrate on the particular areas are cleaned and the non-volatile memories are formed on the open surfaces, as illustrated in FIG. 12E. Then the light emitting elements are selectively etched to open particular semiconductor layers for depositing Ohmic contacts, as illustrated in FIG. 12F. For example, when the light emitting element is an LED, the LED can be etched to a lower Group III-V compound layer under the quantum well layer. Then conductive electrodes can deposited on the particular semiconductor layers as Ohmic contacts of the light emitting elements. The word lines, the bit lines and conductive connections can be formed on the first side, such that the word lines and the bit lines are conductively coupled to the non-volatile memories, as illustrated in FIG. 12G.

In some examples, scanning drivers and data drivers are formed on the second side and conductively coupled to the one or more integrated circuits on the second side. Word lines and bit lines are also formed on the second side and coupled to the scanning drivers and the data drivers, respectively. The non-volatile memories are conductively coupled to the word lines and bit lines through the conductive interconnects, such that each of the non-volatile memories is coupled to one of the scanning drivers through at least one word line and to one of the data drivers through at least one bit line.

The non-volatile memories can be fabricated on the first side as noted above, e.g., as illustrated in FIGS. 12D and 12E. After the non-volatile memories, and/or the bit lines and word lines, and/or the scanning drivers and the data drivers, are formed on the first side, an insulating layer, e.g., SiOx or SiNx, can be deposited on surfaces of the first side, as illustrated in FIG. 12H. Then a top surface of the insulating layer is polished, e.g., by CMP, to expose surfaces of the light emitting elements. A conductive layer can be then formed on the surfaces of the light emitting elements to form a common ground for the light emitting elements, as illustrated in FIG. 12I.

Figure 11H:
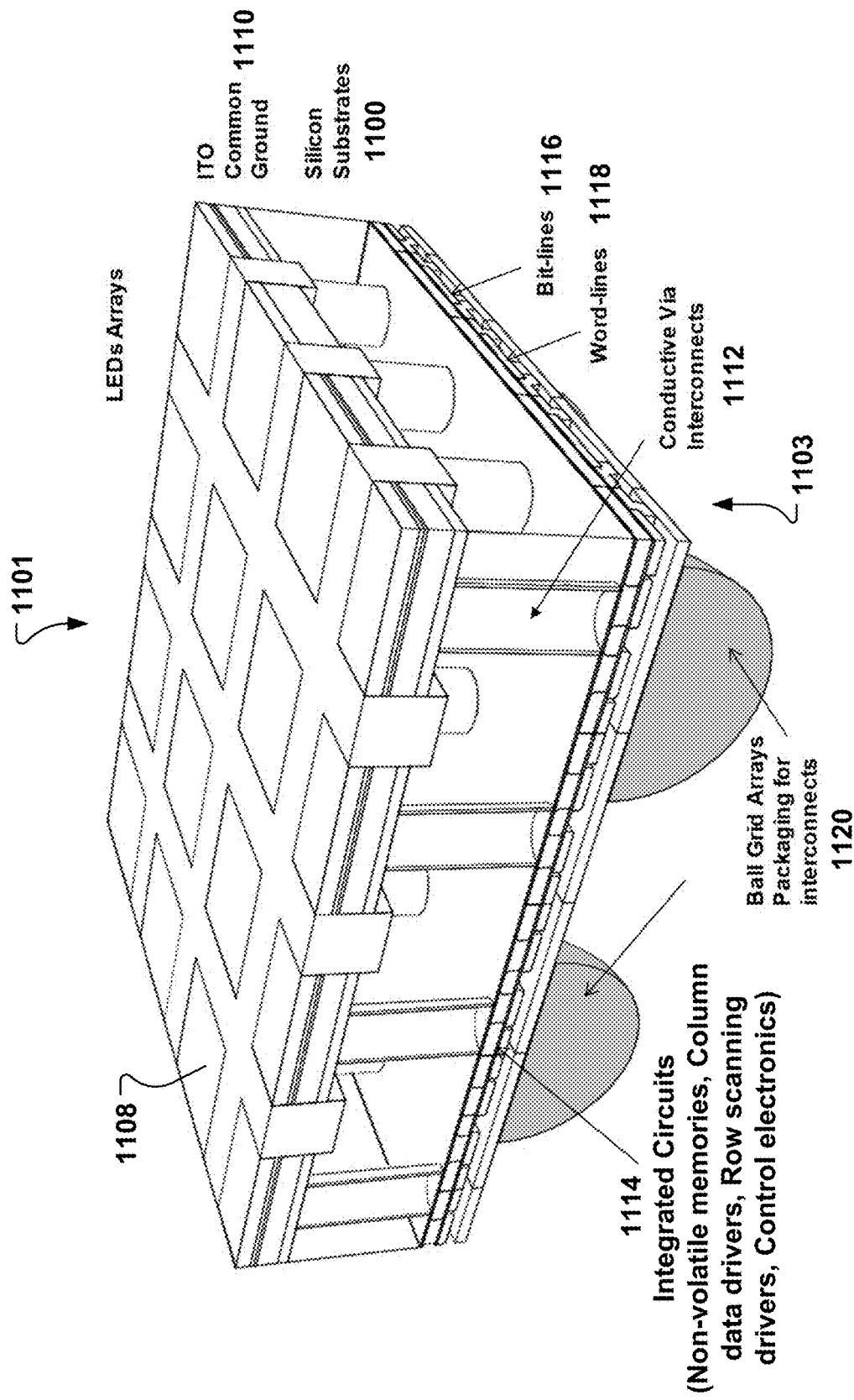

In some implementations, a conductive grid array package is further formed on the second side of the substrate and conductively coupled to the one or more integrated circuits for interconnects with other external devices or displays. As illustrated in FIG. 11H, the conductive grid array package can include a ball grid array (BGA) package, and the BGA package can be formed on a surface of the one or more integrated circuits. The conductive grid array package enables the formed integrated active-matrix light-emitting pixel array based display to form a larger display with other displays, as described in a U.S. patent application Ser. No. 15/396,135, entitled "LARGER DISPLAYS FORMED BY MULTIPLE INTEGRATED LED ARRAY MICRO-DISPLAYS" and filed on Dec. 30, 2016, whose content is hereby incorporated by reference in its entirety. The larger display can still have the advantages of integrated light emitting pixel arrays but overcome the current dimensional limit of displays fabricated by using standard wafers.

In some implementations, an array of active-matrix multi-color display pixels is formed using the array of active-matrix light emitting pixels. Each display pixel includes at least a first pixel element operable to emit light with a first color and a second pixel element to emit light with a second color, the second color being different from the first color. In some examples, each display pixel includes at least three pixel elements operable to emit light with at least three different colors including red, blue, and green. In a particular example, each display pixel includes four pixel elements operable to emit light with red, blue, green, and white.

Figure 11I:
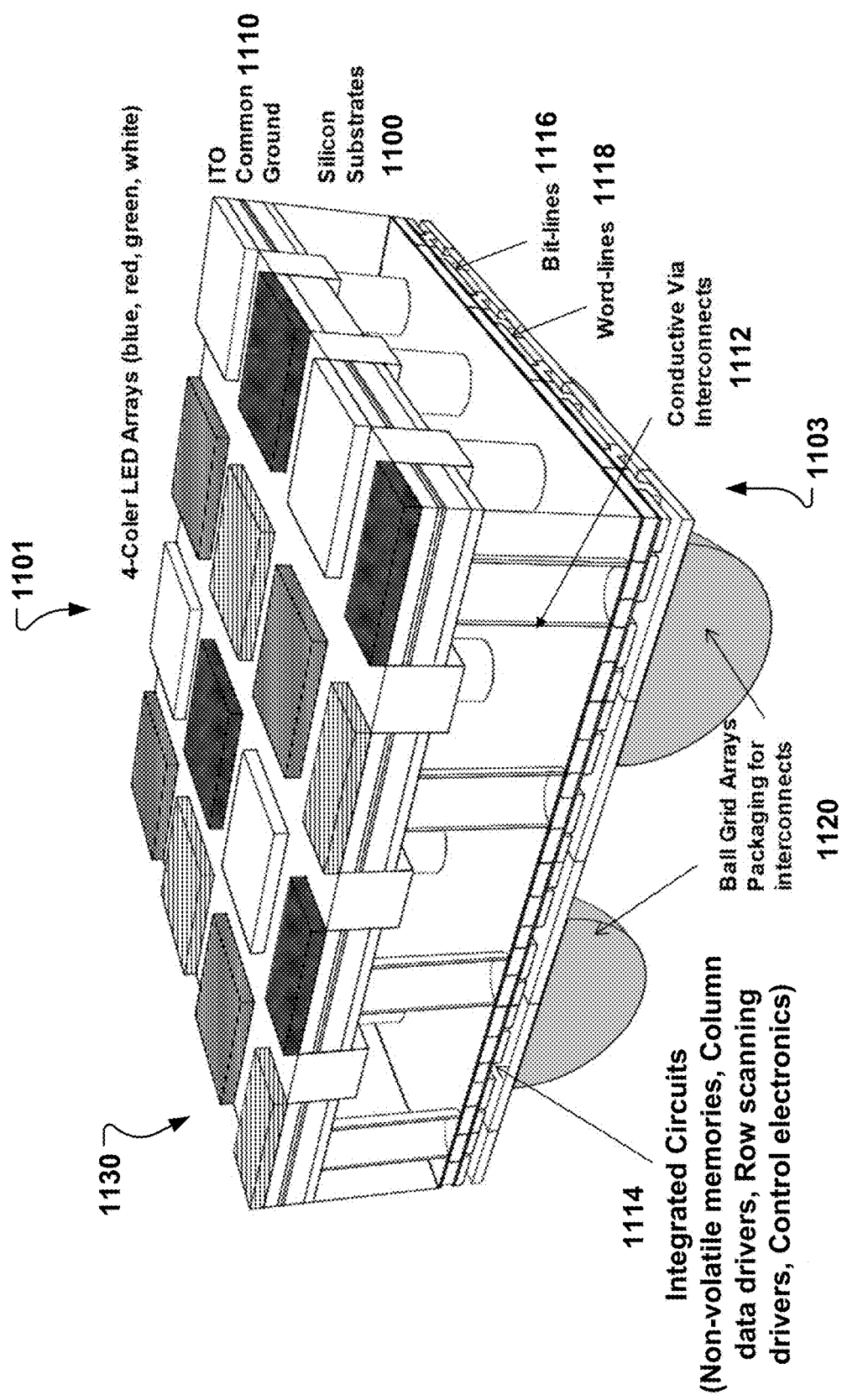

In some implementations, the array of active-matrix multi-color display pixels is formed by forming secondary color light emitting elements based on the previously-formed light emitting elements. For example, as illustrated in FIG. 11I, particular light emitting elements are selected by patterning the first side with photoresist, then a phosphor film or a quantum-dot film is deposited on the selected light-emitting elements. The photoresist is removed to thereby form the secondary color light emitting elements of the display pixels on the first side. The previous-formed light emitting elements is operable to emit light with a primary color. The secondary color light emitting elements is operable to emit light with a secondary color when exciting the phosphor film or the quantum-dot film with the light with the primary color. For example, secondary color LEDs, e.g., red color LEDs, green color LEDs, and white color LEDs, can be formed on surface of the LEDs, e.g., blue color LEDs, by using different color phosphor materials or different size quantum-dot (QD) materials.

Figure 11J:
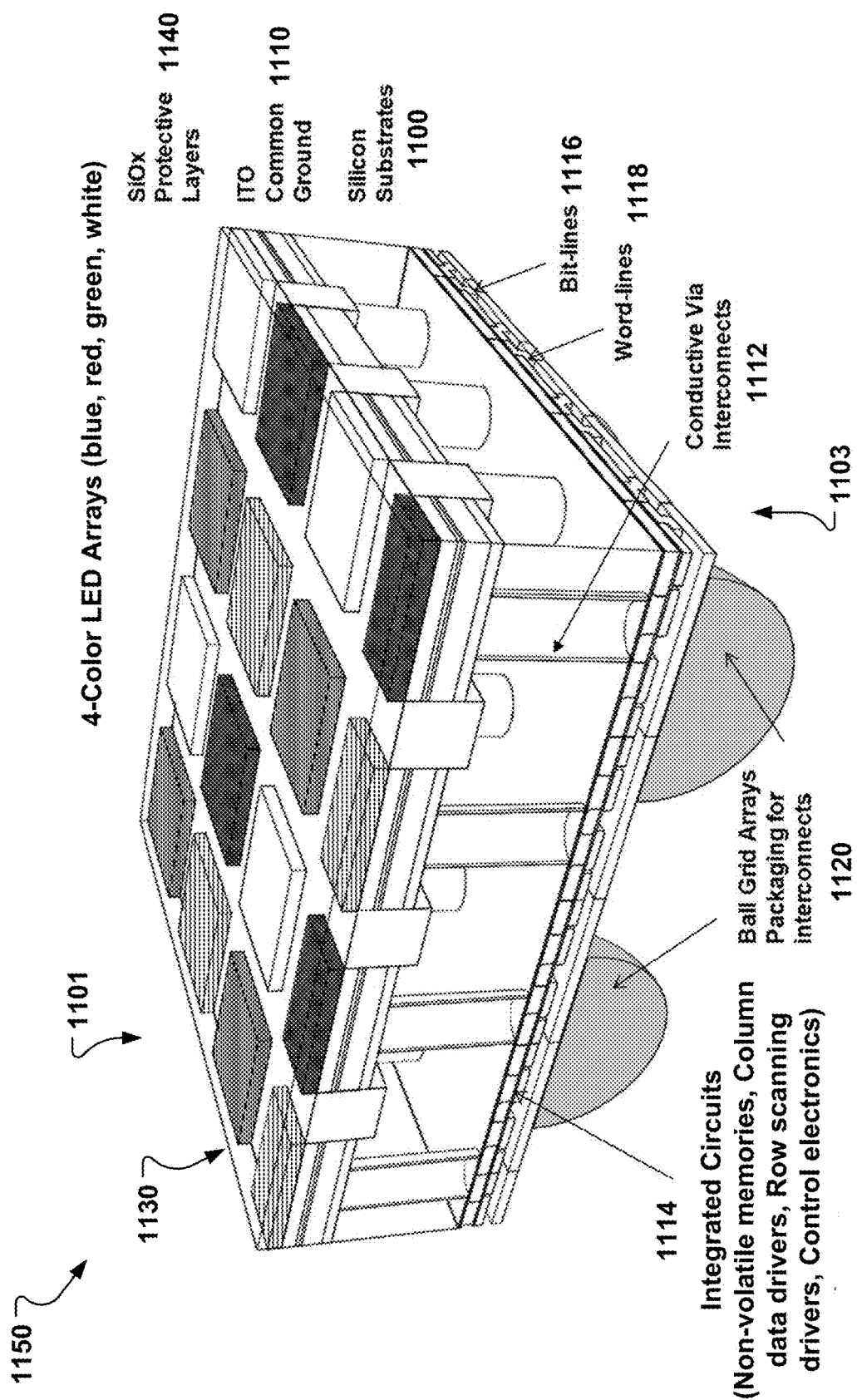

In some implementations, as illustrated in FIG. 11J, a protective layer is further formed on surfaces of the array of active-matrix multi-color display pixels. The protective layer can be made of transparent material, e.g., glass SiOx or plastic.

In the following, for illustration only, FIGS. 11A-11J show perspective views at different steps of forming an integrated active-matrix LED pixel array based display on a silicon (111) substrate according to the process 1000 of FIG. 10, where LEDs are formed on one side and non-volatile memories, connection lines (word lines and bit lines), display drivers (scanning drivers and data drivers), and integrated circuits (control electronics) are formed on the other side of the silicon (111) substrate. FIGS. 12A-12N show perspective views at different steps of forming an integrated active-matrix LED pixel array based display on a silicon (111) substrate according to the process 1000 of FIG. 10, where LED pixels including both LEDs and non-volatile memories together with connection lines are formed on one side of the silicon (111) substrate, and display drivers and integrated circuits are formed on the other side of the silicon (111) substrate.

Referring now to FIG. 11A-11J, perspective views at different steps of forming an integrated active-matrix LED pixel array based display 1150 on a silicon (111) substrate 1100, e.g., a silicon (111) wafer, are shown. The silicon (111) substrate 1100 has an upper side 1101 including a top surface 1102 and a lower side 1103 including a bottom surface 1104. The top surface 1102 and the bottom surface 1104 can be parallel to a (111) crystalline plane. The integrated LED array display 1150 can be formed by the following steps.

First, a light emitting structure 1106 is formed by depositing multiple semiconductor layers on the surface 1102 of the silicon substrate parallel to (111) crystalline plane on the first side 1101. The silicon (111) substrate 1100 can be pre-treated, e.g., by cleaning the surfaces 1102 and/or 1104. The multiple layers can be deposited by MOCVD, MBE, ALD, PVD, CVD, or any other suitable deposition methods in a vacuum chamber with a certain temperature. The multiple layers can include light-emitting layers, e.g., one or more quantum well layers, for emitting light with a specified wavelength.

As an example illustrated in FIG. 11A, III-V blue light LED structure 1106 is formed on the silicon (111) surface 1102 by using alternating pairs of InGaN layer and GaN:Si layer as the quantum well (MQW) layers. The LED structure 1106 can include one or more buffer layers deposited on the silicon (111) surface, one or more lower Group III-V compound layers on the buffer layers, one or more MQW layers on the lower Group III-V compound layers, and one or more upper Group III-V compound layers. In a particular example, the blue light LED structure 1106 is formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 µm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

Second, as illustrated in FIG. 11B, the substrate 1100 is thinned after forming the LED structure 1106 on the first side. The thinned substrate 1100 can have a thickness of about 100 µm to 300 µm. The substrate 1100 can be thinned at any suitable step before forming conductive interconnects, e.g., as illustrated in FIG. 11F, such that the thinned substrate 1100 can be easier to form the conductive interconnects.

Third, as illustrated in FIG. 11C, the LED structure 1106 is patterned to form an array of LEDs 1108 by etching through the LED structure 1106 into the silicon substrate 1100, such that adjacent LEDs 1108 are separated from each other, e.g., by gaps 1107. In some implementations, a hard mask layer, e.g., SiNx such as $Si_3N_4$, is used as a protective layer for patterning. The patterning of the LED structure 1106 can include: 1) patterning a hard mask layer on top of the LED structure 1106, e.g., on GaN:Mg layer of the LED structure 1106; 2) etching the semiconductor layers of the LED structure 1106, e.g., using reactive ion etching (RIE) or plasma etching; 3) removing the remaining hard mask layer.

Fourth, an isolation material is filled into gaps 1107 between adjacent LEDs 1108 on the first side. For example, a dielectric material such as SiOx can be deposited in the gaps 1107 by chemical vapor deposition (CVD). Then, topology planarization, e.g., polishing by chemical-mechanical polishing (CMP), is performed on the first side to form a flat surface across the array of LEDs 1108. The first side can be polished to expose doped surfaces of the LEDs 1108, e.g., to the top layer GaN:Mg. That is, the flat surface can include the exposed doped surfaces of all of the LEDs 1108, as illustrated in FIG. 11D.

Fifth, as shown in FIG. 11E, a conductive layer 1110, e.g., an ITO layer, is deposited on top of the doped surfaces of the LEDs 1108 to form electrical common ground.

Sixth, as shown in FIG. 11F, conductive interconnects 1112 are formed from the lower side 1103 to a bottom side of each LED 1108, which penetrate through the silicon substrate 1100. The conductive interconnects 1112 can be implemented with the following steps: 1) the silicon substrate 1100 is selectively etched, e.g., by deep RIE or plasma etch, from the lower side 1103 to form deep trenches underneath each of the LEDs 1108; 2) conductive electrodes are formed inside the deep trenches to form interconnects. In some cases, inner surfaces of the deep trenches are insulated and then metal is filled inside the deep trenches, e.g., by CVD, to form the conductive interconnects 1112 from the LEDs 1108 to the lower side 1103.

Seventh, as shown in FIG. 11G, integrated circuits 1114 are formed on the lower side 1103 and coupled to the LEDs 1108 via the conductive electrodes 1112. The integrated circuits 1114 can include non-volatile memories, column data drivers and row scanning drivers, and control electronics. Each of the non-volatile memories can be similar to the non-volatile memory 200 of FIG. 2A or the non-volatile memory 230 of FIG. 2B. The data drivers and the scanning drivers can be similar to the data drivers 114 and the scanning drivers 116 of FIG. 1B. The control electronics can be similar to the control electronics 104 of FIG. 1B. Each LED 1108 is coupled to a non-volatile memory through the conductive interconnects 1112 to form an active-matrix LED pixel. Each non-volatile memory can be coupled to a column data driver via at least one bit line 1116 and to a row scanning driver via at least one word line 1118. The bit lines 1116 and the word lines 1118 are formed on the bottom side 1103. The column data drivers and the scanning drivers are coupled to the control electronics via connections. Components in the control electronics can be connected to each other, e.g., via internal bus. The control electronics can include CPU/MPU, memory, A/D converters, D/A converters, amplifiers, and/or other ICs.

Eighth, as shown in FIG. 11H, a ball grid array (BGA) package 1120 is formed on the lower side 1103, e.g., on a surface of the ICs 1114. The BGA package 1120 can include a number of BGA solider balls on the ICs, e.g., no less than 4. A larger number of BGA solider balls with corresponding grid lines enables a higher connection resolution for the ICs 1114. The BGA package 1120 function as conductive interconnects to connect the ICs 1114 to other displays or to a control unit of a larger display.

Ninth, the silicon substrate 1100 is flipped back from the lower side 1103 to the upper side 1101. As shown in FIG. 11I, secondary color LEDs, e.g., red color LEDs, green color LEDs, white color LEDs, and blue color LEDs, can be formed based on the previously-formed LEDs 1108, e.g., blue color LED 1108. The different color LEDs can form multi-color LED pixels 1130. A white color LED can be included in each pixel to increase a sharpness of displayed images/pictures. As discussed above, secondary color LEDs can be formed on surface of the LEDs 508 by using different color phosphor materials or different size quantum-dot (QD) materials. In some implementations, an array of the multi-color LED pixels 1130 is formed by the following processes: 1) patterning using photoresist for specific color LEDs, e.g., red LEDs; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays, but with another specific color phosphor films or another specific size QD thin-films, e.g., green phosphor films or green QD thin-films; and 5) repeating the same processes above to form another specific color LED arrays, e.g., white LED arrays, but with another specific color phosphor films or another specific size QD thin-films, e.g., white phosphor films or white QD thin-films. In some examples, blue color LEDs in the pixels can be also formed by depositing corresponding blue color phosphor film or corresponding size QD thin film on the formed blue LEDs 1108. In such a way, blue light excited from the phosphor film or QD thin film by the blue LEDs 1108 can be more scattered (or uniform) across the pixels.

Tenth, as shown in FIG. 11J, a protective layer 1140 can be further formed on surfaces of the array of LEDs. The protective layer 1140 can be made of transparent material, e.g., glass SiOx or plastic. In some implementations, the protective layer can be coated with a conductive material, e.g., indium tin oxide (ITO). The protective layer is coupled to electrodes of individual LED pixels under the protective layer and forms a touch screen position sensor. The touch screen position sensor can use capacitive sensing. As noted above, a touch on the protective layer can be converted to a capacitance change which is detected by a touch screen detector/analyzer in the control electronics of the ICs 1114 through conductive connections.

Figure 11K:
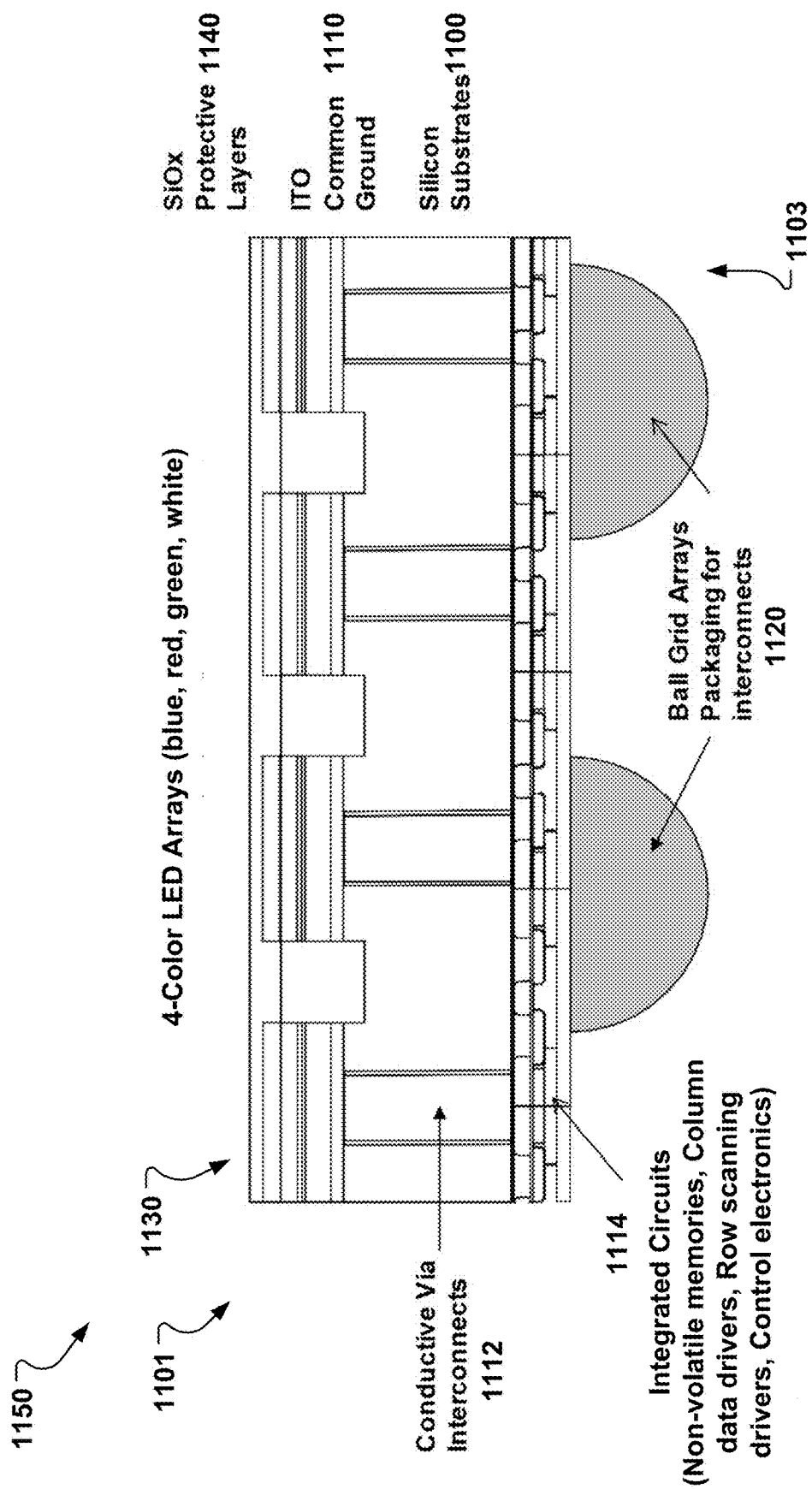

FIG. 11J shows an integrated active-matrix LED pixel array based display 1150 formed by the fabrication process as described above. FIG. 11K shows a cross-sectional view of the integrated LED pixel array based display 1150. The multi-color LEDs 1130 on the upper side 501 are coupled to the ICs 1114, e.g., the non-volatile memories, on the lower side 1103 through conductive electrodes 1112. As the non-volatile memories are on the lower side 1103, the number of LEDs 1108 on the upper side 1101 can be maximized. Also the LEDs 1108 can be formed on edges of the upper side 1101, such that when multiple displays 1150 are arranged together, a distance between adjacent LEDs on the edges of the displays can be minimized, e.g., less than 1 mm. Thus, the formed larger display by the multiple displays can be borderless, and the aspect ratio of the integrated LED display 550 can be maximized, e.g., to 90% or more. Note that an aspect ratio can be defined by an illumination area of LED pixels over a physical area of the LED pixels for a display.

Referring to FIGS. 12A-12N, perspective views at different steps of forming an integrated active-matrix LED pixel array based display 1250 on a silicon (111) substrate 1200 are shown. Compared to the integrated active-matrix LED pixel array based display 1150, the LED display 1250 have LEDs and non-volatile memories on the same side of the silicon (111) substrate to form active-matrix LED pixels, which may reduce the number of conductive interconnects penetrating through the silicon substrate, although an aspect ratio of the LED display 1250 may be smaller than the LED display 1150. For example, the aspect ratio of the LED display 1250 can be about 70% or more.

The silicon (111) substrate 1200 has an upper side 1201 including a top surface 1202 and a lower side 1203 including a bottom surface 1204. The top surface 1202 and the bottom surface 1204 can be parallel to a (111) crystalline plane. The silicon (111) substrate 1200 can be pre-treated, e.g., by cleaning the surfaces 1202 and 1204. The integrated LED display 1250 can be formed by the following steps.

First, a light emitting structure 1206 is formed by depositing multiple semiconductor layers on the surface 1202 on the first side 1201. The multiple layers can be deposited by MOCVD, MBE, ALD, PVD, CVD, or any other suitable deposition methods in a vacuum chamber with a certain temperature. The multiple layers can include light-emitting layers, e.g., one or more quantum well layers, for emitting light with a specified wavelength.

As an example illustrated in FIG. 12A, III-V blue light LED structure 1206 is formed on the silicon (111) surface 1202 by using alternating pairs of InGaN layer and GaN:Si layer as the quantum well (MQW) layers. In a particular example, the blue light LED structure 1206 is formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN: Si layer under 1200° C., 5 pairs of 5-nm InGaN layer and 10 nm-GaN: Si layer under 800° C., 10 nm-AlGaN:Mg layer under 1200° C., and 300 nm-GaN:Mg layer under 1200° C.

Second, as illustrated in FIG. 12B, the substrate 1200 is thinned after forming the LED structure 1206 on the first side. The thinned substrate 1100 can have a thickness of about 100 μm to 300 μm. The substrate 1200 can be also thinned right before forming conductive interconnects as illustrated in FIG. 12J.

Third, as illustrated in FIG. 12C, the LED structure 1206 is patterned to form an array of LEDs 1208 by etching through the LED structure 1206 into the silicon substrate 1200, such that adjacent LEDs 1208 are separated from each other, e.g., by gaps 1207.

Fourth, particular areas for forming non-volatile memories, bit lines, word lines, and/or interconnects are selectively opened, e.g., by etching, and/or cleaned to prepare for forming these components. As illustrated in FIG. 12D, the areas including particular LEDs 1208 are selectively etched through to expose silicon surfaces 1209. The exposed silicon surfaces 1209 can be cleaned. The bit lines and the word lines and interconnects can be formed on the gaps 1207 between adjacent LEDs.

Fifth, as illustrated in FIG. 12E, non-volatile memories 1210 are formed on the cleaned open silicon surfaces 1207 on the upper side 1201 of the silicon substrate 1200. Each non-volatile memory 1210 can be coupled to a respective LED or multiple LEDs to form an active-matrix LED pixel. The non-volatile memory 1210 can be arranged adjacent to the three LEDs 1208 in the same pixel.

Sixth, as illustrated in FIG. 12F, the LEDs 1208 are selectively etched to open for forming Ohmic contacts 1212 of the LEDs 1208. For example, the LEDs 1208 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the Ohmic contacts 1212. A top layer of the LEDs 1208 can be an n-doped Group III-V compound layer, and a p-type electrode (anode), e.g., a conductive ITO layer, can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 1212; the top layer of the LEDs can be p-doped Group III-V compound layer, e.g., p-GaN, and a n-type electrode (cathode) can be formed on the p-doped Group III-V compound layer.

Seventh, as illustrated in FIG. 12G, bit lines 1214 and word lines 1216 are formed, e.g., in multiple rows and columns, respectively. The bit lines 1214 and word lines 1216 are conductively connected to the non-volatile memories 1210. Particularly, each non-volatile memory 1210 is connected to at least one respective column bit line 1214 and to at least one respective row word line 1216. Interconnects 1218 between the Ohmic contacts 1212 of the LEDs 1208 and the non-volatile memories 1210 and between the non-volatile memories 1210 and the bit lines 1214 and the word lines 1216 are also formed. In such a way, each LED 1208 is conductively coupled to a non-volatile memory 1210 that is further coupled to at least one corresponding bit line 1214 and to at least one corresponding word line 1216. Each non-volatile memory 1210 can be conductively coupled to one or more LEDs 1208 through the interconnects 1218 to form an active-matrix LED pixel 1220. For example, as illustrated in FIG. 12G, an active-matrix LED pixel 1220 includes three LEDs 1208 and one non-volatile memory 1210 coupled to the three LEDs 1208.

Eighth, as illustrated in FIG. 12H, an insulating layer 1222, e.g., a transparent SiOx or SiNx layer, is formed to cover surfaces of the silicon substrate, including the LED pixel arrays. The insulating layer 1222 can be deposited on the surfaces by MOCVD, ALD, PVD, CVD, or any suitable deposition methods.

Ninth, the upper side 1201 of the silicon substrate 1200 is polished, e.g., by chemical-mechanical planarization (CMP) polish, to expose doped surfaces of all the LEDs 1208, e.g., to the top layer GaN:Mg. Then, as shown in FIG. 12I, a conductive layer 1224, e.g., an ITO layer, is deposited on top of the doped surfaces of the LEDs 1208 to form electrical common ground.

All the above steps are performed on the upper side 1201 of the silicon substrate 1200. In the following tenth step, the silicon substrate 1200 is flipped from the upper side 1201 to the lower side 1203, and a plurality of deep trenches (or through-holes) are formed from the lower side 1203, through the substrate 1200, and towards the upper side 1201. The deep trenches can be formed by deep etching, e.g., deep RIE or plasma etch. Then conductive electrodes are formed inside the deep trenches to form interconnects 1226, as shown in FIG. 12J. In some cases, inner surfaces of the deep trenches are insulated and then metals are filled inside the deep trenches to form the conductive electrodes. The interconnects 1226 are configured to connect the column bit lines 1214 and the row word lines 1216 to data drivers and scanning drivers to be formed on the lower side 1203. As each column bit line 1214 is coupled to a column of non-volatile memories 1210 and each row word line 1216 is coupled to a row of non-volatile memories 1210, the number of interconnects 1226 can be smaller than the total number of non-volatile memories 1210.

Eleventh, as illustrated in FIG. 12K, integrated circuits 1228 is formed on a bottom surface of the lower side 1203 of the silicon substrate 1200. The integrated circuits 1228 can include column data drivers, row scanning drivers and control electronics (e.g., CPU/MPU, memory, A/D converters, D/A converters, amplifiers, and other ICs). The data drivers and the scanning drivers can be similar to the data drivers 114 and the scanning drivers 116 of FIG. 1B. The control electronics can be similar to the control electronics 104 of FIG. 1B. Components in the integrated circuits 1228 can be connected to each other via conductive connections, e.g., via an internal bus. The control electronics is coupled to the data drivers and the scanning drivers through the conductive connections. The data drivers and the scanning drivers on the lower side 1203 are coupled to the bit lines and the word lines on the upper side 1201 through conductive interconnects 1226 that penetrate through the silicon substrate 1200, such that each non-volatile memory 1210 is coupled to a respective data driver through at least one bit line 1214 and to a respective scanning driver through at least one word line 1216.

Figure 12L:
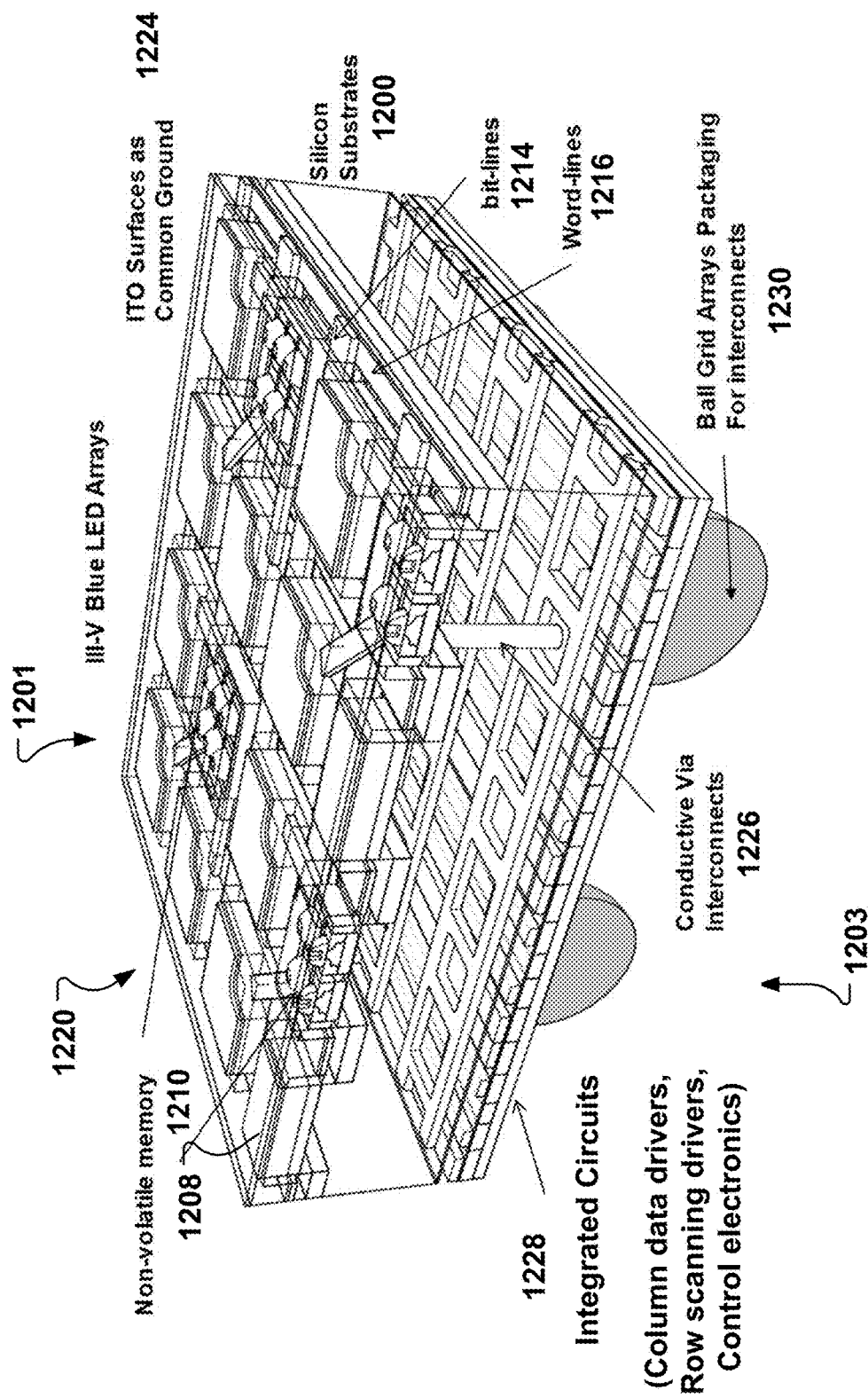

Twelfth, as shown in FIG. 12L, a ball grid array (BGA) package 1230 is formed on the lower side 1203, e.g., on a surface of the ICs 1228. The BGA package 1230 can include a number of BGA solider balls on the ICs. A larger number of BGA solider balls with corresponding grid lines enables a higher connection resolution for the ICs 1228. The BGA package 1230 can function as conductive interconnects to connect the ICs 1228 to other displays or to a control unit of a larger display.

Figure 12M:
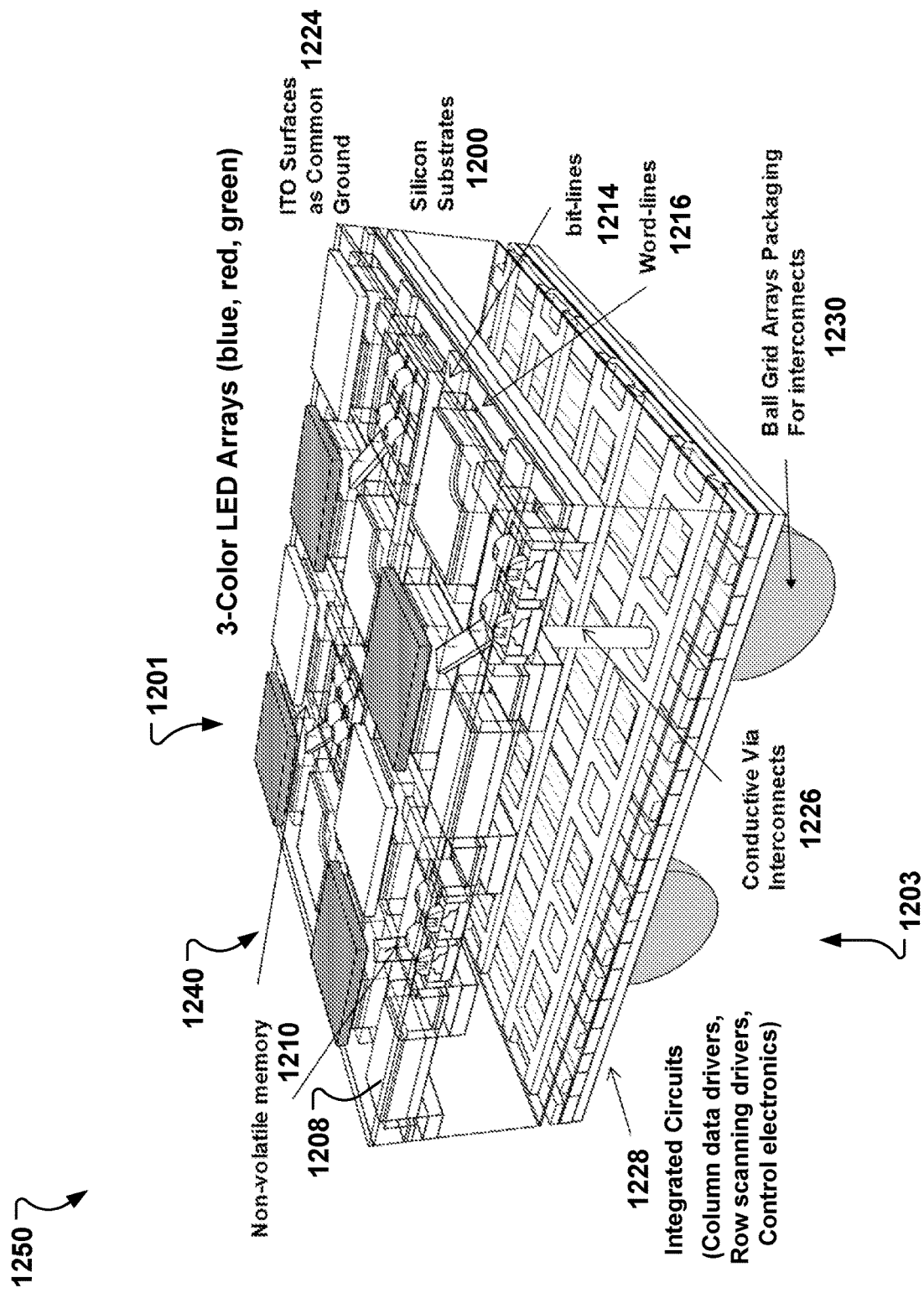
Figure 12N:
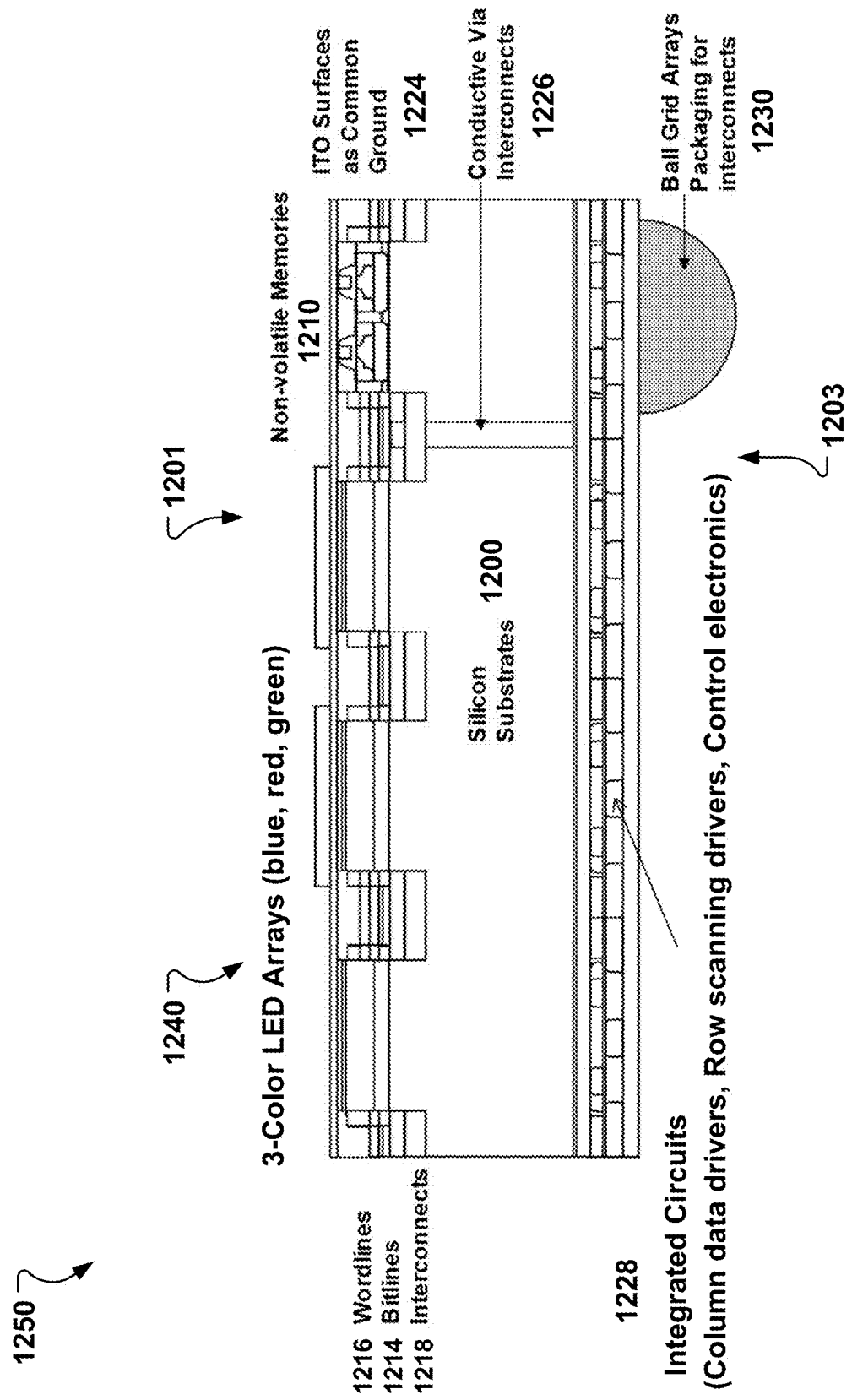

Thirteenth, as shown in FIG. 12M, the silicon substrate 1200 is flipped back from the lower side 1203 to the upper side 1201. Secondary color LEDs, e.g., red color LEDs and green color LEDs, can be formed based on the previously-formed LEDs 1208, e.g., blue color LED 1208. The different color LEDs can form a multi-color LED pixel 1240. As illustrated in FIG. 12M, the 3-color LED pixel 1240 includes blue, green, red color LEDs. Secondary color LEDs can be formed on surface of the LEDs 1208 by using different color phosphor materials or different size quantum-dot (QD) materials.

In some implementations, an array of the multi-color LED pixels 660 is formed by the following processes: 1) patterning using photoresist for specific color LEDs, e.g., red LEDs; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays, but with another specific color phosphor films or another specific size QD thin-films, e.g., green phosphor films or green QD thin-films. In some examples, blue color LEDs in the pixels can be also formed by depositing corresponding blue color phosphor film or corresponding size QD thin film on the formed blue LEDs 1208. In such a way, blue light excited from the phosphor film or QD thin film by the blue LEDs 1208 can be more scattered (or uniform) across the pixels. In a particular example, a white LED can be also formed to be included in each pixel to increase a sharpness of displayed images/pictures.

FIG. 12M shows the formed integrated active-matrix LED pixel array display 1250 formed by the fabrication process as described above. FIG. 12N shows a cross-sectional view of the integrated LED array display 1250.

After forming the multi-color LED pixel array based display 1250, a protective layer can be further formed on surfaces of the array of LED pixels. The protective layer can be made of transparent material, e.g., glass or plastic, coated with a conductive material, e.g., indium tin oxide (ITO). The protective layer is coupled to non-volatile memories 1210 in the LED pixels 1240 under the protective layer and forms, with the non-volatile memories 1210, a touch screen position sensor. The touch screen position sensor can use capacitive sensing. As noted above, a touch on the protective layer can be converted to a capacitance change which is detected by a touch screen detector/analyzer in the integrated circuits 1228 through conductive connections between the non-volatile memories 1210 and the data drivers/scanning drivers, and interconnects 1226.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Nevertheless, it will be understood that various modifications may be made without departing from the spirit and scope of the subject matter. Accordingly, other embodiments are within the scope of the following claims.

What is claimed is:

1. A method of fabricating an integrated active-matrix light emitting pixel array based device on a semiconductor substrate, the method comprising:
forming an array of light emitting elements of the integrated active-matrix light emitting pixel array based device on a first side of the semiconductor substrate by directly and epitaxially growing a plurality of semiconductor layers of the light emitting elements on a semiconductor surface of the semiconductor substrate on the first side of the semiconductor substrate; and
forming an array of active-matrix light emitting pixels of the integrated active-matrix light emitting pixel array based device on the semiconductor substrate using the array of light emitting elements, each of the active-matrix light emitting pixels including at least one light emitting element formed on the semiconductor substrate and at least one non-volatile memory formed on the semiconductor substrate and coupled to the at least one light-emitting element, the at least one non-volatile memory comprising at least one transistor.

2. The method of claim 1, wherein forming an array of light emitting elements comprises:
 forming the plurality of semiconductor layers on the first side of the semiconductor substrate to form a light emitting structure; and
 patterning the light emitting structure to form the array of light emitting elements.

3. The method of claim 2, wherein patterning the light emitting structure comprises etching, with a patterned mask, through the semiconductor layers into the substrate, such that the light emitting elements are separated from each other.

4. The method of claim 2, wherein the formed light-emitting structure is configured to be activated to emit light with a single color, and each of the light emitting elements is configured to emit light with the single color.

5. The method of claim 1, wherein the semiconductor layers comprise one or more quantum well layers including Group III-V compounds, and each of the light emitting elements comprises a light emitting diode (LED).

6. The method of claim 5, wherein the semiconductor layers comprise a plurality of pairs of alternating GaN:Si layer and InGaN layer, and each of the light emitting elements comprises a blue LED operable to emit blue light.

7. The method of claim 1, further comprising:
 before forming the conductive interconnects, thinning the substrate from the second side.

8. The method of claim 1, further comprising:
 filling an isolation material in gaps between adjacent light emitting elements of the array of light emitting elements on the first side.

9. The method of claim 8, wherein filling the isolation material in the gaps comprises depositing a dielectric material in the gaps by chemical vapor deposition (CVD).

10. The method of claim 8, further comprising:
 polishing the first side to form a flat surface across the array of light emitting diodes.

11. The method of claim 10, wherein polishing the first side comprises using chemical-mechanical polishing (CMP).

12. The method of claim 1, further comprising:
 forming a conductive layer on the first side to form a common ground for the array of light emitting elements.

13. The method of claim 12, wherein the conductive layer comprises indium tin oxide (ITO).

14. The method of claim 1, further comprising:
 forming conductive interconnects penetrating through the semiconductor substrate from a second side of the semiconductor substrate to the first side of the semiconductor substrate; and
 forming one or more integrated circuits of the integrated active-matrix light emitting pixel array based device on the second side of the semiconductor substrate, the one or more integrated circuits being conductively coupled to the array of active-matrix light-emitting pixels through the conductive interconnects.

15. The method of claim 14, wherein forming the array of active-matrix light emitting pixels comprises:

forming a plurality of non-volatile memories on the second side; and
conductively connecting the array of light-emitting elements on the first side to the plurality of non-volatile memories on the second side via the conductive interconnects.

16. The method of claim 15, further comprising:
 forming scanning drivers and data drivers on the second side, wherein the scanning drivers and the data drivers are conductively coupled to the one or more integrated circuits on the second side; and
 forming word lines and bit lines on the second side and conductively coupled to the non-volatile memories, such that each of the non-volatile memories is coupled to one of the scanning drivers through at least one word line and to one of the data drivers through at least one bit line.

17. The method of claim 14, wherein forming the array of active-matrix light emitting pixels comprises:
 forming a plurality of non-volatile memories on the first side, each of the non-volatile memories being adjacent to one or more light emitting elements of a corresponding pixel.

18. The method of claim 17, further comprising:
 forming scanning drivers and data drivers on the first side, wherein the scanning drivers and the data drivers are conductively coupled to the one or more integrated circuits on the second side through the conductive interconnects; and
 forming word lines and bit lines on the first side, such that each of the non-volatile memories is coupled to one of the scanning drivers through at least one word line and to one of the data drivers through at least one bit line.

19. The method of claim 18, wherein forming the plurality of non-volatile memories and the scanning drivers and data drivers comprises:
 selectively etching particular areas on the first side into the substrate;
 cleaning open surfaces of the substrate on the first side; and
 forming the plurality of non-volatile memories and the scanning drivers and data drivers on the open surfaces.

20. The method of claim 17, further comprising:
 forming word lines and bit lines on the first side and conductively coupled to the plurality of non-volatile memories; and
 forming scanning drivers and data drivers on the second side and conductively coupled to the one or more integrated circuits on the second side,
 wherein the word lines and bit lines are conductively coupled to the scanning drivers and the data drivers through the conductive interconnects, such that each of the non-volatile memories is coupled to one of the scanning drivers through at least one word line and to one of the data drivers through at least one bit line.

21. The method of claim 20, wherein forming the plurality of non-volatile memories and the word lines and bit lines on the first side comprises:
 selectively etching particular areas on the first side into the substrate;
 cleaning open surfaces of the substrate;
 forming the plurality of non-volatile memories on the open surfaces on the particular areas;
 selectively etching the light emitting elements to open particular semiconductor layers and depositing conductive electrodes on the particular semiconductor layers as Ohmic contacts of the light emitting elements; and forming the word lines and bit lines and conductive connections on the first side, such that the word lines and the bit lines are conductively coupled to the plurality of non-volatile memories.

22. The method of claim 17, further comprising:

forming scanning drivers and data drivers on the second side, wherein the scanning drivers and the data drivers are conductively coupled to the one or more integrated circuits on the second side; and forming word lines and bit lines on the second side and coupled to the scanning drivers and the data drivers, respectively, wherein the non-volatile memories are conductively coupled to the word lines and bit lines through the conductive interconnects, such that each of the non-volatile memories is coupled to one of the scanning drivers through at least one word line and to one of the data drivers through at least one bit line.

23. The method of claim 1, further comprising:

depositing an insulating layer on the first side;

polishing a surface of the insulating layer to expose surfaces of the light emitting elements; and forming a conductive layer on the surfaces of the light emitting pixels to form a common ground for the array of light emitting elements.

24. The method of claim 14, wherein the one or more integrated circuits comprise at least one of:

one or more digital signal processors including at least one of: a digital signal analyzer, a digital processor, an image processor, a volatile memory, a non-volatile memory, or a touch screen processor; or one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

25. The method of claim 14, further comprising:

forming a conductive grid array package on the second side of the substrate and conductively coupling the conductive grid array package to the one or more integrated circuits.

26. The method of claim 25, wherein the conductive grid array package comprises a ball grid array (BGA) package, and the BGA package is formed on a surface of the one or more integrated circuits.

27. The method of claim 1, wherein each of the light-emitting elements is operable to emit light with a first color, wherein the method further comprises:

forming an array of active-matrix multi-color display pixels using the array of active-matrix light-emitting pixels, each display pixel including at least a first pixel element operable to emit light with the first color and a second pixel element to emit light with a second color, the second color being different from the first color.

28. The method of claim 27, wherein each display pixel comprises at least three pixel elements operable to emit light with at least three different colors including red, blue, and green.

29. The method of claim 27, wherein forming the array of active-matrix multi-color display pixels comprises:

patterning the first side with photoresist to select particular light-emitting elements;

depositing a phosphor film or a quantum-dot film on the selected light-emitting elements; and removing the photoresist to form the second pixel elements of the display pixels.

30. The method of claim 27, further comprising:

forming a protective layer on top of the array of active-matrix multi-color display pixels.

31. The method of claim 14, wherein the substrate comprises a silicon semiconductor substrate, wherein the silicon semiconductor substrate has a first surface having a (111) orientation on the first side and a second surface having a (111) orientation on the second side and opposite to the first surface, and wherein the array of light-emitting elements are formed on the first surface, and the one or more integrated circuits are formed on the second surface.

32. An integrated active-matrix light emitting pixel array based device comprising:

a semiconductor substrate including a first side and a second side; and an array of active-matrix light-emitting pixels at least partially on the first side of the semiconductor substrate, each pixel including one or more light-emitting elements and at least one non-volatile memory coupled to the one or more light-emitting elements, each of the light-emitting elements of the pixels including same semiconductor layers directly and epitaxially grown on a semiconductor surface of the semiconductor substrate on the first side and operable to emit light with a same primary color, the at least one non-volatile memory being formed on the semiconductor substrate and comprising at least one transistor.

33. The integrated active-matrix light emitting pixel array based device of claim 32, further comprising:

one or more integrated circuits on the second side of the semiconductor substrate; and conductive interconnects penetrating through the semiconductor substrate and conductively coupling the array of active-matrix light-emitting pixels to the one or more integrated circuits, wherein the non-volatile memories of the pixels are on the second side and conductively coupled to the light-emitting elements through the conductive interconnects;

scanning drivers and data drivers on the second side and conductively coupled to the one or more integrated circuits on the second side; and word lines and bit lines on the second side and conductively coupled to the non-volatile memories, such that each of the non-volatile memories is coupled to one of the scanning drivers through at least one word line and to one of the data drivers through at least one bit line.

34. The integrated active-matrix light emitting pixel array based device of claim 32, wherein the non-volatile memories of the pixels are on the first side and conductively coupled to the light-emitting elements, each of the non-volatile memories being arranged adjacent to one or more light emitting elements of a corresponding pixel.

35. The integrated active-matrix light emitting pixel array based device of claim 34, further comprising:

one or more integrated circuits on the second side of the semiconductor substrate;

conductive interconnects penetrating through the semiconductor substrate and conductively coupling the array of active-matrix light-emitting pixels to the one or more integrated circuits;

scanning drivers and data drivers on the first side, wherein the scanning drivers and the data drivers are conductively coupled to the one or more integrated circuits on the second side through the conductive interconnects; and word lines and bit lines on the first side and conductively coupled to the scanning drivers and the data drivers, wherein each of the non-volatile memories is coupled to one of the scanning drivers through at least one word line and to one of the data drivers through at least one bit line.

36. The integrated active-matrix light emitting pixel array based device of claim 34, further comprising:
one or more integrated circuits on the second side of the semiconductor substrate;
conductive interconnects penetrating through the semiconductor substrate and conductively coupling the array of active-matrix light-emitting pixels to the one or more integrated circuits;
scanning drivers and data drivers on the second side and conductively coupled to the one or more integrated circuits on the second side; and
word lines and bit lines on the first side and conductively coupled to the non-volatile memories,
wherein the word lines and the bit lines are coupled to the scanning drivers and the data drivers through the conductive interconnects, respectively, such that each of the non-volatile memories is coupled to one of the scanning drivers through at least one word line and to one of the data drivers through at least one bit line.

37. The integrated active-matrix light emitting pixel array based device of claim 34, further comprising:
one or more integrated circuits on the second side of the semiconductor substrate;
conductive interconnects penetrating through the semiconductor substrate and conductively coupling the array of active-matrix light-emitting pixels to the one or more integrated circuits;
scanning drivers and data drivers on the second side and conductively coupled to the one or more integrated circuits on the second side; and
word lines and bit lines on the second side and conductively coupled to the scanning drivers and the data drivers, respectively,
wherein the non-volatile memories are coupled to the word lines and the bit lines through the conductive interconnects, such that each of the non-volatile memories is coupled to one of the scanning drivers through at least one word line and to one of the data drivers through at least one bit line.

38. The integrated active-matrix light emitting pixel array based device of claim 32, wherein, for each pixel, at least one of the light emitting elements comprises a phosphor film or a quantum dot film on the semiconductor layers and is operable to emit secondary light based on the light with the primary color.

39. The integrated active-matrix light emitting pixel array based device of claim 32, wherein the light emitting elements are isolated by an isolation material.

40. The integrated active-matrix light emitting pixel array based device of claim 32, further comprising:
one or more integrated circuits on the second side of the semiconductor substrate;
conductive interconnects penetrating through the semiconductor substrate and conductively coupling the array of active-matrix light-emitting pixels to the one or more integrated circuits; and
a conductive grid array package on the second side of the substrate and conductively coupled to the one or more integrated circuits.

41. The integrated active-matrix light emitting pixel array based device of claim 32, further comprising:
one or more integrated circuits on the second side of the semiconductor substrate;
conductive interconnects penetrating through the semiconductor substrate and conductively coupling the array of active-matrix light-emitting pixels to the one or more integrated circuits;
wherein the one or more integrated circuits comprise at least one of:
one or more digital signal processors including at least one of: a digital signal analyzer, a digital processor, an image processor, a volatile memory, a non-volatile memory, or a touch screen processor; or
one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

42. A method of fabricating an integrate active-matrix light emitting diode (LED) pixel array based display on a silicon substrate, the method comprising:
forming an array of LEDs on a first side of the silicon substrate by directly and epitaxially growing a plurality of semiconductor layers on a silicon semiconductor surface on the first side of the silicon substrate to form an LED structure and patterning the LED structure formed on the first side of the silicon substrate, the semiconductor layers including one or more quantum well layers having Group III-V compounds;
forming an array of active-matrix LED pixels by using the array of LEDs, wherein each LED pixel includes at least two LEDs formed on the silicon substrate and at least one non-volatile memory formed on the silicon substrate and coupled to the at least two LEDs, the at least one non-volatile memory comprising at least one transistor, each of the LEDs being operable to emit light with a primary color;
forming conductive interconnects penetrating through the silicon substrate from a second side of the silicon substrate to the first side;
forming one or more integrated circuits on the second side of the silicon substrate and conductively coupled to the array of active-matrix LED pixels through the conductive interconnects; and
forming an array of active-matrix multi-color display pixels by using the array of active-matrix LED pixels, each display pixel including at least two pixel elements operable to emit light with at least two different colors when excited by the light with the primary color emitted from at least two LEDs of a corresponding LED pixel.

* * * * *